(12) United States Patent
Zhang et al.

(10) Patent No.: US 12,376,461 B2
(45) Date of Patent: Jul. 29, 2025

(54) DISPLAY SUBSTRATE AND DISPLAY APPARATUS

(71) Applicant: BOE Technology Group Co., Ltd., Beijing (CN)

(72) Inventors: Hao Zhang, Beijing (CN); Pinfan Wang, Beijing (CN); Fang Liu, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 18/264,041

(22) PCT Filed: Nov. 17, 2022

(86) PCT No.: PCT/CN2022/132508
§ 371 (c)(1),
(2) Date: Aug. 2, 2023

(87) PCT Pub. No.: WO2024/103333
PCT Pub. Date: May 23, 2024

(65) Prior Publication Data
US 2025/0008784 A1  Jan. 2, 2025

(51) Int. Cl.
*G09G 3/3233* (2016.01)
*G09G 3/3266* (2016.01)
(Continued)

(52) U.S. Cl.
CPC ......... *H10K 59/126* (2023.02); *G09G 3/3233* (2013.01); *G09G 3/3266* (2013.01);
(Continued)

(58) Field of Classification Search
CPC ............... G09G 3/3233; G09G 3/3266; H10K 59/131
See application file for complete search history.

(56) References Cited

U.S. PATENT DOCUMENTS

2006/0002045 A1  1/2006  Kobashi
2008/0135846 A1  6/2008  Shin et al.
(Continued)

FOREIGN PATENT DOCUMENTS

CN  110459571 A  11/2019
CN  110782827 A  2/2020
(Continued)

OTHER PUBLICATIONS

International Search Report & Written Opinion mailed Jun. 23, 2023, regarding PCT/CN2022/132508.
(Continued)

*Primary Examiner* — Kevin M Nguyen
(74) *Attorney, Agent, or Firm* — Intellectual Valley Law P.C.

(57) ABSTRACT

A display substrate is provided. The display substrate includes a display substrate, comprising one or more scan circuits and one or more electrostatic discharge protection circuits in a peripheral area. An electrostatic discharge protection circuit is configured to provide a start signal to a scan unit of a scan circuit. The display substrate comprises a plurality of islands and a plurality of bridges connecting the plurality of islands in the peripheral area; a respective island of the plurality of islands comprises at least one scan unit of the scan circuit; and one or more signal lines connecting the electrostatic discharge protection circuit and the scan unit is at least partially in an individual bridge connecting the electrostatic discharge protection circuit and the scan unit.

19 Claims, 42 Drawing Sheets

(51) Int. Cl.
*H10K 59/126* (2023.01)
*H10K 59/131* (2023.01)

(52) U.S. Cl.
CPC .............. *H10K 59/131* (2023.02); *G09G 2300/0426* (2013.01); *G09G 2300/0819* (2013.01); *G09G 2300/0842* (2013.01); *G09G 2300/0861* (2013.01); *G09G 2310/0286* (2013.01); *G09G 2310/08* (2013.01); *G09G 2330/04* (2013.01)

(56) References Cited

U.S. PATENT DOCUMENTS

| | | | |
|---|---|---|---|
| 2016/0217756 A1 | 7/2016 | Kim et al. | |
| 2017/0187369 A1* | 6/2017 | Tao | H03K 17/691 |
| 2019/0067218 A1 | 2/2019 | Lin et al. | |
| 2020/0135833 A1 | 4/2020 | Ma et al. | |
| 2021/0057659 A1 | 2/2021 | Sun et al. | |
| 2023/0411406 A1* | 12/2023 | Kim | G09G 3/32 |

FOREIGN PATENT DOCUMENTS

| | | | |
|---|---|---|---|
| CN | 107219660 B | 9/2020 | |
| CN | 112258994 A | 1/2021 | |
| CN | 112582382 A | 3/2021 | |
| CN | 112669739 A | 4/2021 | |
| KR | 1020220073066 * | 1/2022 | H01L 27/1244 |

OTHER PUBLICATIONS

Extended European Search Report in the European Patent Application No. 22965516.2, dated Mar. 14, 2025.

* cited by examiner

DISPLAY SUBSTRATE AND DISPLAY APPARATUS

CROSS-REFERENCE TO RELATED APPLICATION

This application is a national stage application under 35 U.S.C. § 371 of International Application No. PCT/CN2022/132508, filed Nov. 17, 2022, the contents of which are incorporated by reference in the entirety.

TECHNICAL FIELD

The present invention relates to display technology, more particularly, to a display substrate and a display apparatus.

BACKGROUND

Organic Light Emitting Diode (OLED) display is one of the hotspots in the field of flat panel display research today. Unlike Thin Film Transistor-Liquid Crystal Display (TFT-LCD), which uses a stable voltage to control brightness, OLED is driven by a driving current required to be kept constant to control illumination. The OLED display panel includes a plurality of pixel units configured with pixel-driving circuits arranged in multiple rows and columns. Each pixel-driving circuit includes a driving transistor having a gate terminal connected to one gate line per row and a drain terminal connected to one data line per column. When the row in which the pixel unit is gated is turned on, the switching transistor connected to the driving transistor is turned on, and the data voltage is applied from the data line to the driving transistor via the switching transistor, so that the driving transistor outputs a current corresponding to the data voltage to an OLED device. The OLED device is driven to emit light of a corresponding brightness.

SUMMARY

In one aspect, the present disclosure provides a display substrate, comprising one or more scan circuits and one or more electrostatic discharge protection circuits in a peripheral area; wherein an electrostatic discharge protection circuit is configured to provide a start signal to a scan unit of a scan circuit; wherein the display substrate comprises a plurality of islands and a plurality of bridges connecting the plurality of islands in the peripheral area; a respective island of the plurality of islands comprises at least one scan unit of the scan circuit; and one or more signal lines connecting the electrostatic discharge protection circuit and the scan unit is at least partially in an individual bridge connecting the electrostatic discharge protection circuit and the scan unit.

Optionally, the electrostatic discharge protection circuit comprises: a first reference voltage terminal configured to receive a first reference voltage from the scan circuit; a second reference voltage terminal configured to receive a second reference voltage from the scan circuit; a node configured to output the start signal; and a connecting line connecting the node to an input terminal of the scan unit.

Optionally, the connecting line at least partially extends through the individual bridge.

Optionally, the first reference voltage terminal, the second reference voltage terminal, and the connecting line are in a first signal line layer; and the node is in a semiconductor material layer different from the first signal line layer.

Optionally, the display substrate further comprises: a start signal lead line electrically connects a start signal terminal to a start signal line in the scan circuit; a first lead line electrically connecting the first reference voltage terminal to a first reference signal line in the scan circuit; and a second lead line electrically connecting the second reference voltage terminal to a second reference signal line in the scan circuit.

Optionally, the start signal lead line, the first lead line, and the second lead line are at least partially in a second signal line layer.

Optionally, the start signal lead line, the first lead line, and the second lead line at least partially extend through the individual bridge.

Optionally, the electrostatic discharge protection circuit comprises: a first transistor; a second transistor; a third transistor; a fourth transistor; a start signal terminal; a first reference voltage terminal configured to receive a first reference voltage from the scan circuit; a second reference voltage terminal configured to receive a second reference voltage from the scan circuit; and a node electrically connected between the second transistor and the third transistor and electrically connected to the start signal terminal.

Optionally, a first electrode and a gate electrode of the first transistor are electrically connected to the first reference voltage terminal; a second electrode of the first transistor is electrically connected to a first electrode and a gate electrode of the third transistor; a second electrode of the third transistor is electrically connected to the node; a first electrode of the second transistor is electrically connected to the node; a gate electrode of the second transistor is electrically connected to the start signal terminal; a second electrode of the second transistor is electrically connected to a first electrode and a gate electrode of the fourth transistor; and a second electrode of the fourth transistor is electrically connected to the second reference voltage terminal.

Optionally, when a voltage of the start signal terminal is greater than the first reference voltage at the first reference voltage terminal, the start signal terminal discharges to the first reference voltage terminal; when the voltage of the start signal terminal is less than the second reference voltage at the second reference voltage terminal, the start signal terminal discharges to the second reference voltage terminal; when the voltage at the start signal terminal is greater than the second reference voltage at the second reference voltage terminal, and is less than the first reference voltage at the first reference voltage terminal, the first transistor and the third transistor are turned off, and the second transistor and the fourth transistor are turned off.

Optionally, the peripheral area includes a first region and a second region adjacent to the first region; the plurality of islands and the plurality of bridges are in the first region; the second region is absent of the plurality of islands and the plurality of bridges; the scan circuit is in the first region; the electrostatic discharge protection circuit is in the second region; and the one or more signal lines extend from the second region into the first region.

Optionally, the peripheral area includes a first sub-area on a first side of a display area, a second sub-area on a second side of the display area, a third sub-area on a third side of the display area, and a fourth sub-area on a fourth side of the display area; the electrostatic discharge protection circuit is in the third sub-area and/or the fourth sub-area; the display substrate is stretchable in the second sub-area and the fourth sub-area; and the display substrate is less stretchable in the first sub-area and the third sub-area than in the second sub-area and the fourth sub-area.

Optionally, the electrostatic discharge protection circuit is in a respective first island of the plurality of islands; the scan unit is in a respective second island of the plurality of islands; and the respective first island and the respective second island are adjacent to each other.

Optionally, the peripheral area includes a first sub-area on a first side of a display area, a second sub-area on a second side of the display area, a third sub-area on a third side of the display area, and a fourth sub-area on a fourth side of the display area; the electrostatic discharge protection circuit is in the third sub-area and/or the fourth sub-area; the display substrate is at least partially stretchable in the first sub-area, the second sub-area, the third sub-area, and the fourth sub-area.

Optionally, the one or more scan circuits comprise a first scan circuit and a second scan circuit; and the one or more electrostatic discharge protection circuits comprise a first electrostatic discharge protection circuit and a second electrostatic discharge protection circuit.

Optionally, in the peripheral area, comprises a respective first island, a respective second island, a respective third island, and a respective fourth island arranged in rows and columns; the respective first island and the respective second island are arranged in a first column; the respective third island and the respective fourth island are arranged in a second column; the respective first island and the respective third island are arranged in a first row; and the respective second island and the respective fourth island are arranged in a second row.

Optionally, the first electrostatic discharge protection circuit and the second electrostatic discharge protection circuit are at least partially in the respective first island; a $1^{st}$ scan unit of the first scan circuit is at least partially in the respective second island; a $1^{st}$ scan unit of the second scan circuit is at least partially in the respective third island; and a $2^{nd}$ scan unit of the second scan circuit is at least partially in the respective fourth island.

Optionally, the second scan circuit is a control signal generating circuit configured to generate gate scanning signals and reset control signals for subpixels in a display substrate; and the $1^{st}$ scan unit of the second scan circuit is configured to provide a reset control signal to a first row of subpixels in a display area.

Optionally, the first reference voltage is a high power supply voltage; and the second reference voltage is a low power supply voltage.

In another aspect, the present disclosure provides a display apparatus, comprising the display substrate described herein or fabricated by a method described herein, and one or more integrated circuits connected to the display substrate.

BRIEF DESCRIPTION OF THE FIGURES

The following drawings are merely examples for illustrative purposes according to various disclosed embodiments and are not intended to limit the scope of the present invention.

DETAILED DESCRIPTION

The disclosure will now be described more specifically with reference to the following embodiments. It is to be noted that the following descriptions of some embodiments are presented herein for purpose of illustration and description only. It is not intended to be exhaustive or to be limited to the precise form disclosed.

The present disclosure provides, inter alia, a display substrate and a display apparatus that substantially obviate one or more of the problems due to limitations and disadvantages of the related art. In one aspect, the present disclosure provides a display substrate. In some embodiments, the display substrate includes one or more scan circuits and one or more electrostatic discharge protection circuits in a peripheral area. Optionally, an electrostatic discharge protection circuit is configured to provide a start signal to a scan unit of a scan circuit. Optionally, the display substrate comprises a plurality of islands and a plurality of bridges connecting the plurality of islands in the peripheral area. Optionally, a respective island of the plurality of islands comprises at least one scan unit of the scan circuit. Optionally, one or more signal lines connecting the electrostatic discharge protection circuit and the scan unit is at least partially in an individual bridge connecting the electrostatic discharge protection circuit and the scan unit.

Figure 1:
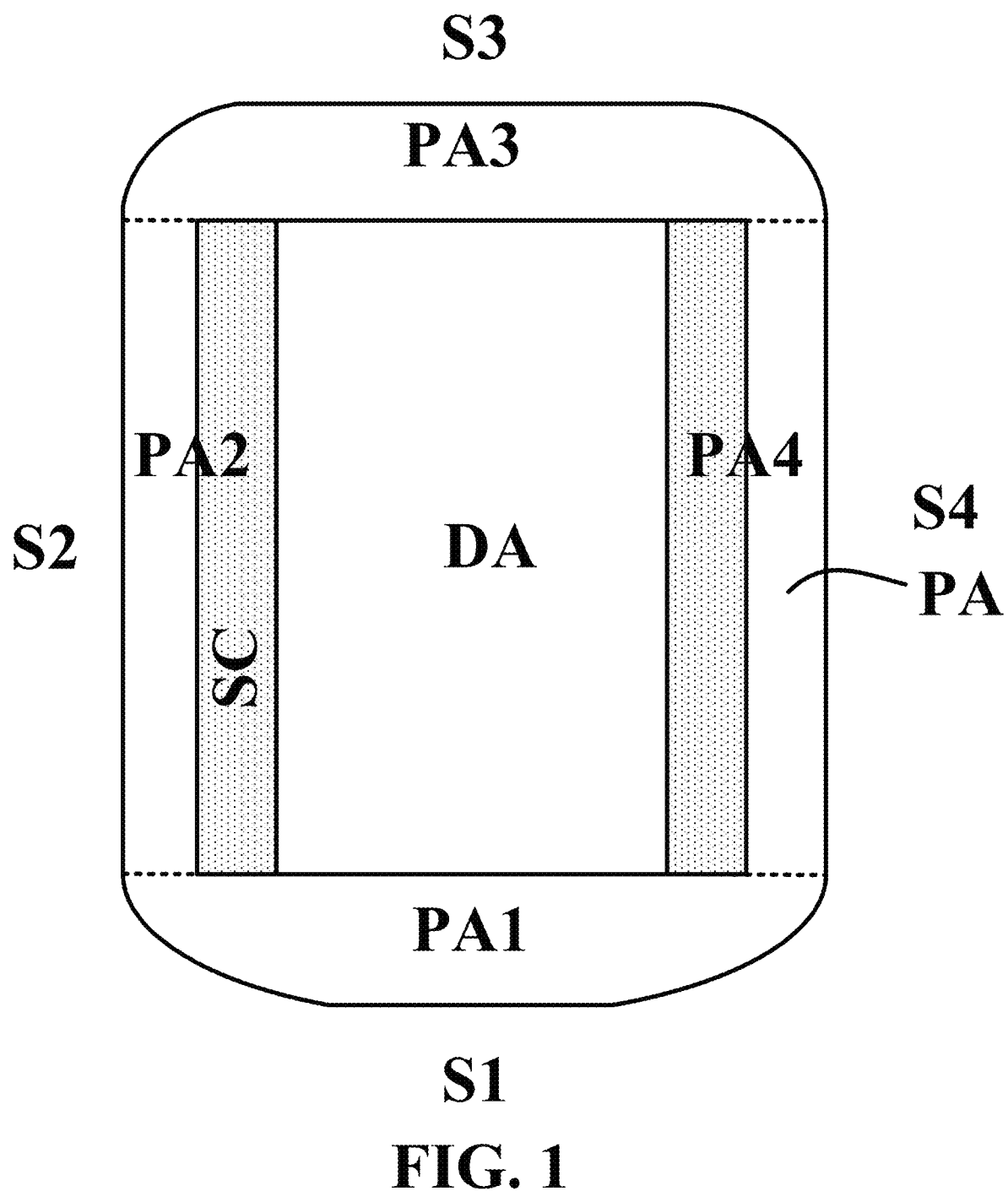
FIG. 1 is a schematic diagram illustrating a display area and a peripheral area in a display substrate in some embodiments according to the present disclosure.

FIG. 1 is a schematic diagram illustrating a display area and a peripheral area in an display substrate in some embodiments according to the present disclosure. Referring to FIG. 1, in some embodiments, the display substrate includes a display area DA and a peripheral area PA. In some embodiments, the peripheral area PA includes a first sub-area PA1 on a first side S1 of the display area DA, a second sub-area PA2 on a second side S2 of the display area DA, a third sub-area PA3 on a third side S3 of the display area DA, a fourth sub-area PA4 on a fourth side S4 of the display area DA. Optionally, the first side S1 and the third side S3 are opposite to each other. Optionally, the second side S2 and the fourth side S4 are opposite to each other. Optionally, the first sub-area PA1 is a sub-area where signal lines of the display substrate are connected to an integrated circuit.

In some embodiments, the display substrate further includes one or more scan circuits SC in the peripheral area PA. In one example depicted in FIG. 1, the display substrate includes one or more scan circuits SC in the second sub-area PA2 and/or in the fourth sub-area PA4.

The present disclosure may be implemented with various appropriate scan circuits. In one example, the one or more scan circuits SC includes a light emitting control signal generating circuit configured to generate light emitting control signals for subpixels in a display substrate. In another example, the one or more scan circuits SC includes a gate scanning signal generating circuit configured to generate gate scanning signals for subpixels in a display substrate. In another example, the one or more scan circuits SC includes a reset control signal generating circuit configured to generate reset control signals for subpixels in a display substrate.

In some embodiments, each of the one or more scan circuits SC includes a plurality of stages of cascaded scan units. Optionally, the plurality of stages of cascaded scan units are configured to provide a plurality of control signals (e.g., gate scanning signals, reset control signals, or light emission control signals) to a plurality of rows of subpixels.

Figure 2A:
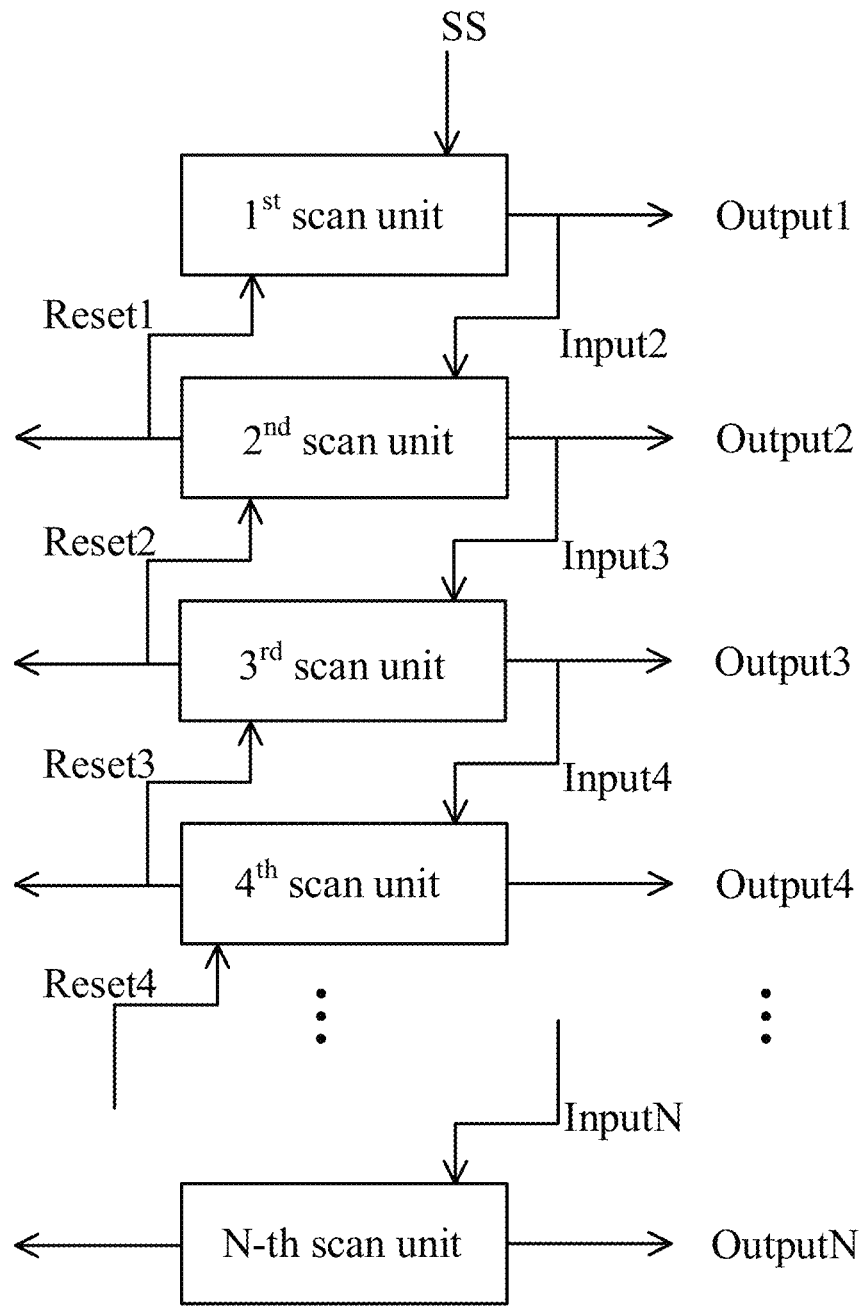
FIG. 2A is a schematic diagram illustrating the structure of a scan circuit in some embodiments according to the present disclosure.

FIG. 2A is a schematic diagram illustrating the structure of a scan circuit in some embodiments according to the present disclosure. Referring to FIG. 2A, the scan circuit in some embodiments includes N number of stages. A respective stage of the N number of stages includes a respective scan unit. As depicted in FIG. 2A, the scan circuit includes a $1^{st}$ scan unit, a $2^{nd}$ scan unit, a $3^{rd}$ scan unit, a $4^{th}$ scan unit, ..., an N-th scan unit. The N number of scan units are configured to provide N number of control signals (e.g., gate scanning signals, reset control signals, or light emission control signals) to N number of rows of subpixels. The N number of control signals are denoted as Output1, Output2, Output3, Output4, ..., OutputN in FIG. 2A. An n-th scan unit is configured to receive a start signal SS or an output signal from an output terminal of a previous scan unit (e.g., a (n−1)-th scan unit, a (n−2)-th scan unit, or a (n−3)-th scan unit). As used herein, the term "previous scan unit" is not limited to immediately previous scan unit (e.g., the (n−1)-th scan unit), but includes any appropriate previous scan unit (e.g., the (n−2)-th scan unit, or the (n−3)-th scan unit). In FIG. 2A, the $1^{st}$ scan unit is configured to receive the start signal SS as the input signal, the $2^{nd}$ scan unit is configured to receive an output signal from the $1^{st}$ scan unit as an input signal Input2, the $3^{rd}$ scan unit is configured to receive an output signal from the $2^{nd}$ scan unit as an input signal Input3, the 4th scan unit is configured to receive an output signal from the $3^{rd}$ scan unit as an input signal Input4, the N-th scan unit is configured to receive an output signal from the (N−1)-th scan unit as an input signal InputN.

Referring to FIG. 2A, an n-th scan unit is configured to receive an output signal from a subsequent scan unit (e.g., a (n+1)-th scan unit, a (n+2)-th scan unit, or a (n+3)-th scan unit) as a reset signal. As used herein, the term "subsequent scan unit" is not limited to immediately subsequent scan unit (e.g., the (n+1)-th scan unit), but includes any appropriate subsequent scan unit (e.g., the (n+2)-th scan unit, or the (n+3)-th scan unit). In FIG. 2A, the $1^{st}$ scan unit is configured to receive an output signal from the $2^{nd}$ scan unit as a reset signal Reset1, the $2^{nd}$ scan unit is configured to receive an output signal from the $3^{rd}$ scan unit as a reset signal Reset2, the $3^{rd}$ scan unit is configured to receive an output signal from the $4^{th}$ scan unit as a reset signal Reset3, and the $4^{th}$ scan unit is configured to receive an output signal from the $5^{th}$ scan unit as a reset signal Reset4.

Figure 2B:
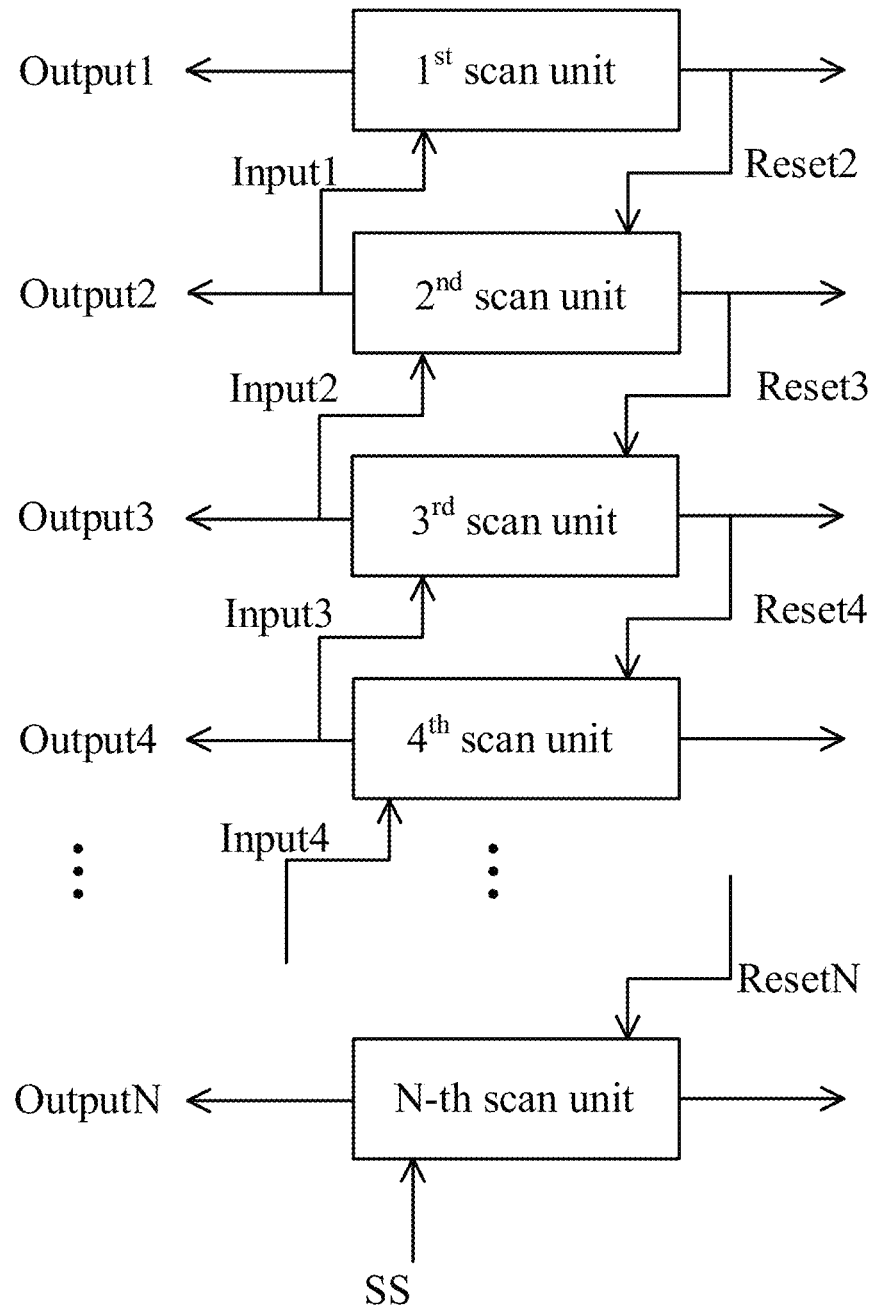
FIG. 2B is a schematic diagram illustrating the structure of a scan circuit in some embodiments according to the present disclosure.

In some embodiments, the scan circuit may be operated in a forward scanning mode and a reverse scanning mode. FIG. 2A illustrates the forward scanning mode of the scan circuit. FIG. 2B is a schematic diagram illustrating the structure of a scan circuit in some embodiments according to the present disclosure. FIG. 2B illustrates the reverse scanning mode of the scan circuit. Referring to FIG. 2B, an n-th scan unit is configured to receive a start signal SS or an output signal from an output terminal of a subsequent scan unit (e.g., a (n+1)-th scan unit, a (n+2)-th scan unit, or a (n+3)-th scan unit). In FIG. 2B, the N-th scan unit is configured to receive the start signal SS as the input signal, the $4^{th}$ scan unit is configured to receive an output signal from a $5^{th}$ scan unit as an input signal Input4, the $3^{rd}$ scan unit is configured to receive an output signal from the $4^{th}$ scan unit as an input signal Input3, the $2^{nd}$ scan unit is configured to receive an output signal from the $3^{rd}$ scan unit as an input signal Input2; and the $1^{st}$ scan unit is configured to receive an output signal from the $2^{nd}$ scan unit as an input signal Input1.

Referring to FIG. 2B, in the reverse scanning mode, an n-th scan unit is configured to receive an output signal from a previous scan unit (e.g., a (n−1)-th scan unit, a (n−2)-th scan unit, or a (n−3)-th scan unit) as a reset signal. In FIG. 2A, the $2^{nd}$ scan unit is configured to receive an output signal from the $1^{st}$ scan unit as a reset signal Reset2, the $3^{rd}$ scan unit is configured to receive an output signal from the $2^{nd}$ scan unit as a reset signal Reset3, the $4^{th}$ scan unit is configured to receive an output signal from the $3^{rd}$ scan unit as a reset signal Reset4, and the $5^{th}$ scan unit is configured to receive an output signal from the $4^{th}$ scan unit as a reset signal Reset5.

Figure 3:
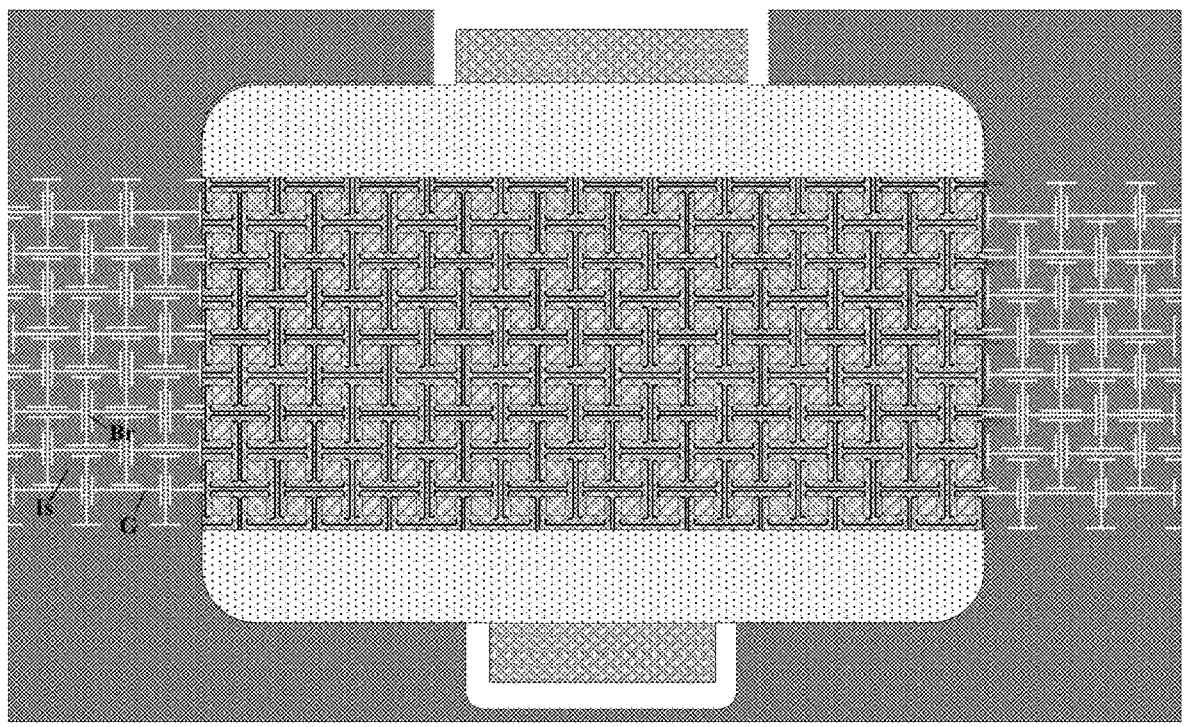
FIG. 3 is a schematic diagram illustrating the structure of a display substrate in some embodiments according to the present disclosure.

FIG. 3 is a schematic diagram illustrating the structure of a display substrate in some embodiments according to the present disclosure. Referring to FIG. 3, the display substrate in some embodiments is a stretchable display substrate. As used herein, the term "stretchable" refers to the ability of a material, structure, device or device component to be strained in tension (e.g., being made longer and/or wider) without undergoing permanent deformation or failure such as fracture, e.g., the ability to elongate at least 10% of its length without permanently deforming, tearing, or breaking. The term is also meant to encompass substrates having components (whether or not the components themselves are individually stretchable as stated above) that are configured in such a way so as to accommodate a stretchable, inflatable, or expandable surface and remain functional when applied to a stretchable, inflatable, or otherwise expandable surface that is stretched, inflated, or otherwise expanded respectively. The term is also meant to encompass substrates that may be elastically and/or plastically deformable (i.e. after being stretched, the substrate may return to its original size when the stretching force is released or the substrate may not return to its original size and in some examples, may remain in the stretched form) and the deformation (i.e. stretching and optionally flexing) may occur during manufacture of the substrate (e.g. with the substrate being stretched and optionally flexed to form its final shape), during assembly of a device incorporating the substrate (which may be considered part of the manufacturing operation) and/or during use (e.g. with the user being able to stretch and optionally flex the substrate).

In some embodiments, in the peripheral area, the display substrate includes a plurality of islands Is and a plurality of bridges Br connecting the plurality of islands Is (discussed further in details below). A respective island of the plurality of islands Is includes at least one scan unit. The display substrate further includes a plurality of gaps G at least partially extending into (e.g., extending through) the display substrate. A respective gap of the plurality of gaps G is between adjacent islands of the plurality of islands Is.

In some embodiments, in the display area, the display substrate also includes a plurality of second islands and a plurality of second bridges connecting the plurality of second islands. A respective second island of the plurality of second islands includes at least one display element (e.g., at least one light emitting diode). The display substrate further includes a plurality of second gaps at least partially extending into (e.g., extending through) the display substrate. A respective second gap of the plurality of second gaps is between adjacent second islands of the plurality of second islands.

Referring to FIG. 1 and FIG. 3, in some embodiments, the plurality of gaps G are present in the second sub-area PA2 and the fourth sub-area PA4, and are absent in the first sub-area PA1 and the third sub-area PA3. The display substrate is stretchable in the second sub-area PA2 and the fourth sub-area PA4, and is less stretchable (e.g., non-stretchable) in the first sub-area PA1 and the third sub-area PA3.

Figure 4:
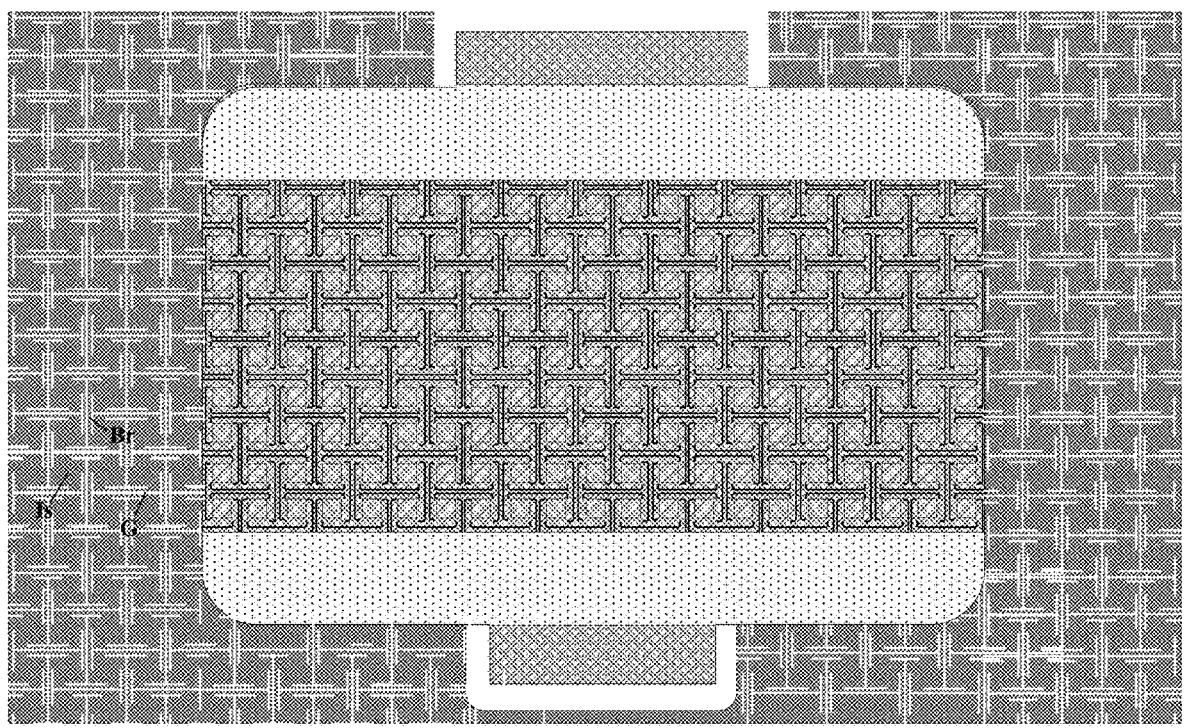
FIG. 4 is a schematic diagram illustrating the structure of a display substrate in some embodiments according to the present disclosure.

FIG. 4 is a schematic diagram illustrating the structure of a display substrate in some embodiments according to the present disclosure. Referring to FIG. 1 and FIG. 4, in some embodiments, the plurality of gaps G are present in the first sub-area PA1, the second sub-area PA2, the third sub-area PA3, and the fourth sub-area PA4. The display substrate is at least partially stretchable in all four sub-areas, including the first sub-area PA1, the second sub-area PA2, the third sub-area PA3, and the fourth sub-area PA4.

Figure 5:
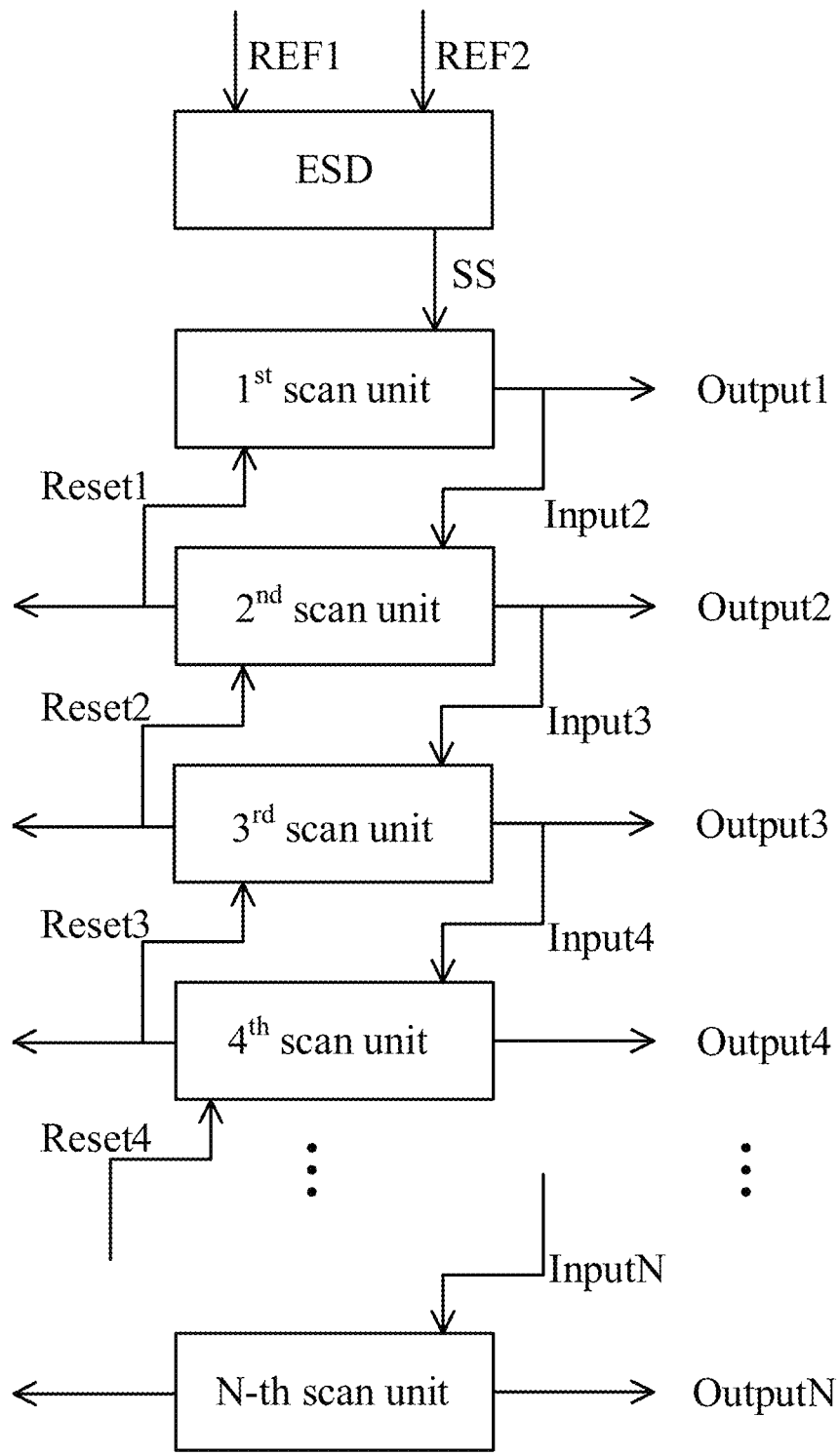
FIG. 5 is a schematic diagram illustrating the structure of a scan circuit in some embodiments according to the present disclosure.

FIG. 5 is a schematic diagram illustrating the structure of a scan circuit in some embodiments according to the present disclosure. Referring to FIG. 5, the scan circuit in some embodiments further includes an electrostatic discharge protection circuit ESD configured to provide a start signal SS to a scan unit (e.g., the first scan unit) of the scan circuit. In some embodiments, the electrostatic discharge protection circuit ESD is configured to receive a first reference voltage signal REF1 and a second reference voltage signal REF2, the first reference voltage signal REF1 has a higher voltage level than the second reference voltage signal REF2. In one example, the first reference voltage signal REF1 is a first power supply voltage signal (e.g., a Vdd signal) for driving light emission in the display substrate, and the second reference voltage signal REF2 is a second power supply voltage signal (e.g., a Vss signal) provided to a cathode of a light emitting element in the display substrate. Various other appropriate voltage signals may be used as the first reference voltage signal REF1 and the second reference voltage signal REF2.

Figure 6A:
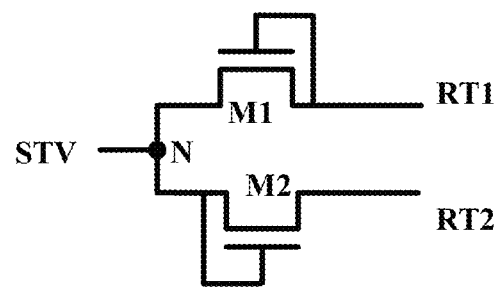
FIG. 6A is a circuit diagram illustrating the structure of an electrostatic discharge protection circuit in some embodiments according to the present disclosure.

Various appropriate electrostatic discharge protection circuits may be implemented in the present disclosure. FIG. 6A is a circuit diagram illustrating the structure of an electrostatic discharge protection circuit in some embodiments according to the present disclosure. Referring to FIG. 6A, the electrostatic discharge protection circuit in some embodiments includes a first transistor M1, a second transistor M2, and a node N electrically connected between the first transistor M1 and the second transistor M2 and electrically connected to a start signal terminal STV. A first electrode and a gate electrode of the first transistor M1 are electrically connected to the first reference voltage terminal RT1 configured to provide the first reference voltage signal. A second electrode of the first transistor M1 is electrically connected to the node N. A first electrode of the second transistor M2 is electrically connected to the node N. A second electrode of the second transistor M2 is electrically connected to the second reference voltage terminal RT2 configured to provide the second reference voltage signal. A gate electrode of the second transistor M2 is electrically connected to the start signal terminal STV. Optionally, the first reference voltage terminal RT1 is a high-level terminal, and the second reference voltage terminal RT2 is a low-level terminal.

When the voltage of the start signal terminal STV is greater than a first reference voltage at the first reference voltage terminal RT1, the first transistor M1 is turned on, the second transistor M2 is turned off, and the start signal terminal STV discharges to the first reference voltage terminal RT1.

When the voltage of the start signal terminal STV is less than a second reference voltage at the second reference voltage terminal RT2, the first transistor M1 is turned off, the second transistor M2 is turned on, and the start signal terminal STV discharges to the second reference voltage terminal RT2.

When the voltage at the start signal terminal STV is greater than the second reference voltage at the second reference voltage terminal RT2, and is less than the first reference voltage at the first reference voltage terminal RT1, the first transistor M1 is turned off, and the second transistor M2 is turned off.

Figure 6B:
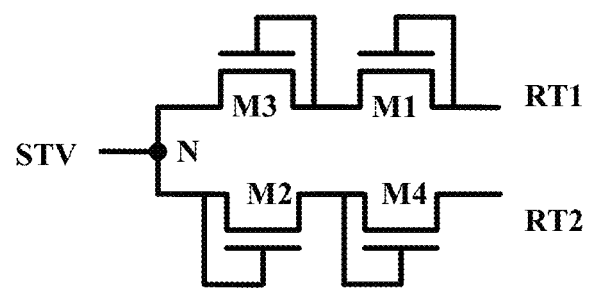
FIG. 6B is a circuit diagram illustrating the structure of an electrostatic discharge protection circuit in some embodiments according to the present disclosure.

FIG. 6B is a circuit diagram illustrating the structure of an electrostatic discharge protection circuit in some embodiments according to the present disclosure. Referring to FIG. 6B, the electrostatic discharge protection circuit in some embodiments includes a first transistor M1, a second transistor M2, a third transistor M3, a fourth transistor M4, and a node N electrically connected between the second transistor M2 and the third transistor M3 and electrically connected to a start signal terminal STV. A first electrode and a gate electrode of the first transistor M1 are electrically connected to the first reference voltage terminal RT1 configured to provide the first reference voltage signal. A second electrode of the first transistor M1 is electrically connected to a first electrode and a gate electrode of the third transistor M3. A second electrode of the third transistor M3 is electrically connected to the node N. A first electrode of the second transistor M2 is electrically connected to the node N. A gate electrode of the second transistor M2 is electrically connected to the start signal terminal STV. A second electrode of the second transistor M2 is electrically connected to a first electrode and a gate electrode of the fourth transistor M4. A second electrode of the fourth transistor M4 is electrically connected to the second reference voltage terminal RT2 configured to provide the second reference voltage signal. Optionally, the first reference voltage terminal RT1 is a high-level terminal, and the second reference voltage terminal RT2 is a low-level terminal.

When the voltage of the start signal terminal STV is greater than a first reference voltage at the first reference voltage terminal RT1, the first transistor M1 and the third transistor M3 are turned on, the second transistor M2 and the fourth transistor M4 are turned off, and the start signal terminal STV discharges to the first reference voltage terminal RT1.

When the voltage of the start signal terminal STV is less than a second reference voltage at the second reference voltage terminal RT2, the first transistor M1 and the third transistor M3 are turned off, the second transistor M2 and the fourth transistor M4 are turned on, and the start signal terminal STV discharges to the second reference voltage terminal RT2.

When the voltage at the start signal terminal STV is greater than the second reference voltage at the second reference voltage terminal RT2, and is less than the first reference voltage at the first reference voltage terminal RT1, the first transistor M1 and the third transistor M3 are turned off, and the second transistor M2 and the fourth transistor M4 are turned off.

The node N is electrically connected to an input terminal of a $1^{st}$ scan unit of a scan circuit.

Figure 7:
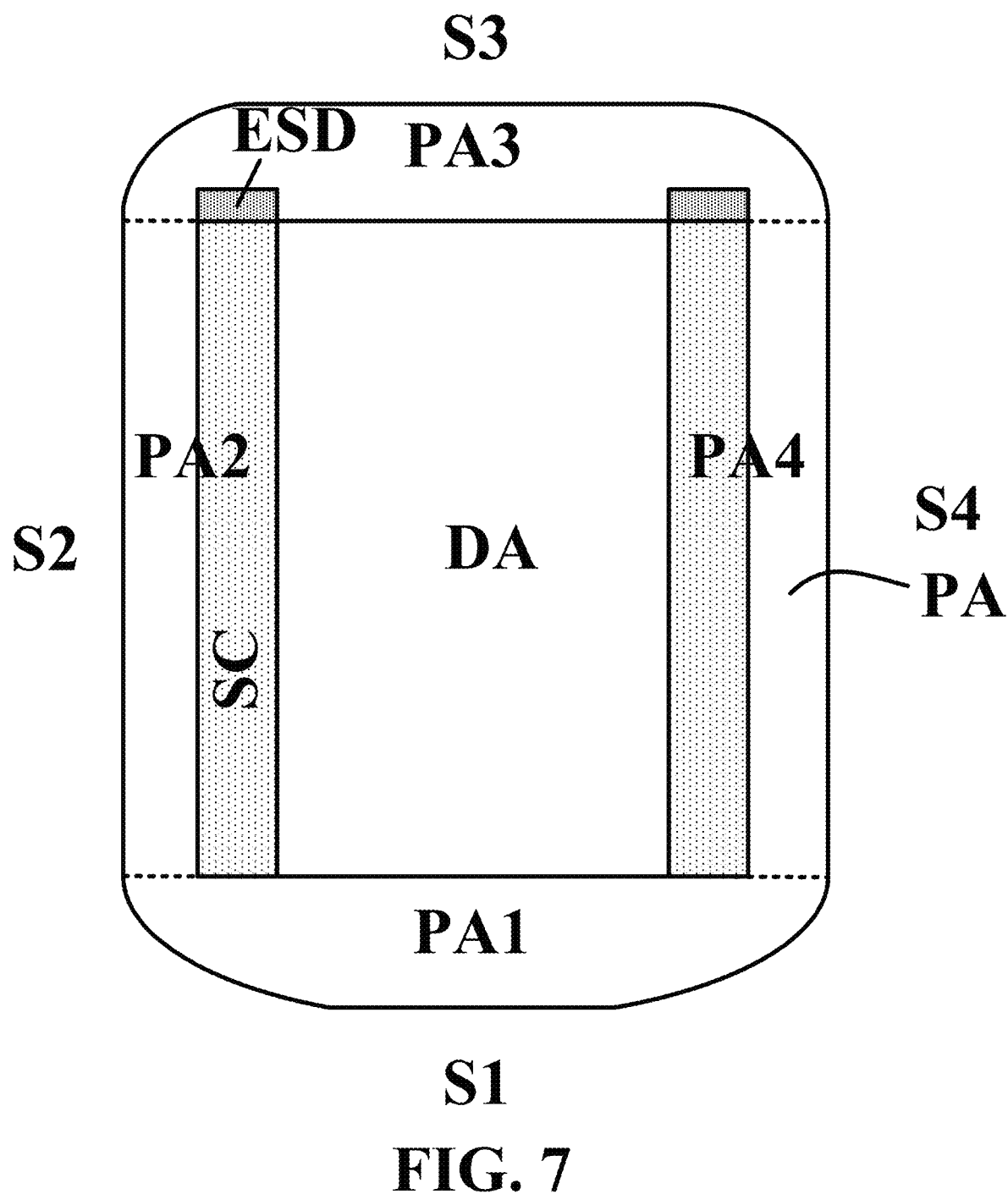
FIG. 7 is a schematic diagram illustrating the structure of a display substrate in some embodiments according to the present disclosure.

Various appropriate layouts of the electrostatic discharge protection circuit may be implemented according to the present disclosure. FIG. 7 is a schematic diagram illustrating the structure of a display substrate in some embodiments according to the present disclosure. Referring to FIG. 7, the electrostatic discharge protection circuit ESD is in the third sub-area PA3 while the one or more scan circuits SC are in the second sub-area PA2 and/or the fourth sub-area PA4. Referring to FIG. 3 and FIG. 7, the peripheral area PA includes a first region having a plurality of islands Is, a plurality of bridges Br connecting the plurality of islands Is, and a plurality of gaps G at least partially extending into the display substrate, a respective gap of the plurality of gaps G is between adjacent islands of the plurality of islands Is. The peripheral area PA in some embodiments further includes a second region in which the plurality of islands Is, the plurality of bridges Br, and the plurality of gaps G are absent. The display substrate in the first region is more stretchable than the display substrate in the second region. In one example, the first region includes the second sub-area PA2 and the fourth sub-area PA4, and the second region includes the first sub-area PA1 and the third sub-area PA3.

Figure 8A:
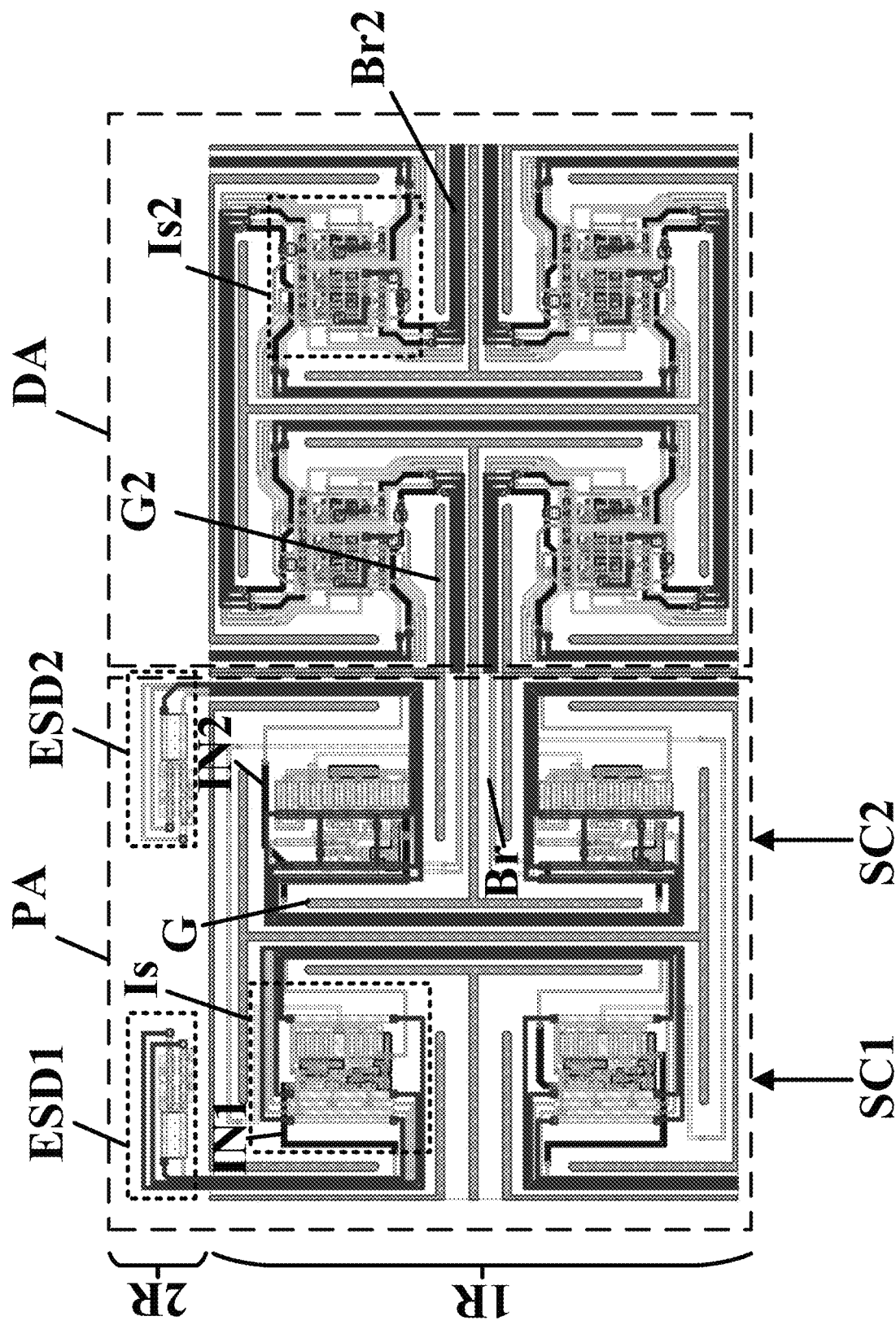
FIG. 8A is a schematic diagram illustrating a portion of a display substrate having an electrostatic discharge protection circuit in some embodiments according to the present disclosure.
Figure 8B:
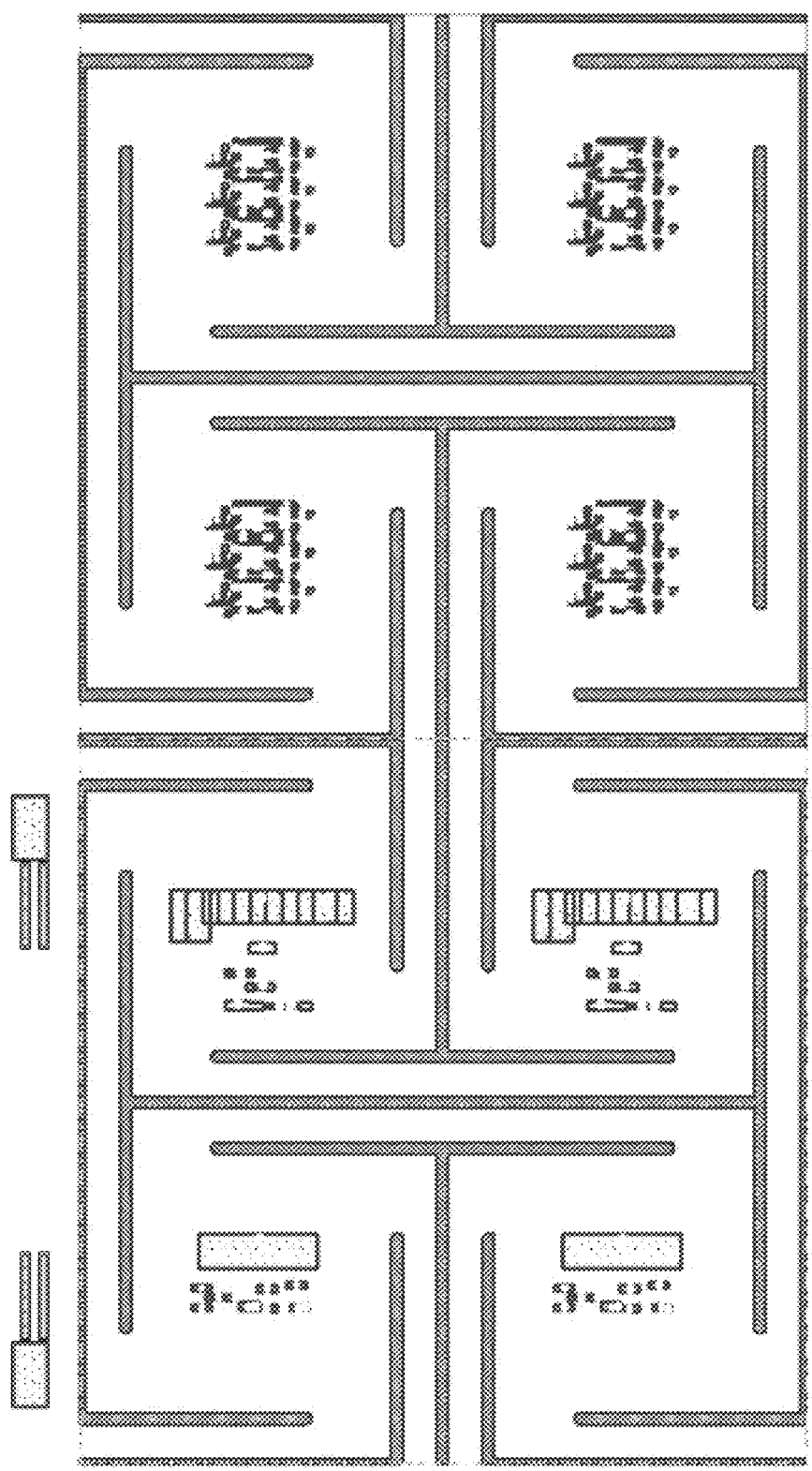
FIG. 8B illustrate the structure of a semiconductor material layer in the portion of the display substrate depicted in FIG. 8A.
Figure 8C:
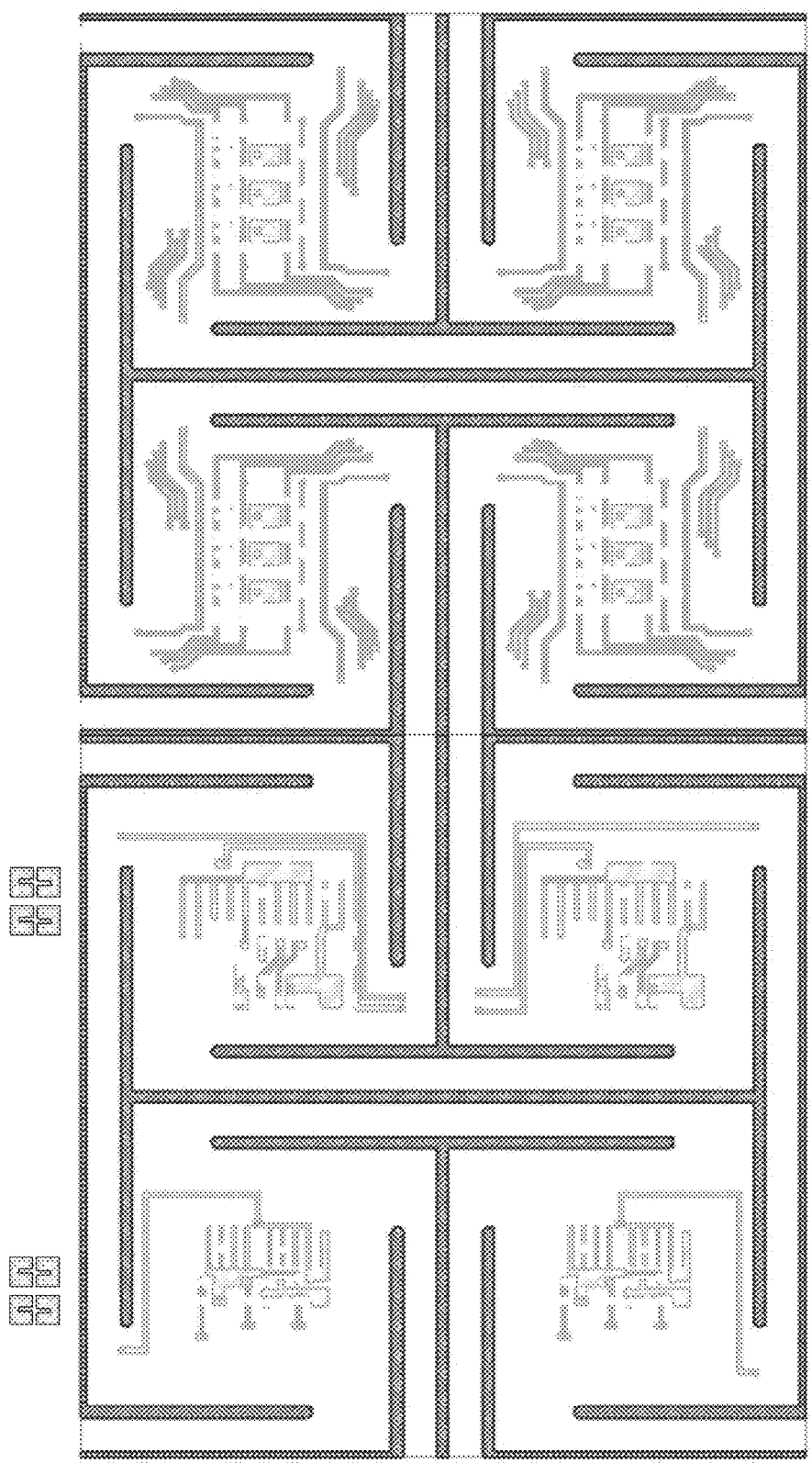
FIG. 8C illustrate the structure of a first conductive layer in the portion of the display substrate depicted in FIG. 8A.
Figure 8D:
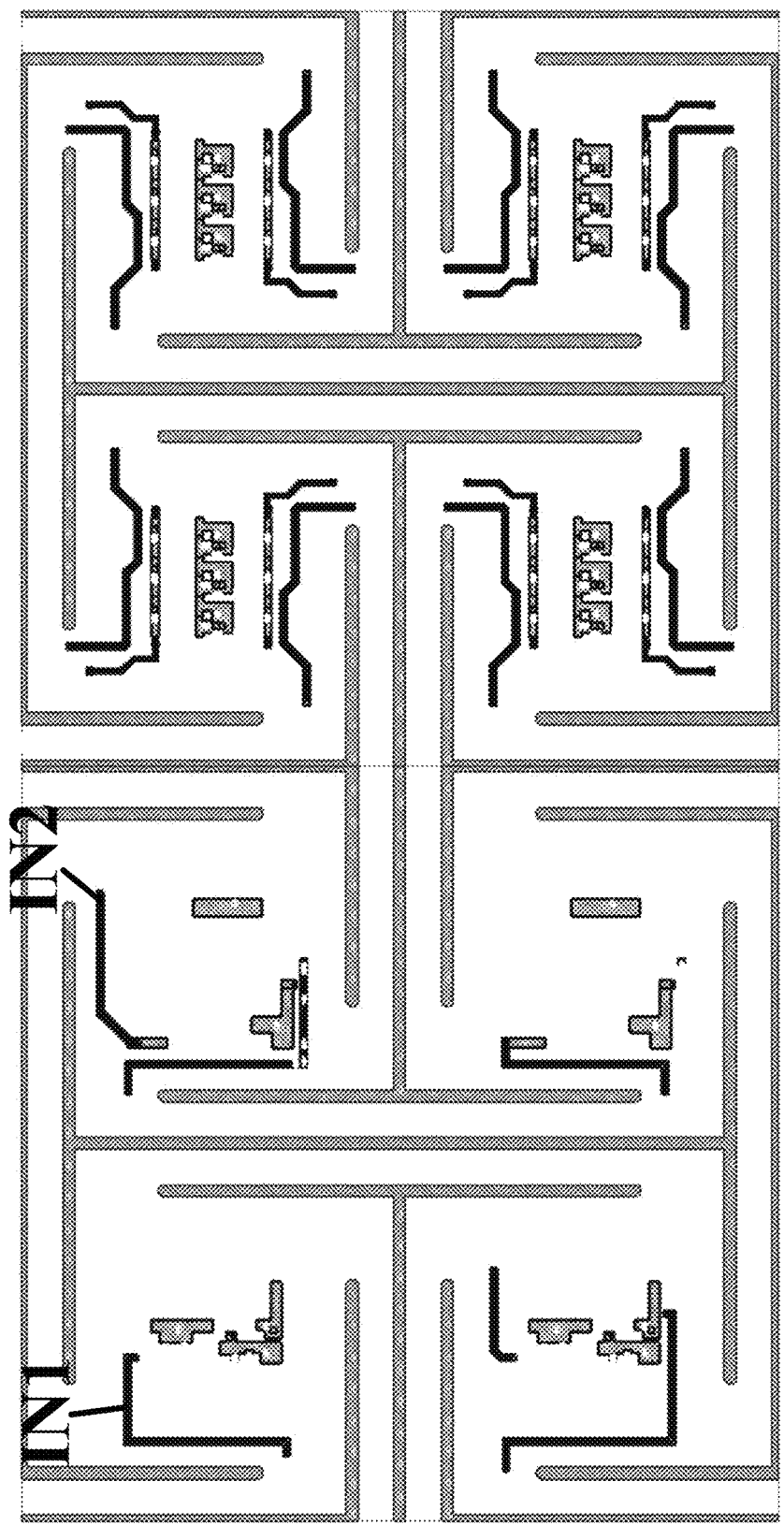
FIG. 8D illustrate the structure of a second conductive layer in the portion of the display substrate depicted in FIG. 8A.
Figure 8E:
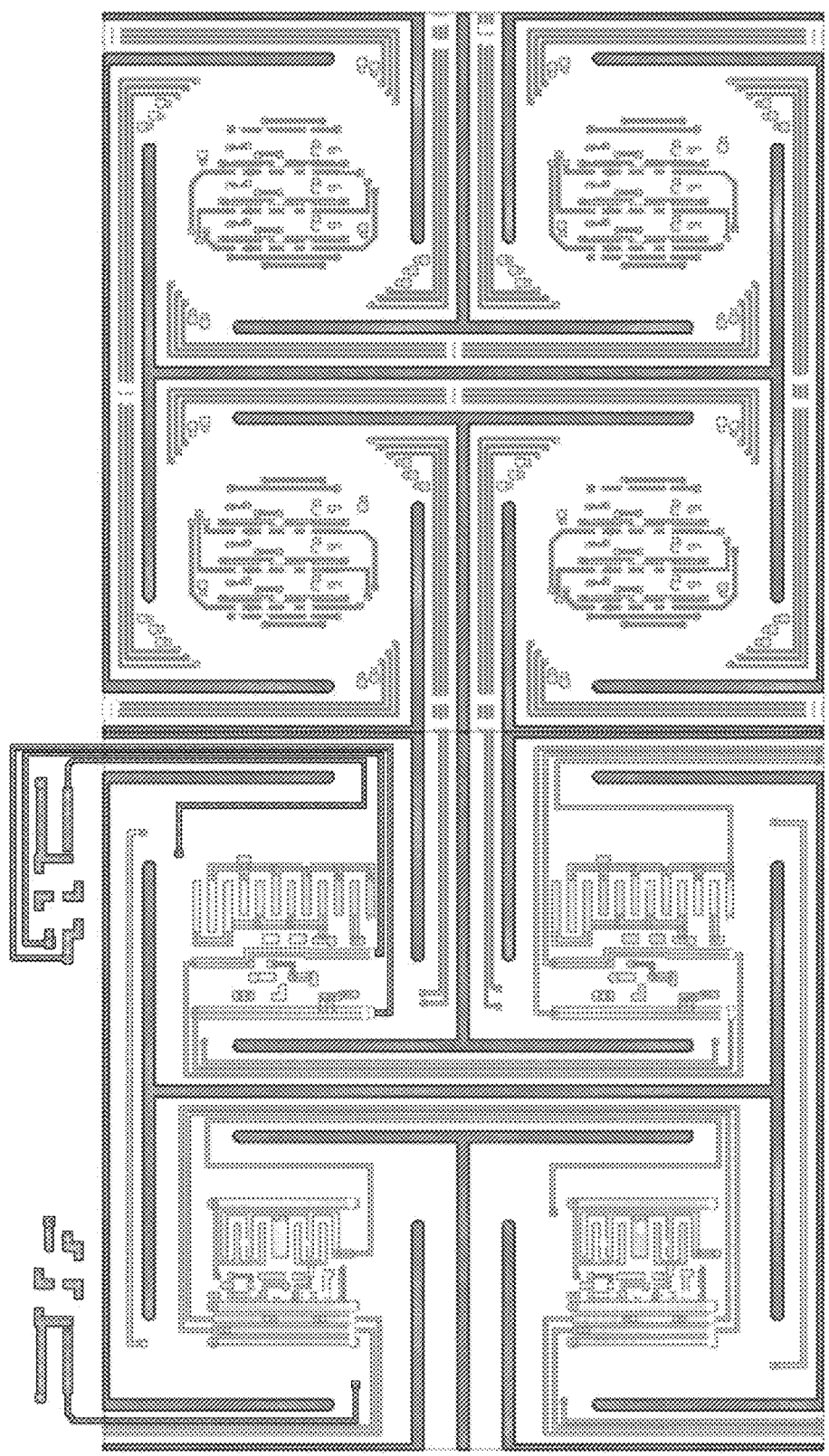
FIG. 8E illustrate the structure of a first signal line layer in the portion of the display substrate depicted in FIG. 8A.
Figure 8F:
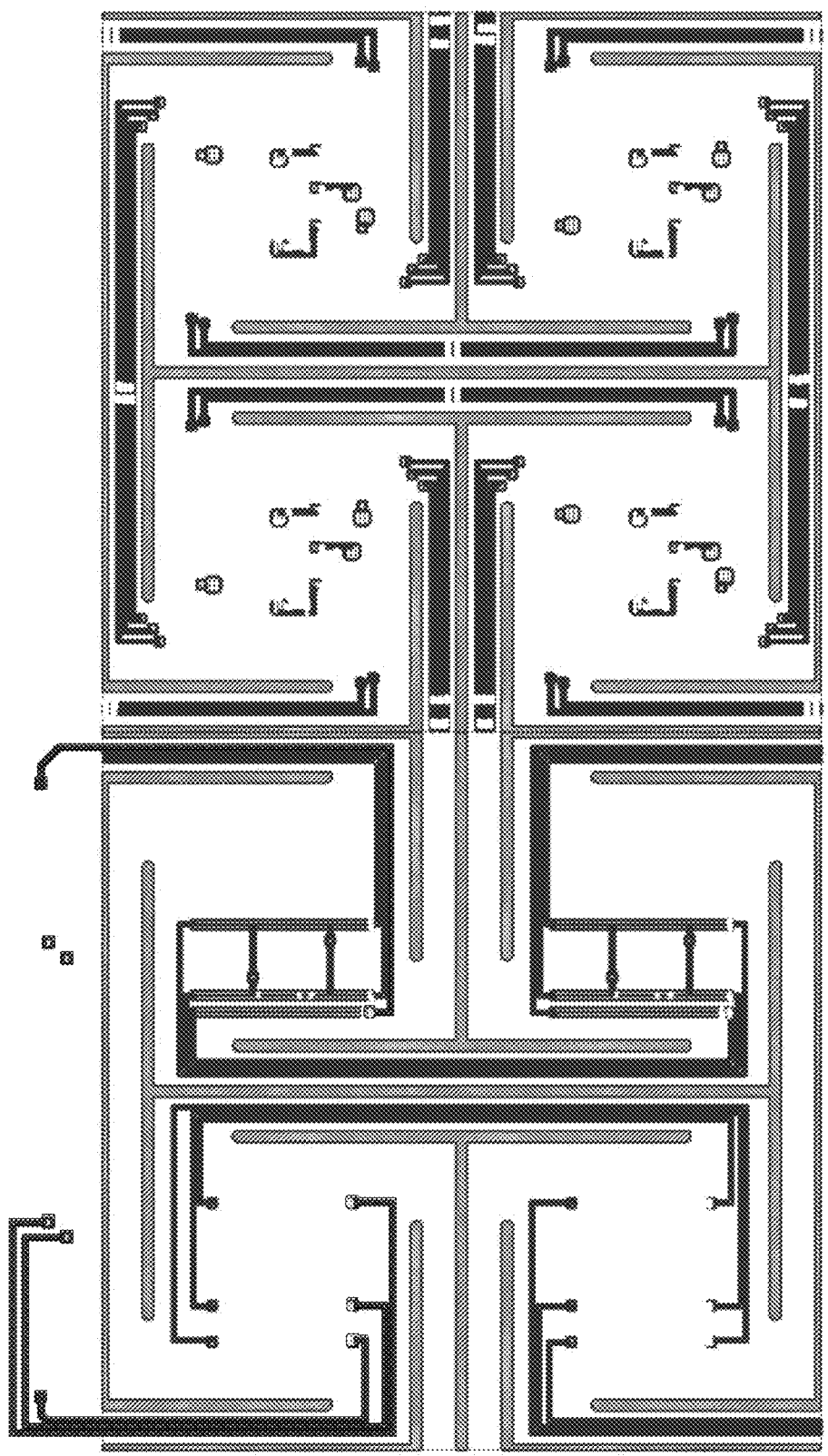
FIG. 8F illustrate the structure of a second signal line layer in the portion of the display substrate depicted in FIG. 8A.
Figure 8G:
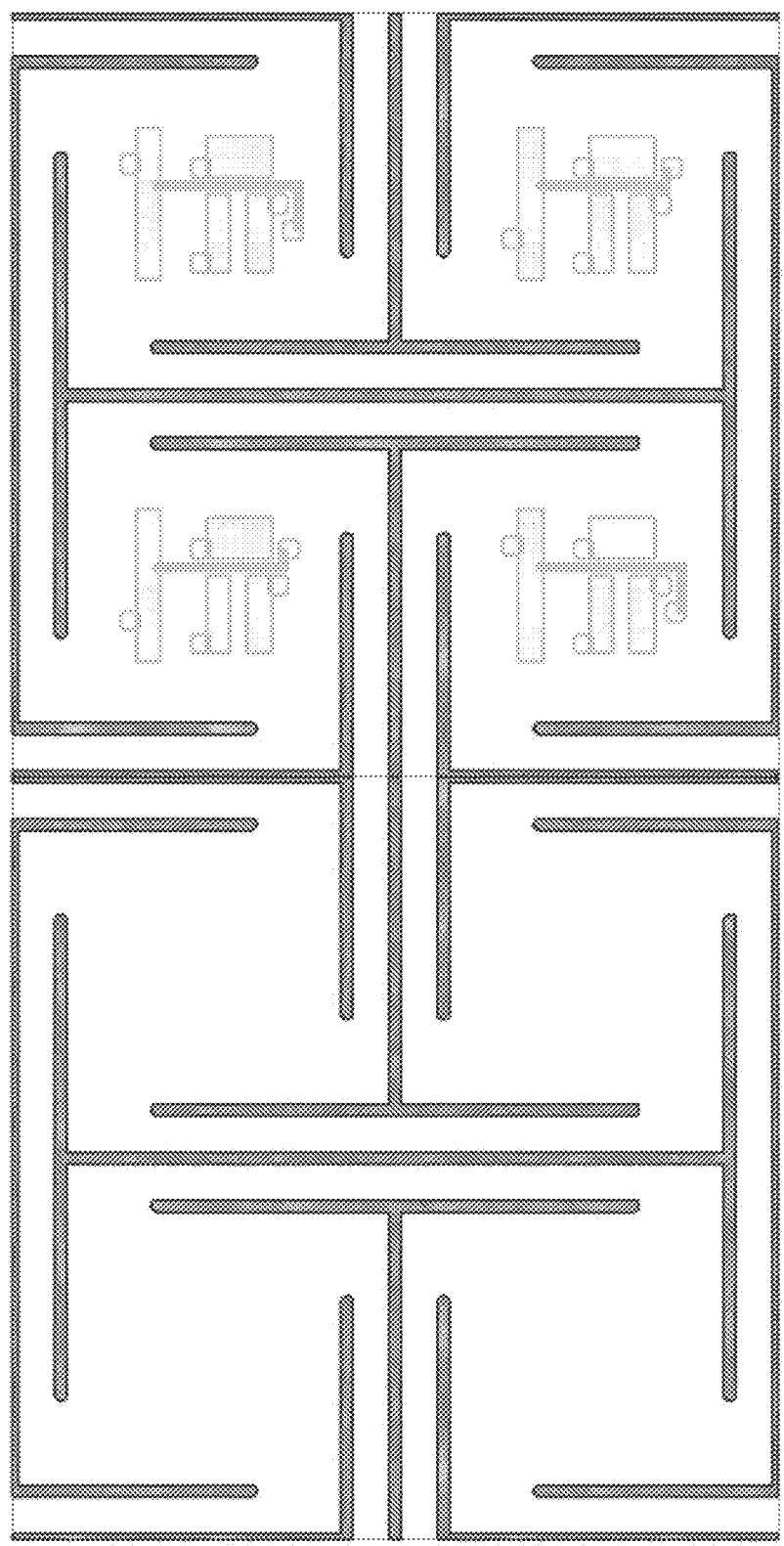
FIG. 8G illustrate the structure of an anode material layer in the portion of the display substrate depicted in FIG. 8A.

In some embodiments, the one or more scan circuits SC are in the first region, and the electrostatic discharge protection circuit ESD is in the second region. FIG. 8A is a schematic diagram illustrating a portion of a display substrate having an electrostatic discharge protection circuit in some embodiments according to the present disclosure. FIG. 8B illustrate the structure of a semiconductor material layer in the portion of the display substrate depicted in FIG. 8A. FIG. 8C illustrate the structure of a first conductive layer in the portion of the display substrate depicted in FIG. 8A. FIG. 8D illustrate the structure of a second conductive layer in the portion of the display substrate depicted in FIG. 8A. FIG. 8E illustrate the structure of a first signal line layer in the portion of the display substrate depicted in FIG. 8A. FIG. 8F illustrate the structure of a second signal line layer in the portion of the display substrate depicted in FIG. 8A. FIG. 8G illustrate the structure of an anode material layer in the portion of the display substrate depicted in FIG. 8A.

Referring to FIG. 8A to FIG. 8G, the display substrate in some embodiments includes a display area DA and a peripheral area PA. In the peripheral area PA, the display substrate includes one or more scan circuits, e.g., a first scan circuit SC1 and a second scan circuit SC2. In one example, the first scan circuit SC1 is a light emitting control signal generating circuit configured to generate light emitting control signals for subpixels in a display substrate. In another example, the second scan circuit SC2 is a gate scanning signal generating circuit configured to generate gate scanning signals for subpixels in a display substrate.

In some embodiment, the peripheral area PA includes a first region 1R and a second region 2R. In the first region 1R, the display substrate includes a plurality of islands Is, a plurality of bridges Br connecting the plurality of islands Is, and a plurality of gaps G at least partially extending into the display substrate. A respective island of the plurality of islands Is includes at least one scan unit of the one or more scan circuits. Signal lines connecting to adjacent scan circuits of the one or more scan circuits are disposed in the plurality of bridges Br. In the second region 2R, the display substrate includes the electrostatic discharge protection circuit. In one example depicted in FIG. 8A to FIG. 8G, the display substrate includes a first electrostatic discharge protection circuit ESD1 for protecting the first scan circuit SC1 from electrostatic discharge damage, and a second electrostatic discharge protection circuit ESD2 for protecting the second scan circuit SC2 from electrostatic discharge damage.

In some embodiment, the electrostatic discharge protection circuit is electrically connected to an input terminal of a 1$^{st}$ scan unit of a scan circuit. As shown in FIG. 8A to FIG. 8G, the first electrostatic discharge protection circuit ESD1 is electrically connected to a first input terminal IN1 of a 1$^{st}$ scan unit of the first scan circuit SC1. The second electrostatic discharge protection circuit ESD2 is electrically connected to a second input terminal IN2 of a 1$^{st}$ scan unit of the second scan circuit SC2.

The display substrate in the display area DA includes a plurality of second islands Is2, a plurality of second bridges Br2 connecting the plurality of second islands Is2, and a plurality of second gaps G2 at least partially extending into the display substrate. A respective second island of the plurality of second islands Is2 includes at least one light emitting element of a plurality of light emitting elements. Signal lines connecting to adjacent light emitting elements of the plurality of light emitting elements are disposed in the plurality of second bridges Br2.

Figure 9A:
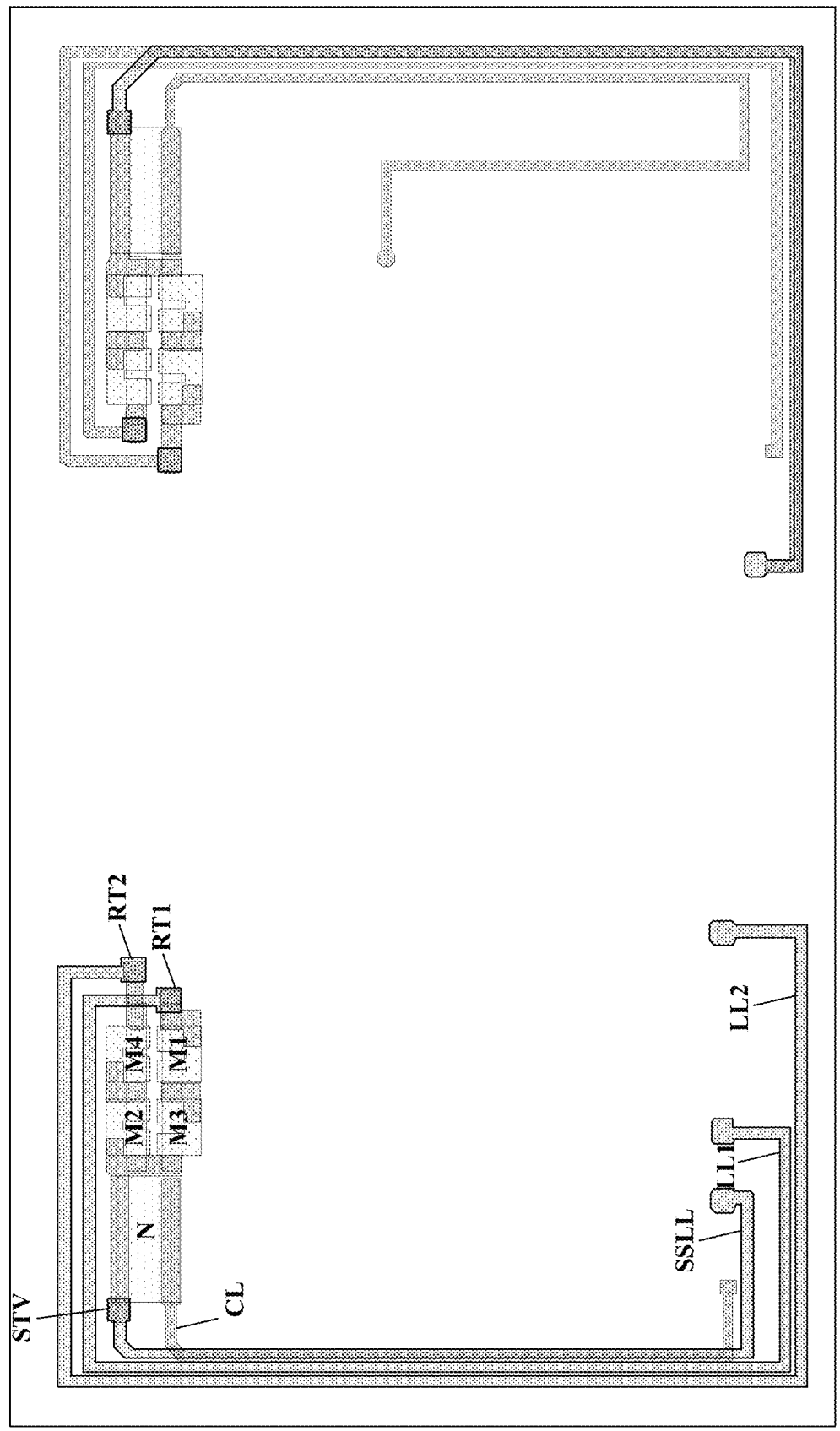
FIG. 9A is a schematic diagram illustrating the structure of an electrostatic discharge protection circuit in some embodiments according to the present disclosure.
Figure 9B:
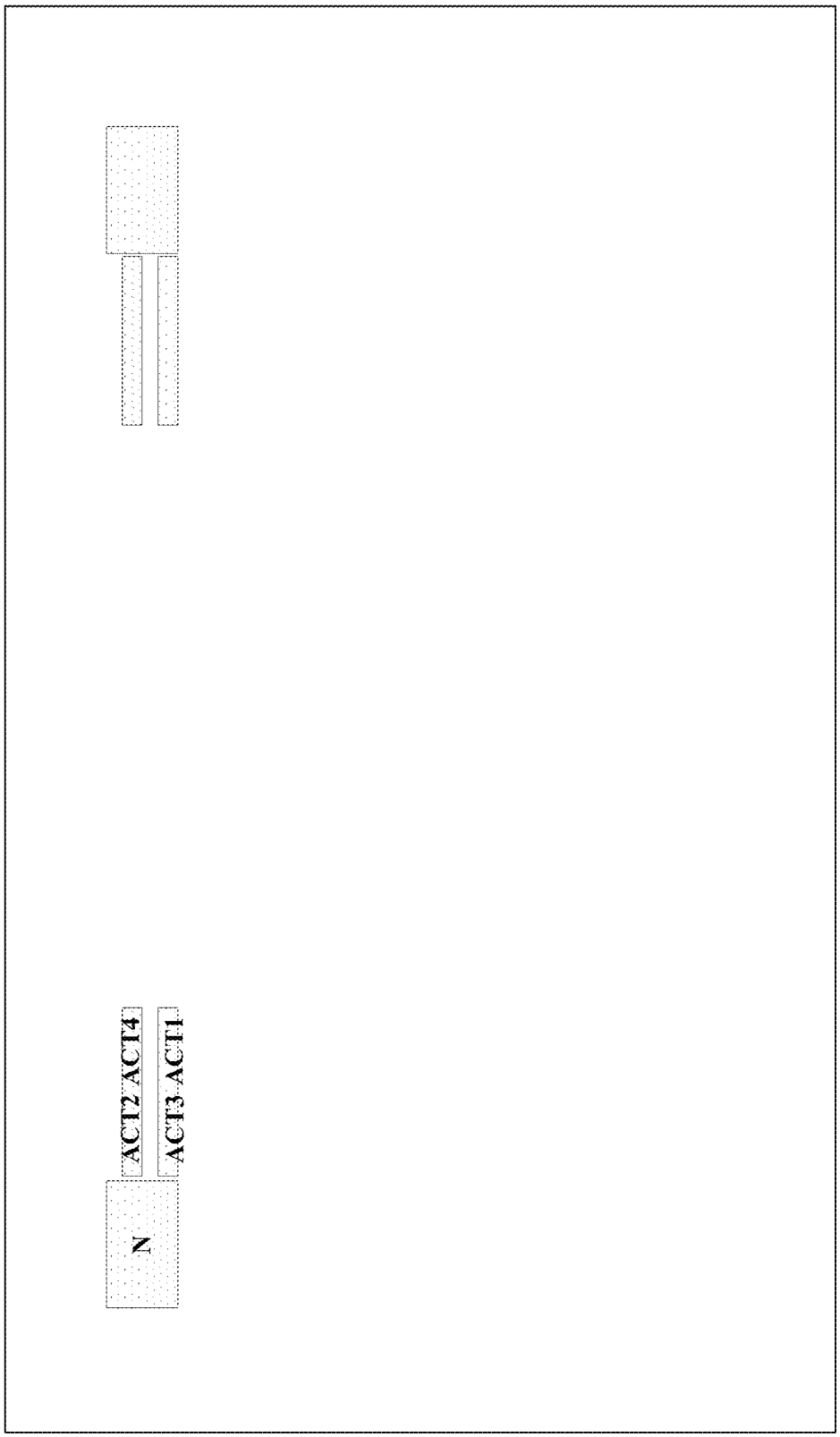
FIG. 9B illustrate the structure of a semiconductor material layer in the electrostatic discharge protection circuit depicted in FIG. 9A.
Figure 9C:
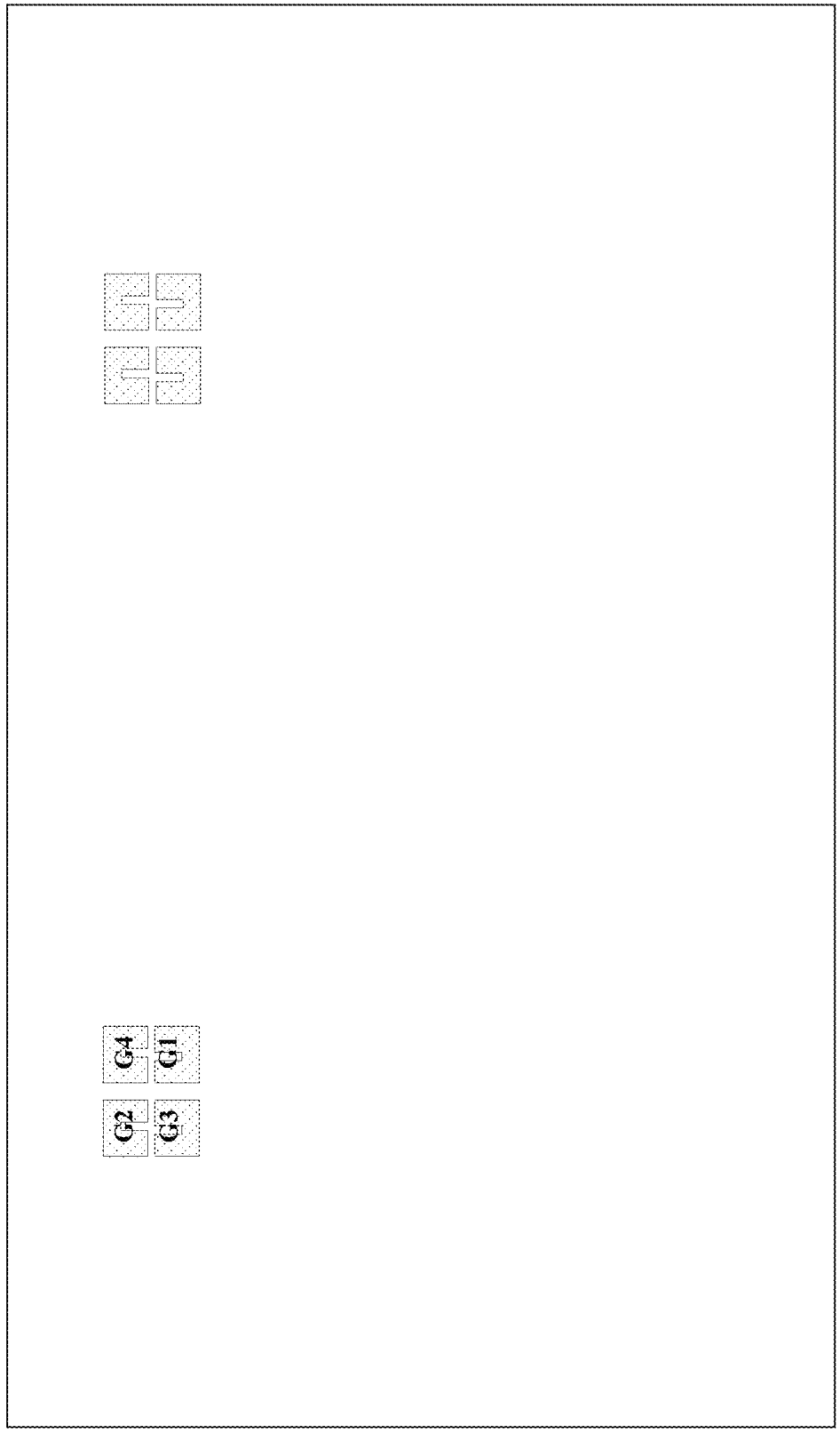
FIG. 9C illustrate the structure of a first conductive layer in the electrostatic discharge protection circuit depicted in FIG. 9A.
Figure 9D:
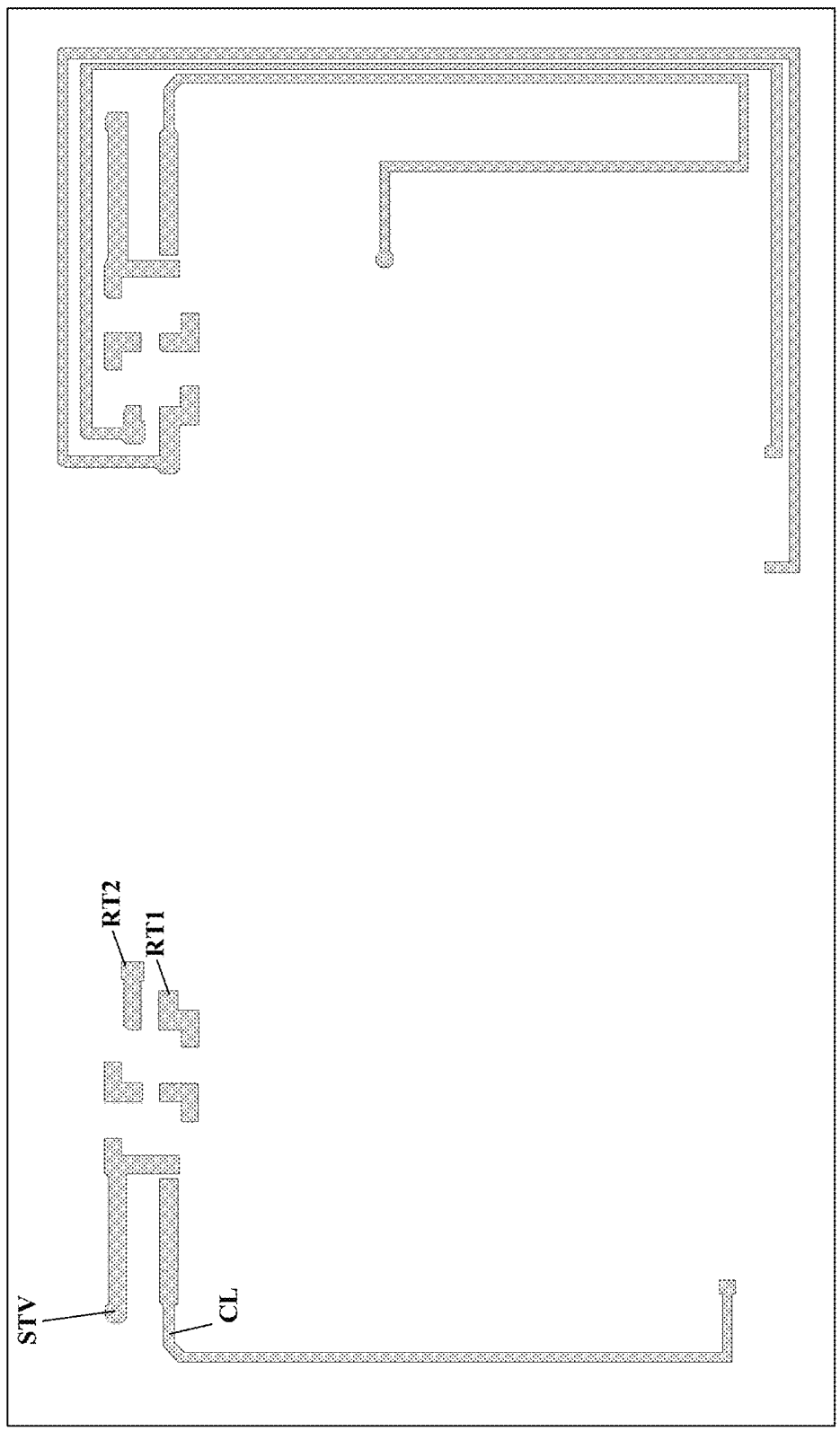
FIG. 9D illustrate the structure of a first signal line layer in the electrostatic discharge protection circuit depicted in FIG. 9A.
Figure 9E:
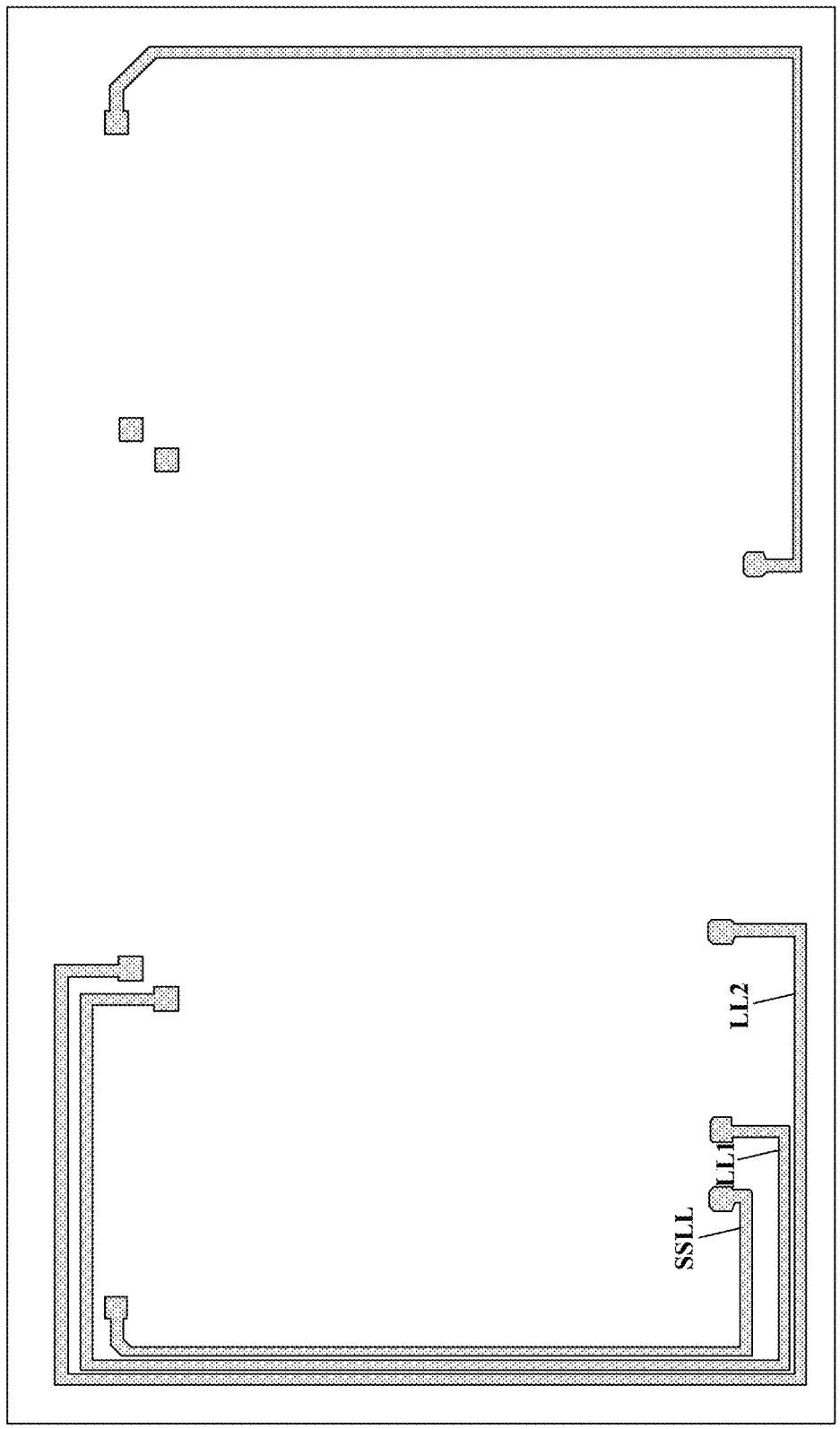
FIG. 9E illustrate the structure of a second signal line layer in the electrostatic discharge protection circuit depicted in FIG. 9A.

FIG. 9A is a schematic diagram illustrating the structure of an electrostatic discharge protection circuit in some embodiments according to the present disclosure. FIG. 9B illustrate the structure of a semiconductor material layer in the electrostatic discharge protection circuit depicted in FIG. 9A. FIG. 9C illustrate the structure of a first conductive layer in the electrostatic discharge protection circuit depicted in FIG. 9A. FIG. 9D illustrate the structure of a first signal line layer in the electrostatic discharge protection circuit depicted in FIG. 9A. FIG. 9E illustrate the structure of a second signal line layer in the electrostatic discharge protection circuit depicted in FIG. 9A. Referring to FIG. 9A and FIG. 9B, the electrostatic discharge protection circuit in the semiconductor material layer includes active layers (ACT1, ACT2, ACT3, and ACT4) of the first transistor M1, the second transistor M2, the third transistor M3, and the fourth transistor M4. The electrostatic discharge protection circuit in the semiconductor material layer further includes the node N that is electrically connected to a start signal terminal STV, and electrically connected between the second transistor M2 and the third transistor M3.

Referring to FIG. 9A and FIG. 9C, the electrostatic discharge protection circuit in the first conductive layer includes gate electrodes (G1, G2, G3, and G4) of the first transistor M1, the second transistor M2, the third transistor M3, and the fourth transistor M4.

Referring to FIG. 9A and FIG. 9D, the electrostatic discharge protection circuit in the first signal line layer includes the first reference voltage terminal RT1 electrically connected to the first electrode and the gate electrode of the first transistor, the second reference voltage terminal RT2 electrically connected to the second electrode of the fourth transistor M4, the start signal terminal STV, and a connecting line CL connecting the node N to an input terminal of a 1$^{st}$ scan unit of a scan circuit.

Referring to FIG. 9A and FIG. 9E, the electrostatic discharge protection circuit in the second signal line layer includes a start signal lead line SSLL, a first lead line LL1, and a second lead line LL2. The start signal lead line SSLL electrically connects the start signal terminal to a start signal line in the scan circuit. The first lead line LL1 electrically connects the first reference voltage terminal RT1 to a first reference signal line in the scan circuit. The second lead line LL2 electrically connects the second reference voltage terminal RT2 to a second reference signal line in the scan circuit.

Referring to FIG. 8A to FIG. 8G, and FIG. 9A to FIG. 9E, in some embodiments, the connecting line CL extends from the first region 1R (a relatively more stretchable region) into the second region 2R (a relatively less stretchable region or non-stretchable region). In the first region 1R, the connecting line CL is electrically connected to the input terminal of a 1$^{st}$ scan unit of a scan circuit. In the second region 2R, the connecting line CL is electrically connected to the node N of the electrostatic discharge protection circuit.

Referring to FIG. 8A to FIG. 8G, and FIG. 9A to FIG. 9E, in some embodiments, the start signal lead line SSLL extends from the first region 1R (a relatively more stretchable region) into the second region 2R (a relatively less stretchable region or non-stretchable region). In the first region 1R, the start signal lead line SSLL is electrically connected to the start signal line in the scan circuit. In the second region 2R, the start signal lead line SSLL is electrically connected to the start signal terminal STV of the electrostatic discharge protection circuit.

Referring to FIG. 8A to FIG. 8G, and FIG. 9A to FIG. 9E, in some embodiments, the first lead line LL1 extends from the first region 1R (a relatively more stretchable region) into the second region 2R (a relatively less stretchable region or non-stretchable region). In the first region 1R, the first lead line LL1 is electrically connected to the first reference signal line in the scan circuit. In the second region 2R, the first lead line LL1 is electrically connected to the first reference voltage terminal RT1 of the electrostatic discharge protection circuit.

Referring to FIG. 8A to FIG. 8G, and FIG. 9A to FIG. 9E, in some embodiments, the second lead line LL2 extends from the first region 1R (a relatively more stretchable region) into the second region 2R (a relatively less stretchable region or non-stretchable region). In the first region 1R, the second lead line LL2 is electrically connected to the second reference signal line in the scan circuit. In the second region 2R, the second lead line LL2 is electrically connected to the second reference voltage terminal RT2 of the electrostatic discharge protection circuit.

Figure 10:
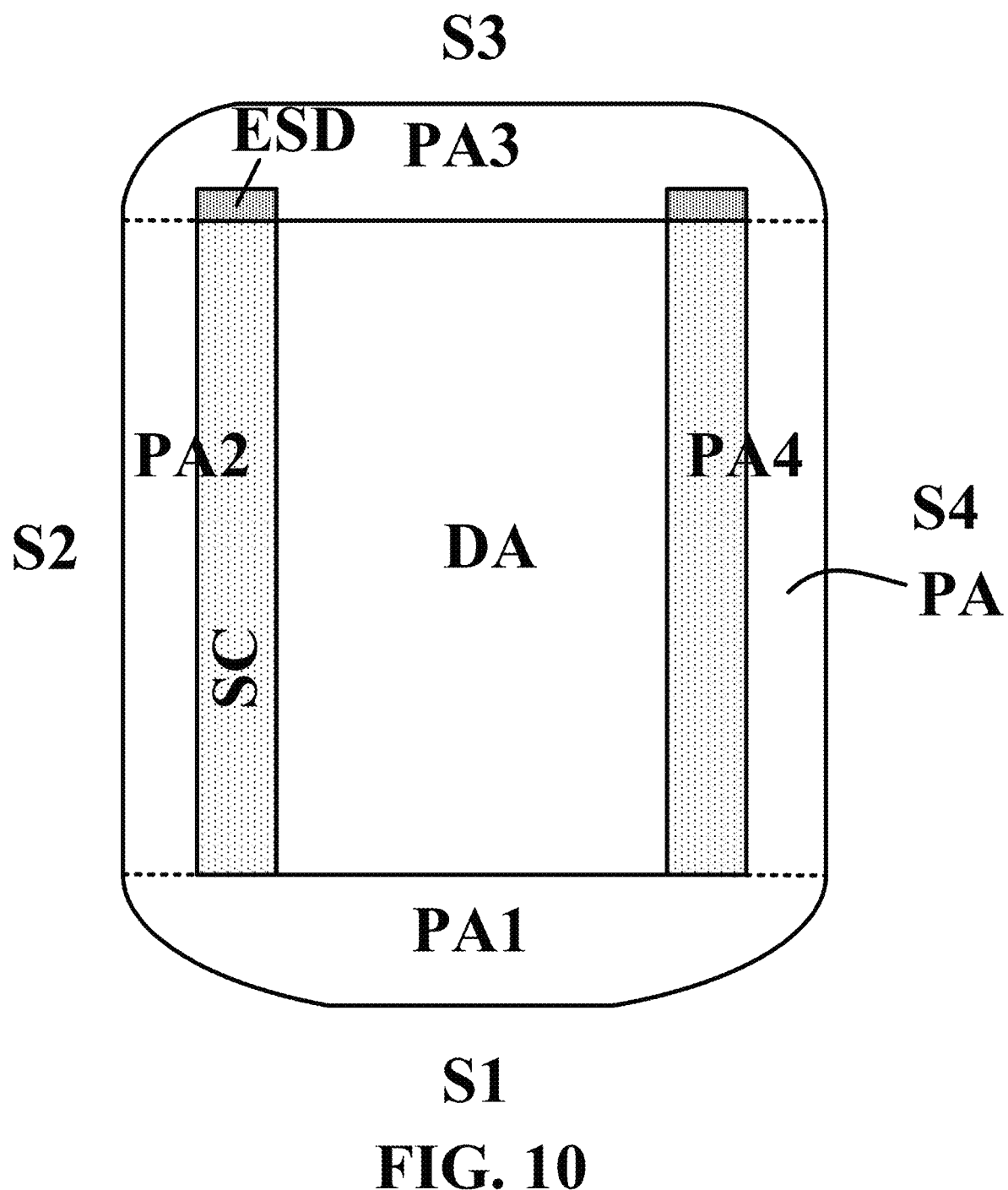
FIG. 10 is a schematic diagram illustrating the structure of a display substrate in some embodiments according to the present disclosure.

FIG. 10 is a schematic diagram illustrating the structure of a display substrate in some embodiments according to the present disclosure. Referring to FIG. 10, the electrostatic discharge protection circuit ESD is in the third sub-area PA3 while the one or more scan circuits SC are in the second sub-area PA2 and/or the fourth sub-area PA4. Referring to FIG. 4 and FIG. 7, in some embodiments, the plurality of gaps G are at least partially present in the first sub-area PA1, the second sub-area PA2, the third sub-area PA3, and the fourth sub-area PA4. The plurality of islands Is are at least partially present in the first sub-area PA1, the second sub-area PA2, the third sub-area PA3, and the fourth sub-area PA4. The plurality of bridges Br are at least partially present in the first sub-area PA1, the second sub-area PA2, the third sub-area PA3, and the fourth sub-area PA4. The display substrate is at least partially stretchable in all four sub-areas, including the first sub-area PA1, the second sub-area PA2, the third sub-area PA3, and the fourth sub-area PA4.

Figure 11A:
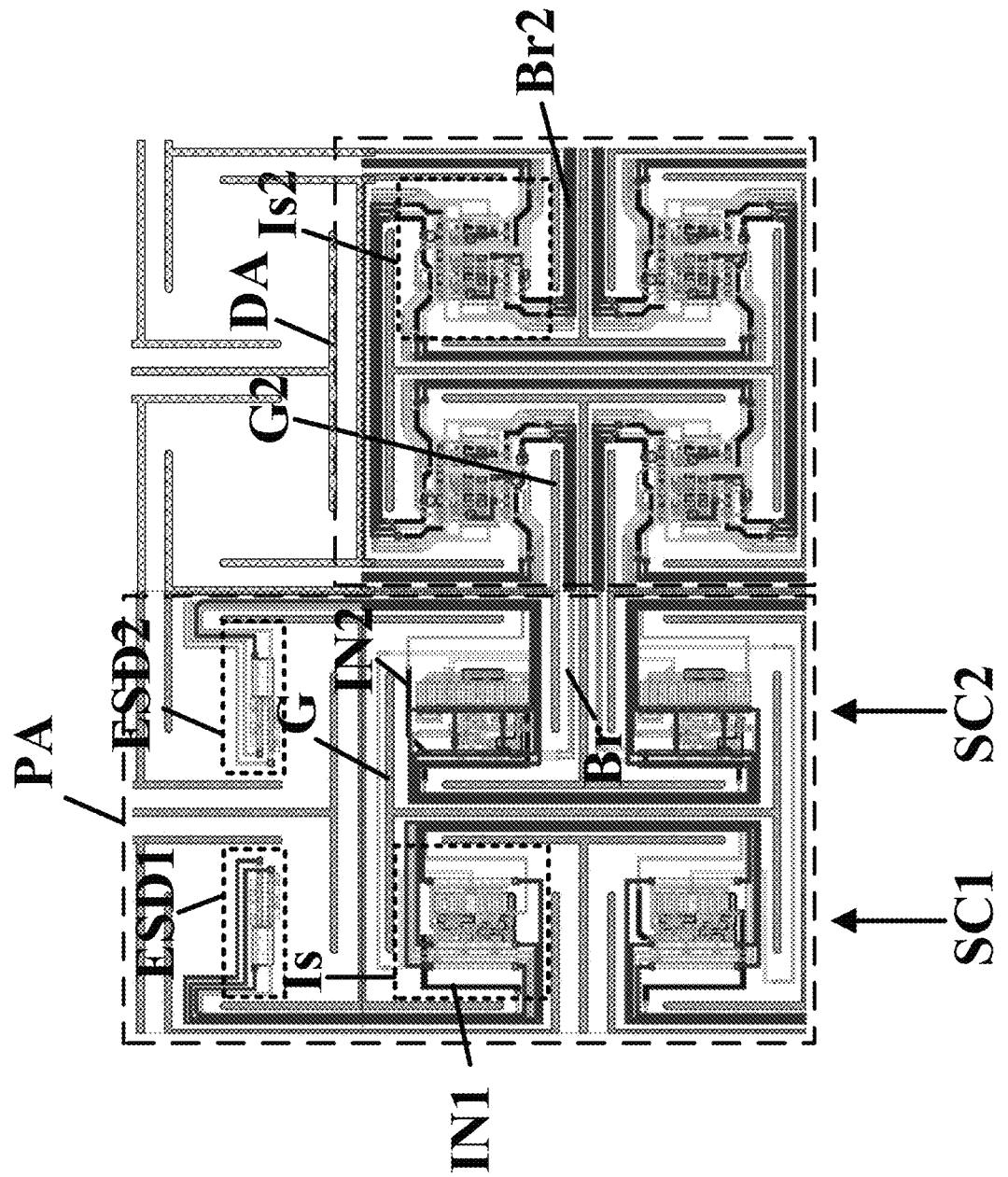
FIG. 11A is a schematic diagram illustrating a portion of a display substrate having an electrostatic discharge protection circuit in some embodiments according to the present disclosure.
Figure 11B:
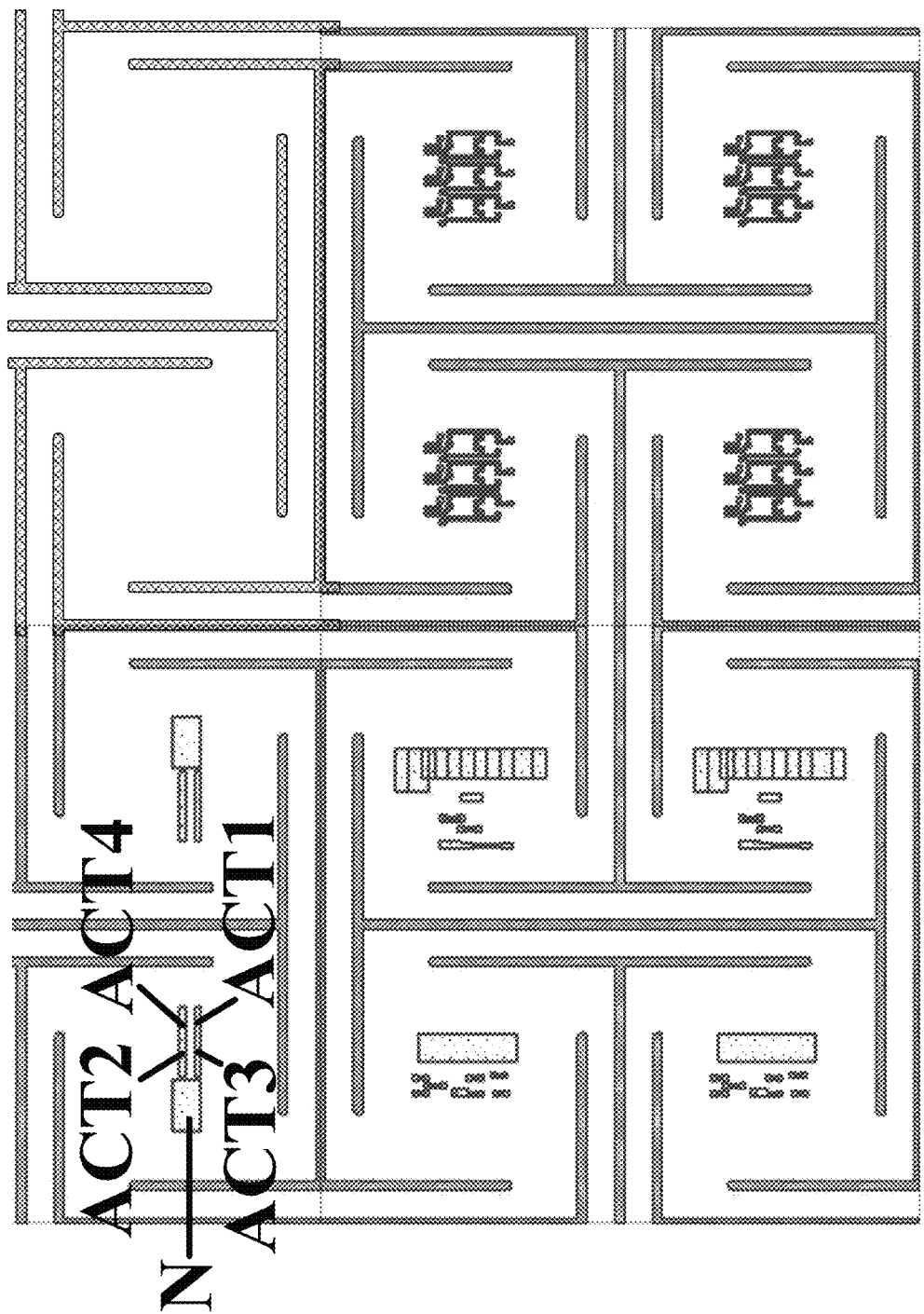
FIG. 11B illustrate the structure of a semiconductor material layer in the portion of the display substrate depicted in FIG. 11A.
Figure 11C:
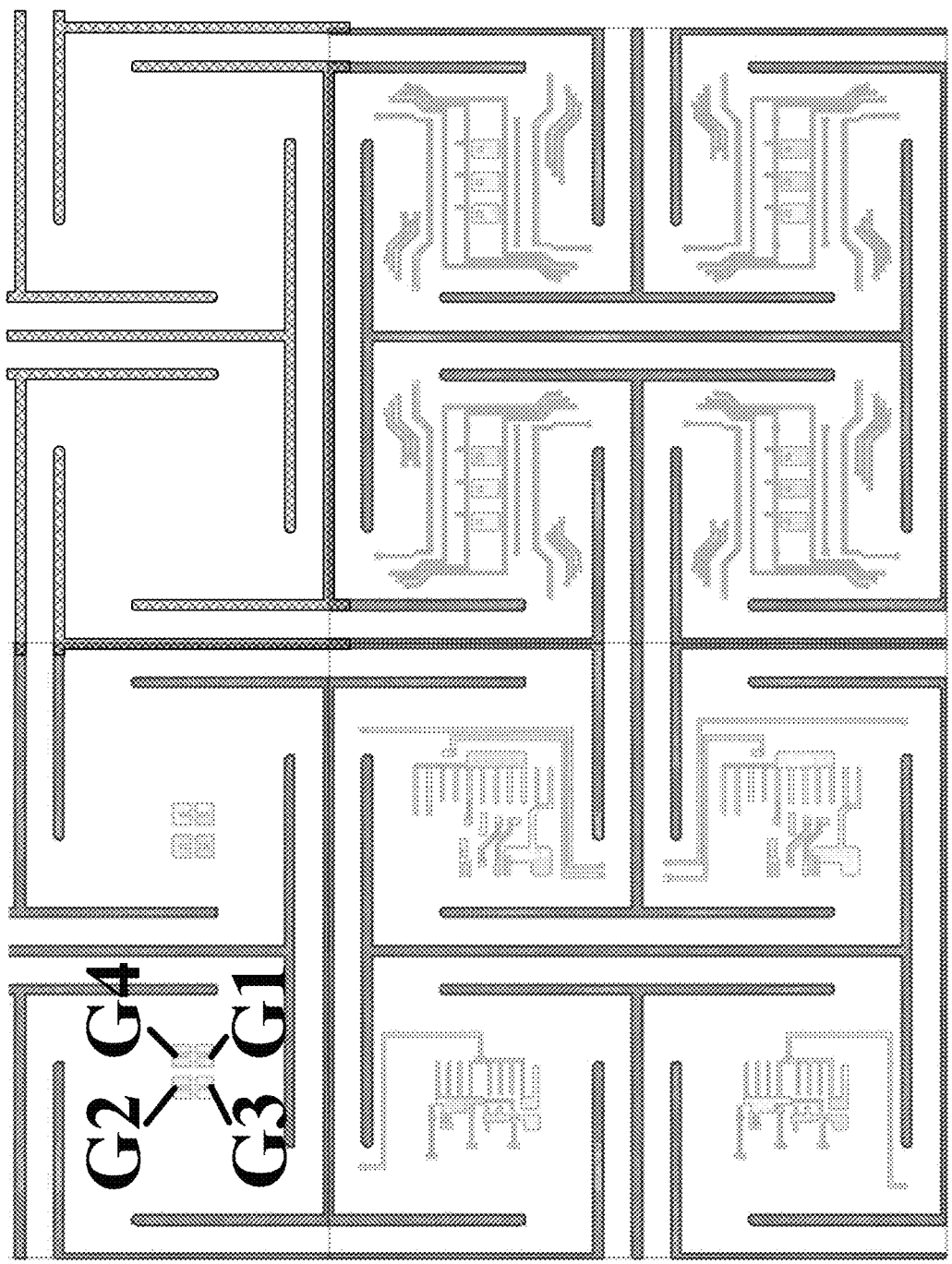
FIG. 11C illustrate the structure of a first conductive layer in the portion of the display substrate depicted in FIG. 11A.
Figure 11D:
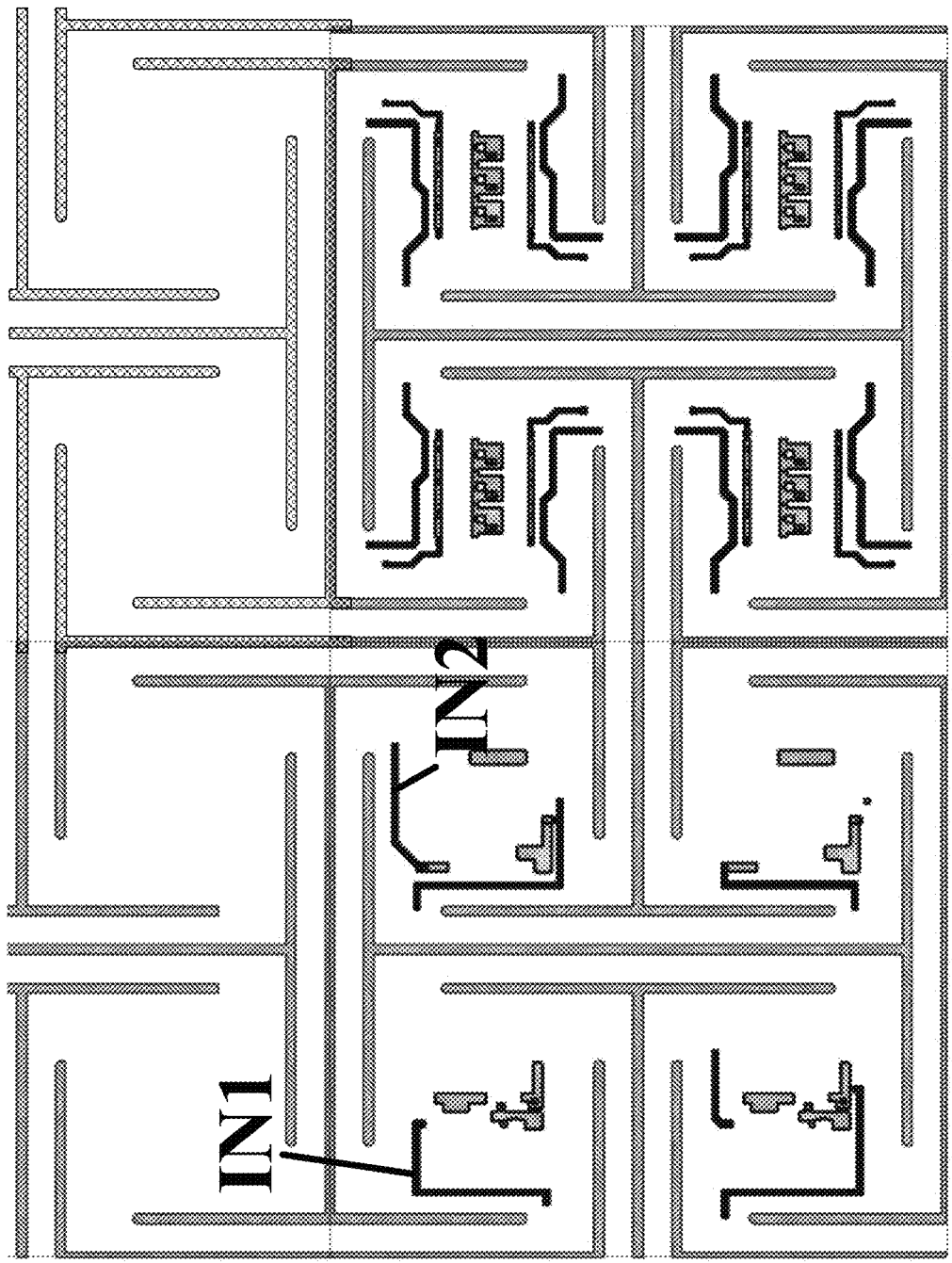
FIG. 11D illustrate the structure of a second conductive layer in the portion of the display substrate depicted in FIG. 11A.
Figure 11E:
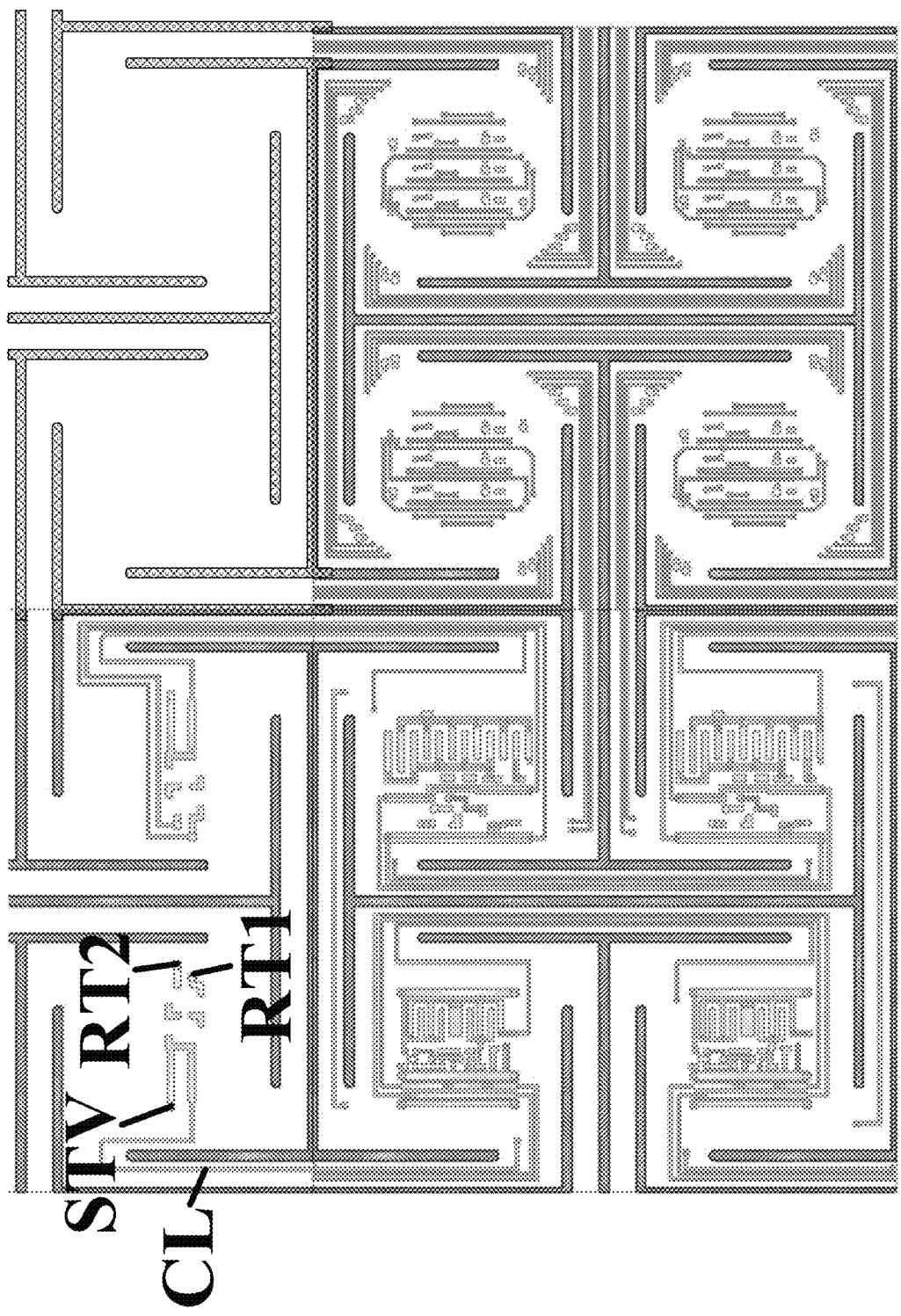
FIG. 11E illustrate the structure of a first signal line layer in the portion of the display substrate depicted in FIG. 11A.
Figure 11F:
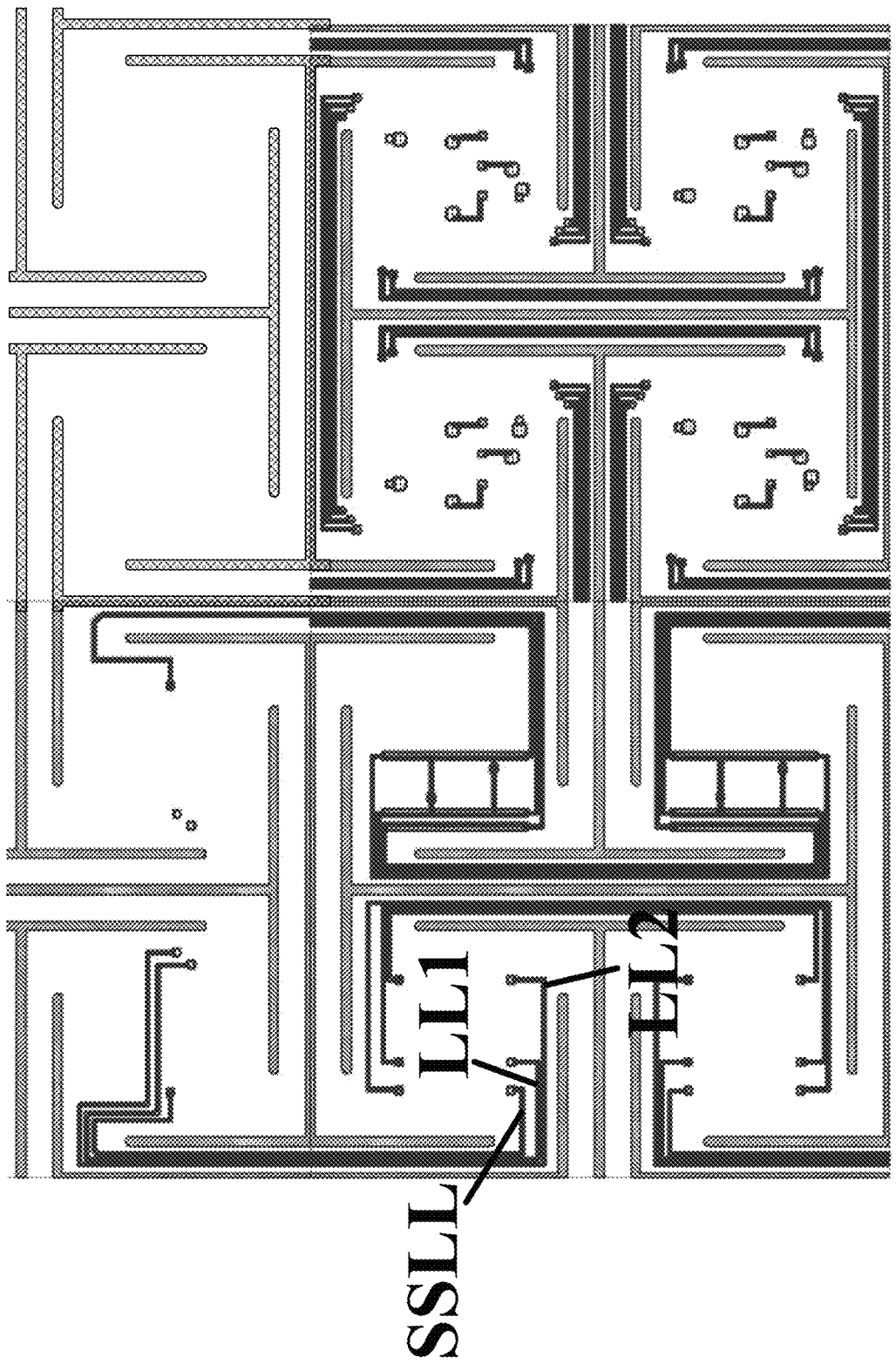
FIG. 11F illustrate the structure of a second signal line layer in the portion of the display substrate depicted in FIG. 11A.
Figure 11G:
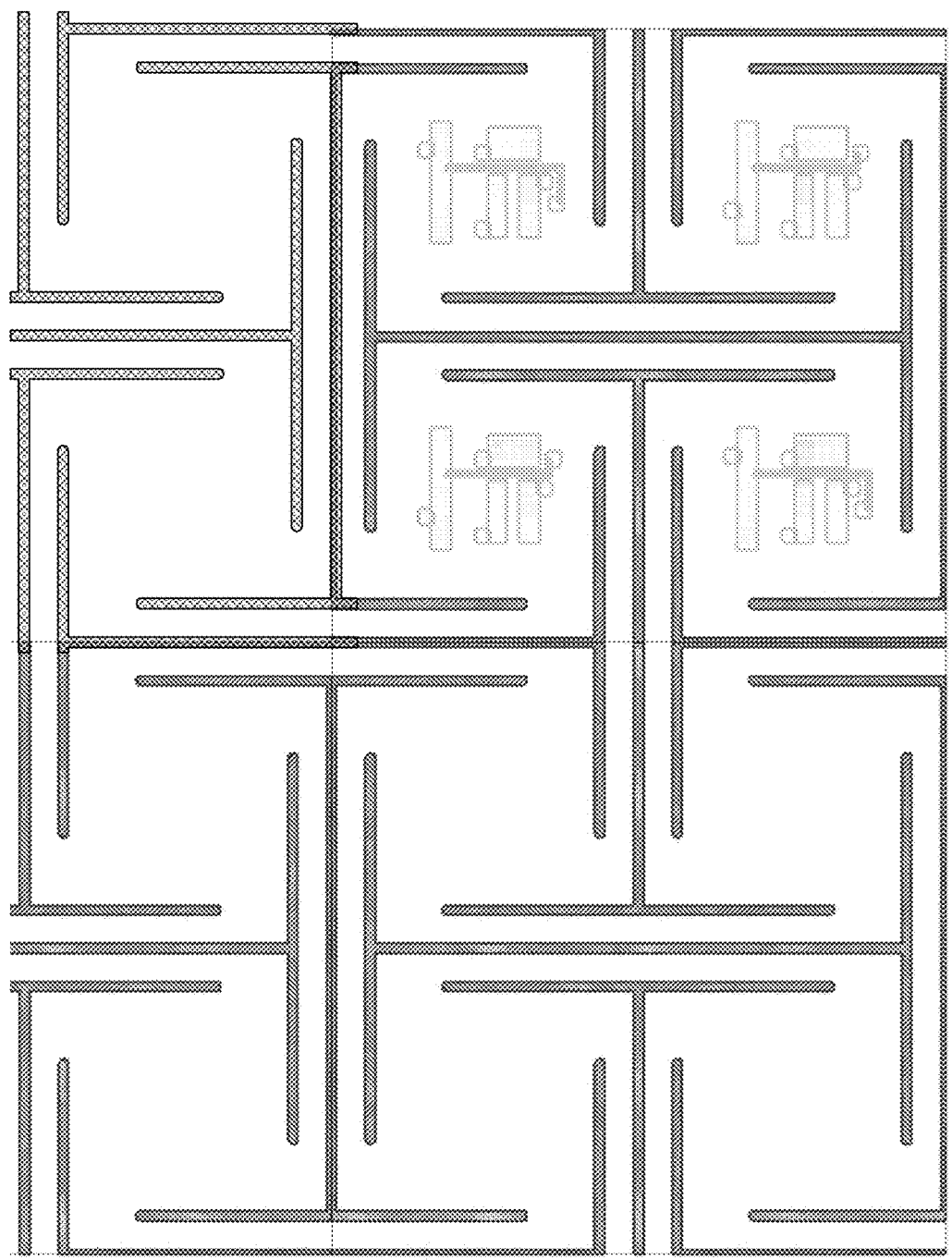
FIG. 11G illustrate the structure of an anode material layer in the portion of the display substrate depicted in FIG. 11A.

In some embodiments, the electrostatic discharge protection circuit is in a respective first island of the plurality of islands Is; and the $1^{st}$ scan unit of a scan circuit is in a respective second island of the plurality of islands Is. Optionally, the respective first island and the respective second island are adjacent to each other. FIG. 11A is a schematic diagram illustrating a portion of a display substrate having an electrostatic discharge protection circuit in some embodiments according to the present disclosure. FIG. 11B illustrate the structure of a semiconductor material layer in the portion of the display substrate depicted in FIG. 11A. FIG. 11C illustrate the structure of a first conductive layer in the portion of the display substrate depicted in FIG. 11A. FIG. 11D illustrate the structure of a second conductive layer in the portion of the display substrate depicted in FIG. 11A. FIG. 11E illustrate the structure of a first signal line layer in the portion of the display substrate depicted in FIG. 11A. FIG. 11F illustrate the structure of a second signal line layer in the portion of the display substrate depicted in FIG. 11A. FIG. 11G illustrate the structure of an anode material layer in the portion of the display substrate depicted in FIG. 11A.

Referring to FIG. 11A to FIG. 11G, the display substrate in some embodiments includes a display area DA and a peripheral area PA. In the peripheral area PA, the display substrate includes one or more scan circuits, e.g., a first scan circuit SC1 and a second scan circuit SC2. In one example, the first scan circuit SC1 is a light emitting control signal generating circuit configured to generate light emitting control signals for subpixels in a display substrate. In another example, the second scan circuit SC2 is a gate scanning signal generating circuit configured to generate gate scanning signals for subpixels in a display substrate.

In some embodiment, in the peripheral area PA, the display substrate includes a plurality of islands Is, a plurality of bridges Br connecting the plurality of islands Is, and a plurality of gaps G at least partially extending into the display substrate. A respective first island of the plurality of islands Is includes at least one electrostatic discharge protection circuit. A respective second island of the plurality of islands Is includes at least one scan unit of the one or more scan circuits. Signal lines connecting to adjacent scan circuits of the one or more scan circuits are disposed in the plurality of bridges Br. One or more signal lines connecting the electrostatic discharge protection circuit and one or more adjacent scan units are disposed in the plurality of bridges Br. In one example depicted in FIG. 11A to FIG. 11G, the display substrate includes a first electrostatic discharge protection circuit ESD1 for protecting the first scan circuit SC1 from electrostatic discharge damage, and a second electrostatic discharge protection circuit ESD2 for protecting the second scan circuit SC2 from electrostatic discharge damage. The first electrostatic discharge protection circuit ESD1 and the second electrostatic discharge protection circuit ESD2 are in two adjacent islands of the plurality of islands Is.

In some embodiment, the electrostatic discharge protection circuit is electrically connected to an input terminal of a $1^{st}$ scan unit of a scan circuit. As shown in FIG. 11A to FIG. 11G, the first electrostatic discharge protection circuit ESD1 is electrically connected to a first input terminal IN1 of a $1^{st}$ scan unit of the first scan circuit SC1. The second electrostatic discharge protection circuit ESD2 is electrically connected to a second input terminal IN2 of a $1^{st}$ scan unit of the second scan circuit SC2.

Referring to FIG. 6B, and FIG. 11A to FIG. 11G, the electrostatic discharge protection circuit in the semiconductor material layer includes active layers (ACT1, ACT2, ACT3, and ACT4) of the first transistor M1, the second transistor M2, the third transistor M3, and the fourth transistor M4. The electrostatic discharge protection circuit in the semiconductor material layer further includes the node N that is electrically connected to a start signal terminal STV, and is electrically connected between the second transistor M2 and the third transistor M3.

Referring to FIG. 6B, and FIG. 11A to FIG. 11G, the electrostatic discharge protection circuit in the first conductive layer includes gate electrodes (G1, G2, G3, and G4) of the first transistor M1, the second transistor M2, the third transistor M3, and the fourth transistor M4.

Referring to FIG. 6B, and FIG. 11A to FIG. 11G, the electrostatic discharge protection circuit in the first signal line layer includes the first reference voltage terminal RT1 electrically connected to the first electrode and the gate electrode of the first transistor, the second reference voltage terminal RT2 electrically connected to the second electrode of the fourth transistor M4, the start signal terminal STV, and a connecting line CL connecting the node N to an input terminal of a $1^{st}$ scan unit of a scan circuit.

Referring to FIG. 6B, and FIG. 11A to FIG. 11G, the electrostatic discharge protection circuit in the second signal line layer includes a start signal lead line SSLL, a first lead line LL1, and a second lead line LL2. The start signal lead line SSLL electrically connects the start signal terminal to a start signal line in the scan circuit. The first lead line LL1 electrically connects the first reference voltage terminal RT1 to a first reference signal line in the scan circuit. The second lead line LL2 electrically connects the second reference voltage terminal RT2 to a second reference signal line in the scan circuit.

Referring to FIG. 11A to FIG. 11G, in some embodiments, the connecting line CL extends from a respective first island of the plurality of islands Is having an electrostatic discharge protection circuit (e.g., ESD1 or ESD2) to a respective second island of the plurality of islands Is having at least one scan unit of the one or more scan circuits (e.g., SC1 or SC2). The connecting line CL at least partially extending through an individual bridge of the plurality of bridges Br connecting the respective first island and the respective second island.

Referring to FIG. 11A to FIG. 11G, in some embodiments, the start signal lead line SSLL extends from a respective first island of the plurality of islands Is having an electrostatic discharge protection circuit (e.g., ESD1 or ESD2) to a respective second island of the plurality of islands Is having at least one scan unit of the one or more scan circuits (e.g., SC1 or SC2). The start signal lead line SSLL at least partially extending through an individual bridge of the plurality of bridges Br connecting the respective first island and the respective second island.

Referring to FIG. 11A to FIG. 11G, in some embodiments, the first lead line LL1 extends from a respective first island of the plurality of islands Is having an electrostatic discharge protection circuit (e.g., ESD1 or ESD2) to a respective second island of the plurality of islands Is having at least one scan unit of the one or more scan circuits (e.g., SC1 or SC2). The first lead line LL1 at least partially extending through an individual bridge of the plurality of bridges Br connecting the respective first island and the respective second island.

Referring to FIG. 11A to FIG. 11G, in some embodiments, the second lead line LL2 extends from a respective first island of the plurality of islands Is having an electrostatic discharge protection circuit (e.g., ESD1 or ESD2) to a respective second island of the plurality of islands Is having at least one scan unit of the one or more scan circuits (e.g., SC1 or SC2). The second lead line LL2 at least partially extending through an individual bridge of the plurality of bridges Br connecting the respective first island and the respective second island.

Figure 12:
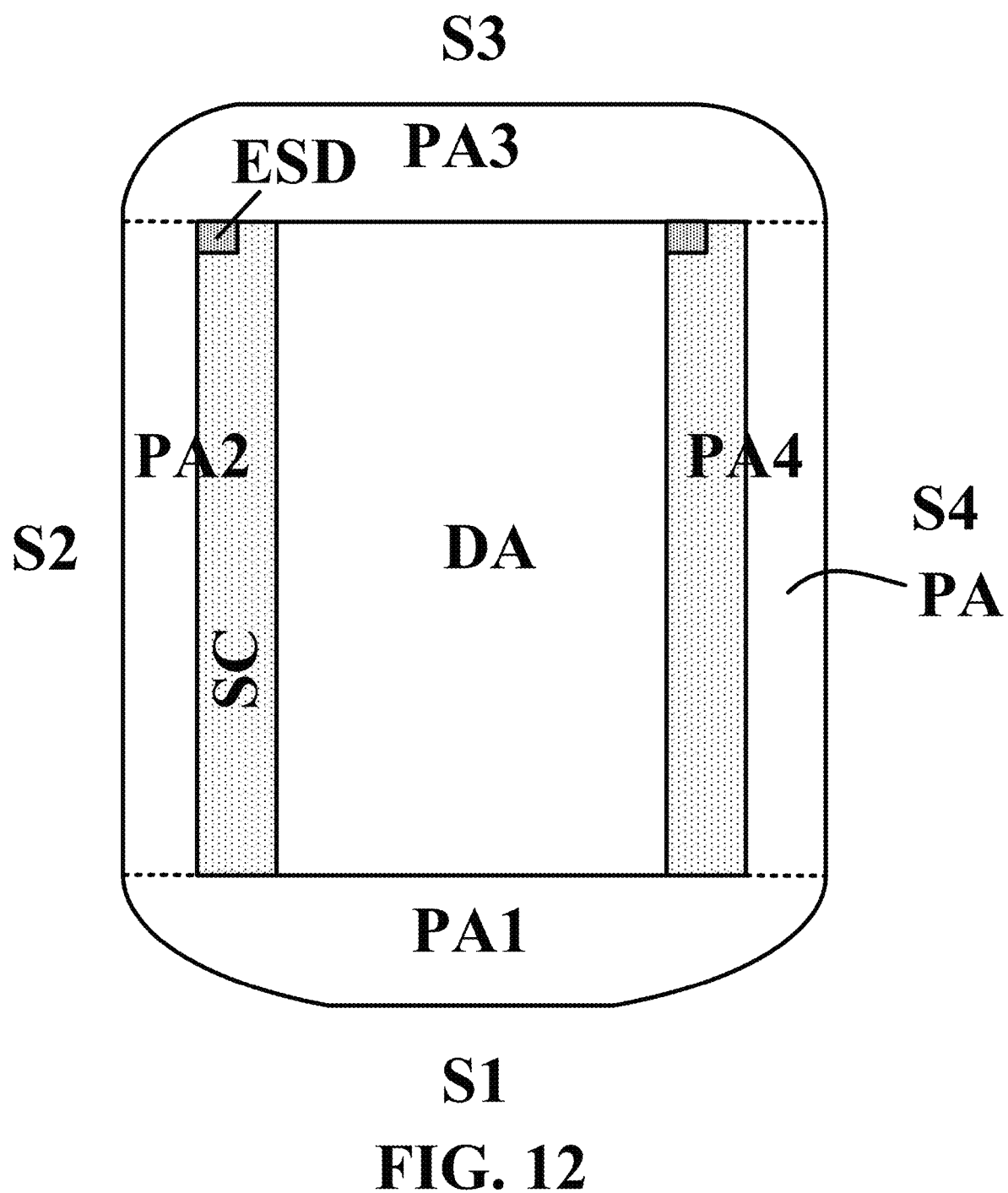
FIG. 12 is a schematic diagram illustrating the structure of a display substrate in some embodiments according to the present disclosure.

FIG. 12 is a schematic diagram illustrating the structure of a display substrate in some embodiments according to the present disclosure. Referring to FIG. 12, the electrostatic discharge protection circuit ESD is in the third sub-area PA3 while the one or more scan circuits SC are in the second sub-area PA2 and/or the fourth sub-area PA4. The embodiment depicted in FIG. 12 may be implemented in the display substrate depicted in FIG. 3 or in the display substrate depicted in FIG. 4.

Referring to FIG. 3, FIG. 4, and FIG. 12, the plurality of gaps G are at least partially present in the second sub-area PA2 and the fourth sub-area PA4 (FIG. 3 or FIG. 4), and may be further present in the first sub-area PA1 and the third sub-area PA3 (FIG. 4). The plurality of islands Is are at least partially present in the second sub-area PA2 and the fourth sub-area PA4 (FIG. 3 or FIG. 4), and may be further present in the first sub-area PA1 and the third sub-area PA3 (FIG. 4). The plurality of bridges Br are at least partially present in the second sub-area PA2 and the fourth sub-area PA4 (FIG. 3 or FIG. 4), and may be further present in the first sub-area PA1 and the third sub-area PA3 (FIG. 4). The display substrate is at least partially stretchable in the second sub-area PA2 and the fourth sub-area PA4 (FIG. 3 or FIG. 4), and may be at least partially stretchable in all four sub-areas, including the first sub-area PA1, the second sub-area PA2, the third sub-area PA3, and the fourth sub-area PA4 (FIG. 4).

Figure 13A:
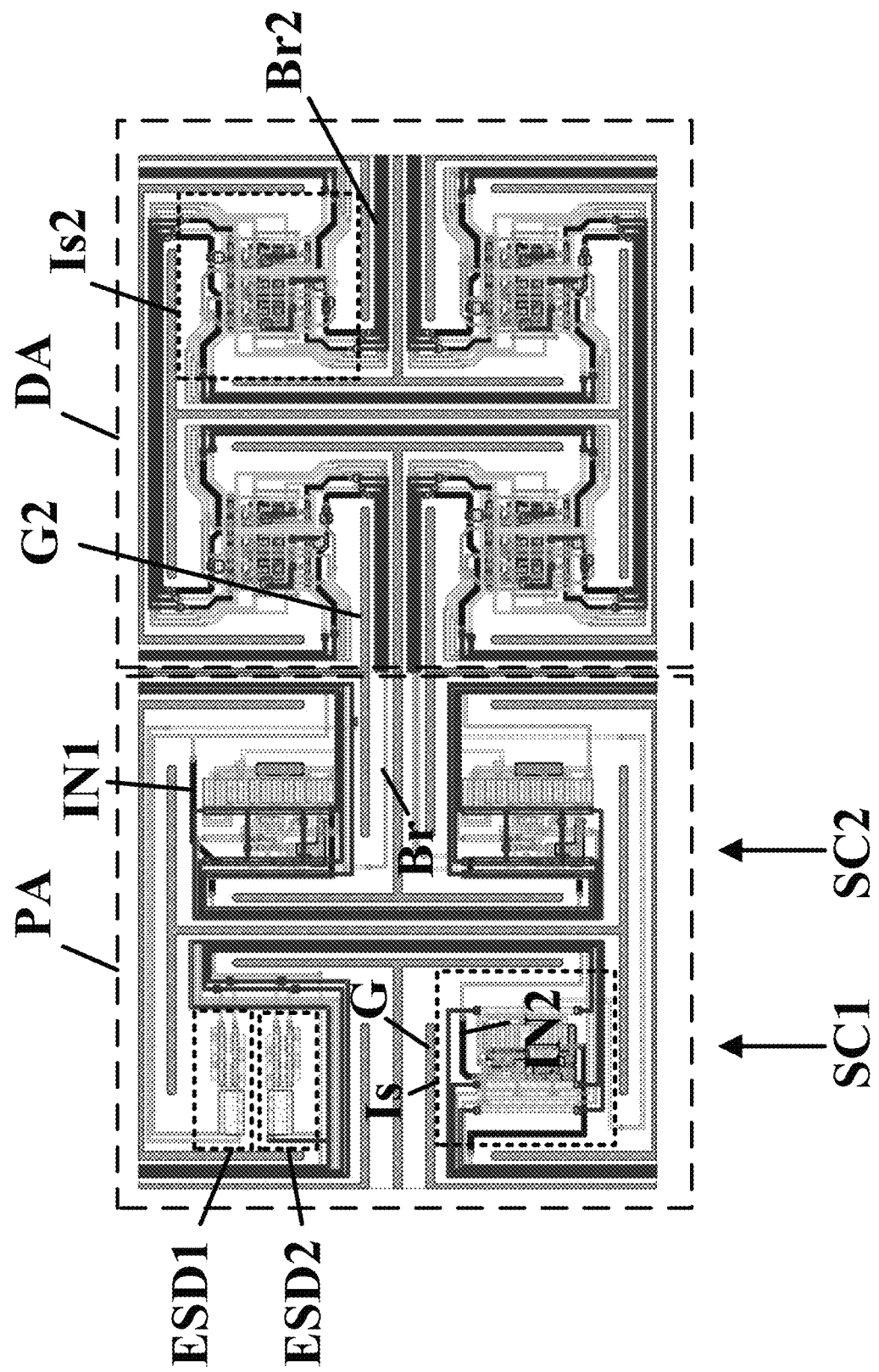
FIG. 13A is a schematic diagram illustrating a portion of a display substrate having an electrostatic discharge protection circuit in some embodiments according to the present disclosure.
Figure 13B:
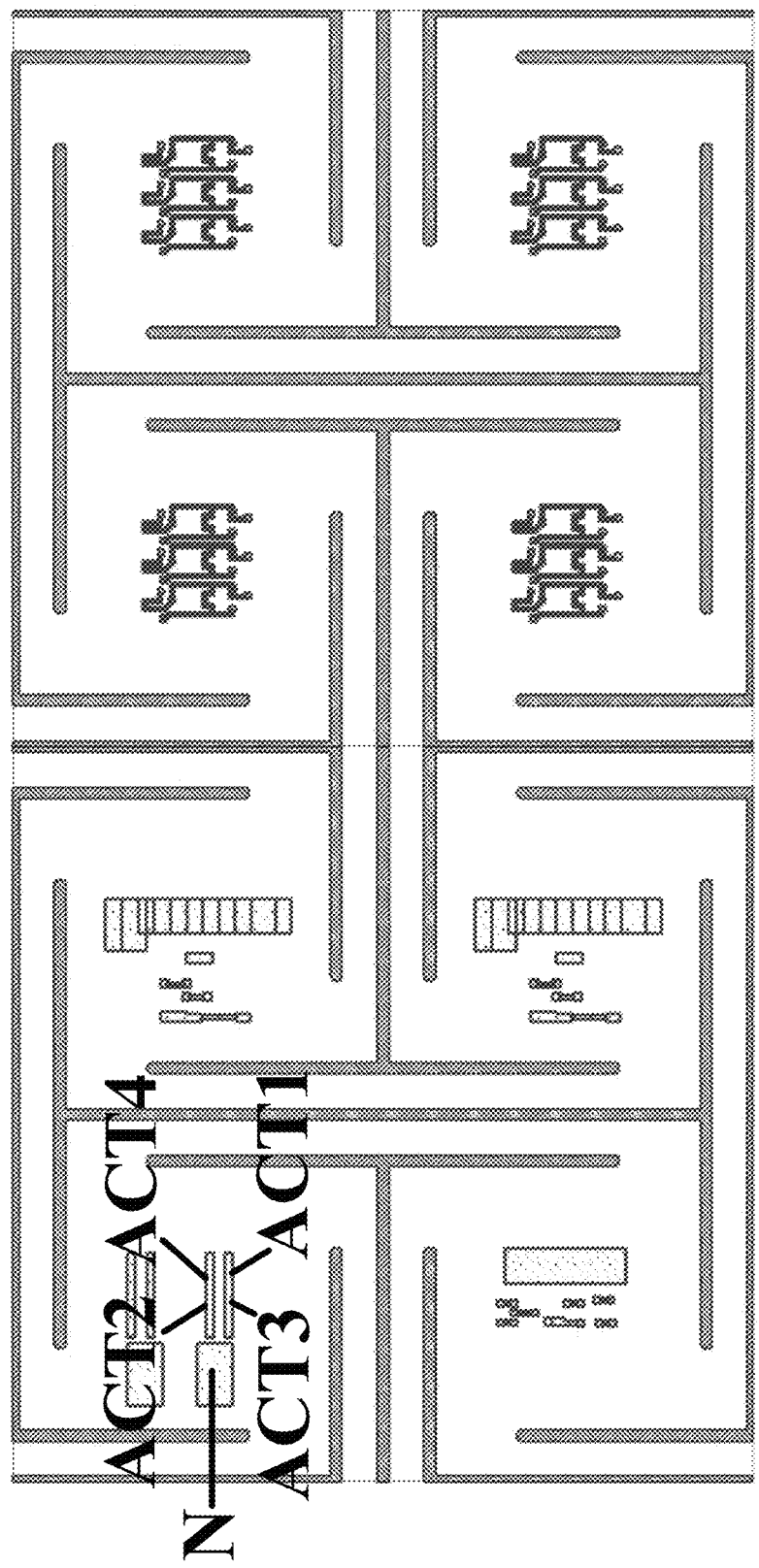
FIG. 13B illustrate the structure of a semiconductor material layer in the portion of the display substrate depicted in FIG. 13A.
Figure 13C:
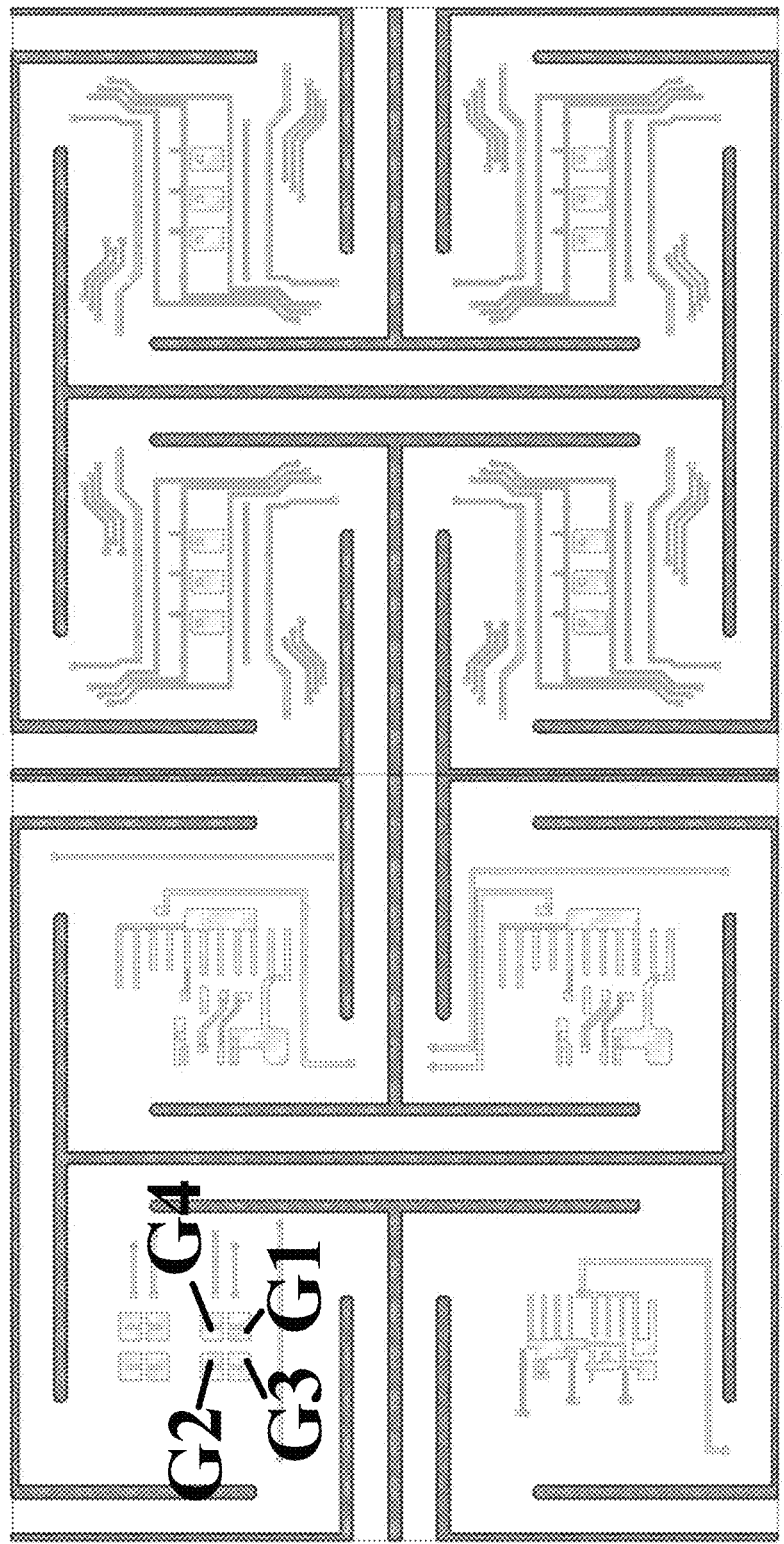
FIG. 13C illustrate the structure of a first conductive layer in the portion of the display substrate depicted in FIG. 13A.
Figure 13D:
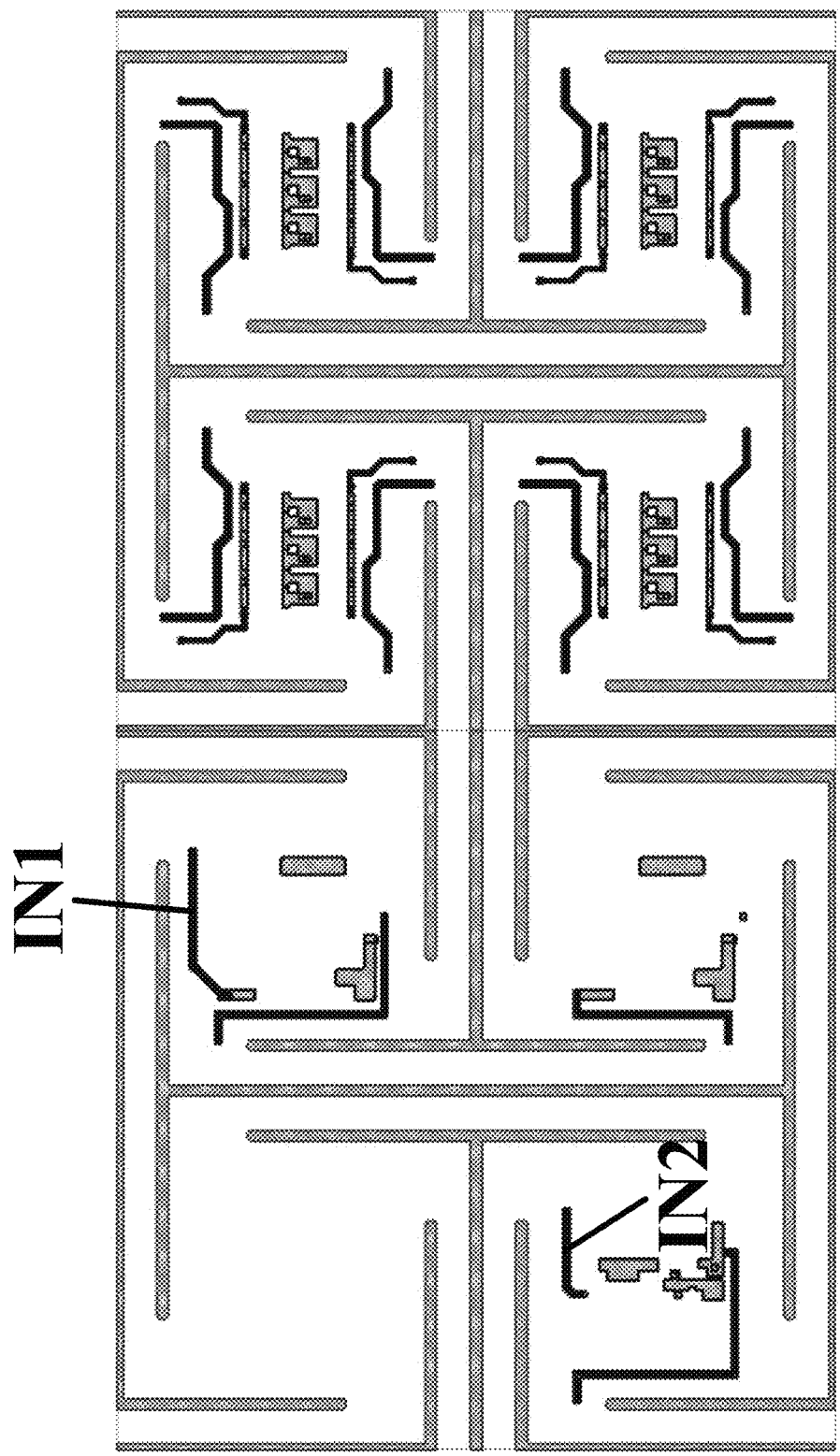
FIG. 13D illustrate the structure of a second conductive layer in the portion of the display substrate depicted in FIG. 13A.
Figure 13E:
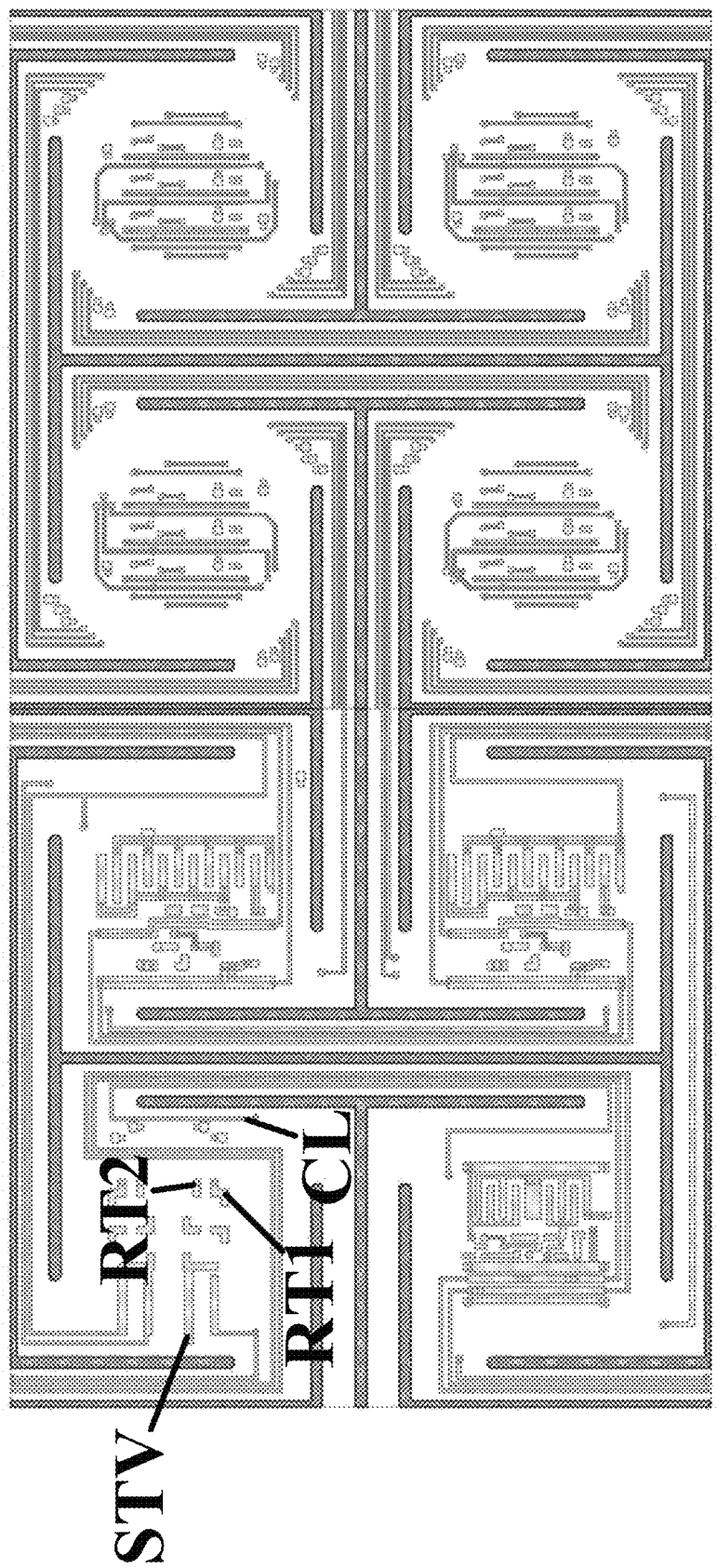
FIG. 13E illustrate the structure of a first signal line layer in the portion of the display substrate depicted in FIG. 13A.
Figure 13F:
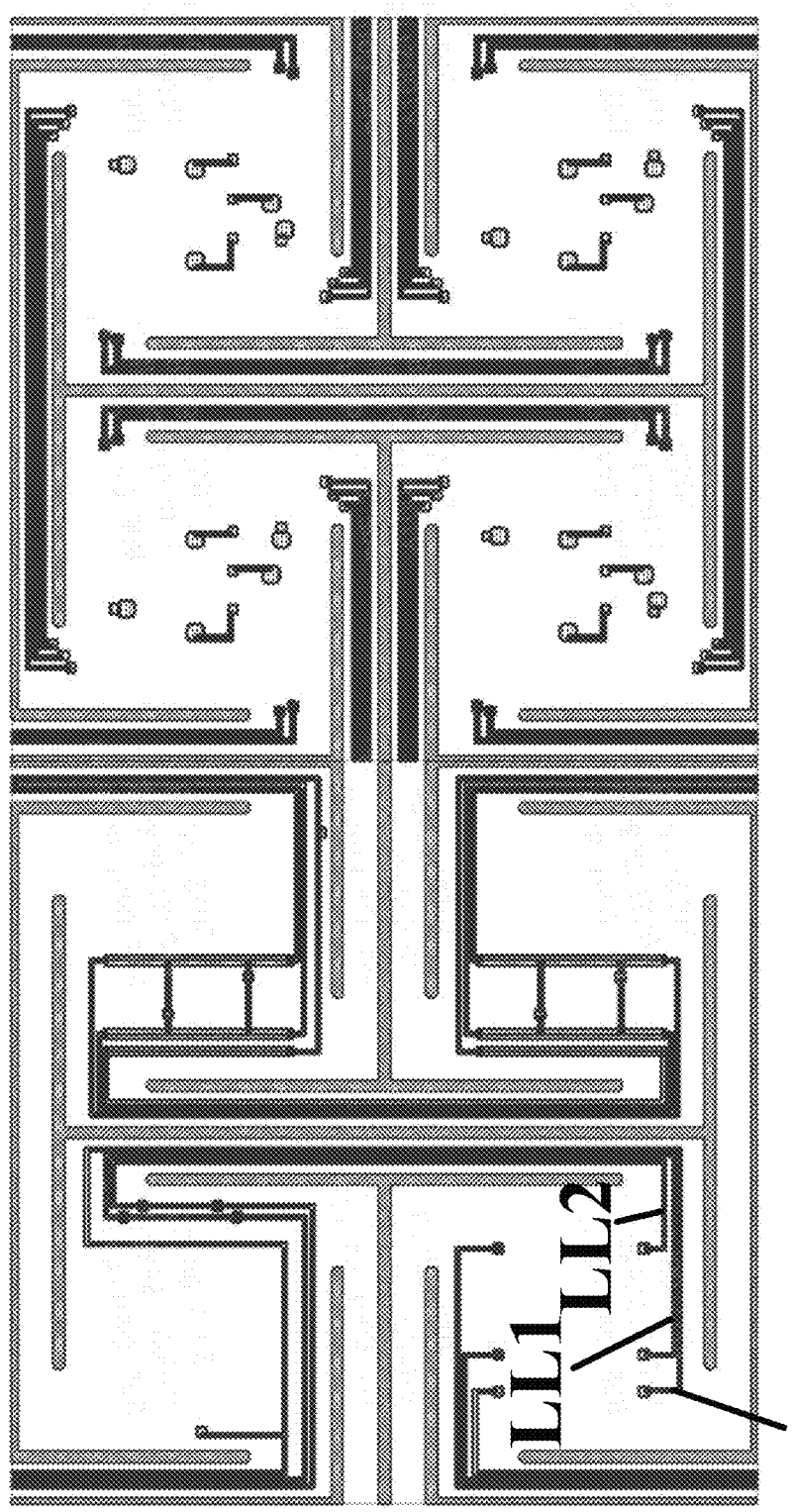
FIG. 13F illustrate the structure of a second signal line layer in the portion of the display substrate depicted in FIG. 13A.
Figure 13G:
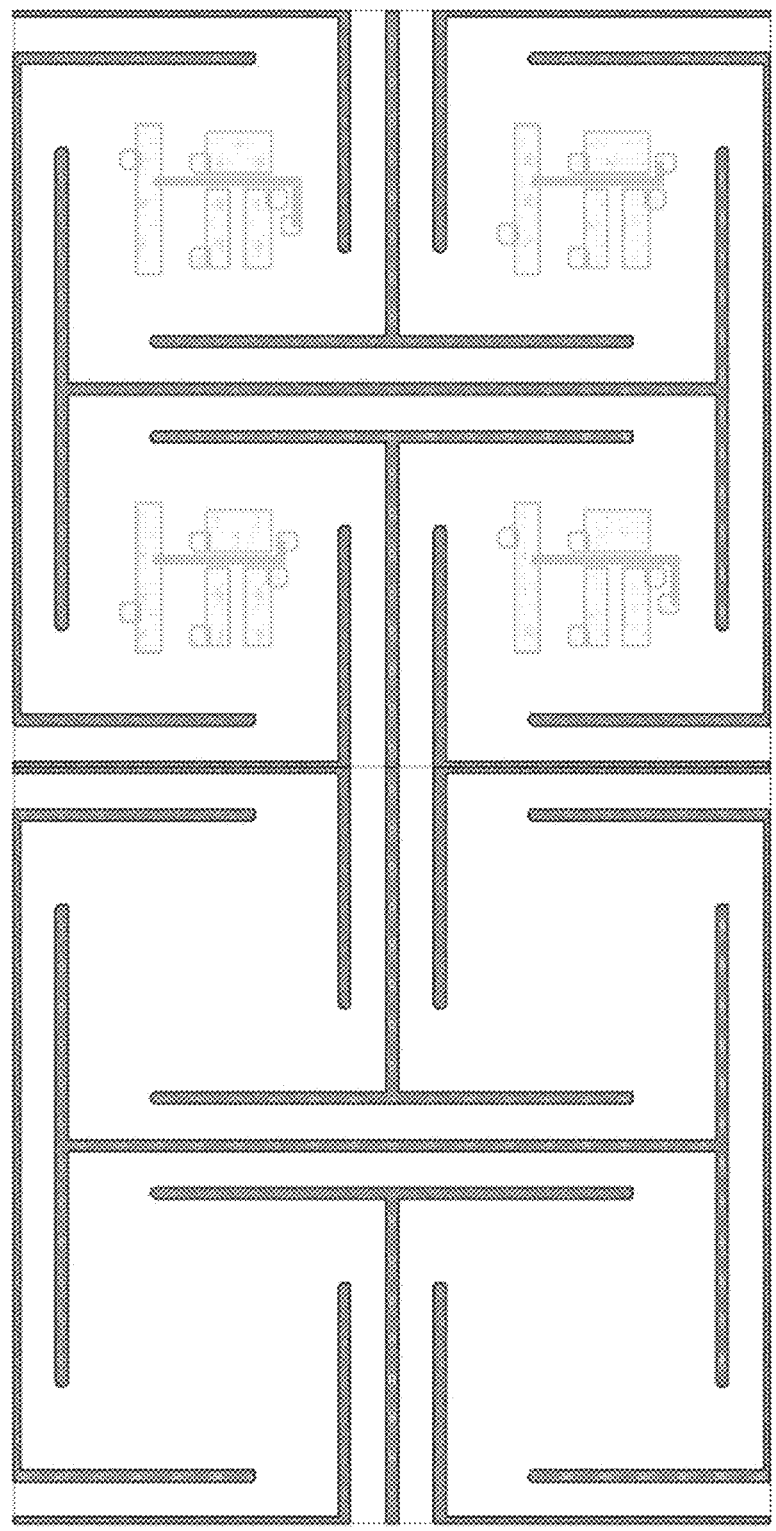
FIG. 13G illustrate the structure of an anode material layer in the portion of the display substrate depicted in FIG. 13A.

In some embodiments, the electrostatic discharge protection circuit is in a respective first island of the plurality of islands Is; a $1^{st}$ scan unit of a first scan circuit SC1 is in a respective second island of the plurality of islands Is; and a $1^{st}$ scan unit of a second scan circuit SC2 is in a respective third island of the plurality of islands Is. FIG. 13A is a schematic diagram illustrating a portion of a display substrate having an electrostatic discharge protection circuit in some embodiments according to the present disclosure. FIG. 13B illustrate the structure of a semiconductor material layer in the portion of the display substrate depicted in FIG. 13A. FIG. 13C illustrate the structure of a first conductive layer in the portion of the display substrate depicted in FIG. 13A. FIG. 13D illustrate the structure of a second conductive layer in the portion of the display substrate depicted in FIG. 13A. FIG. 13E illustrate the structure of a first signal line layer in the portion of the display substrate depicted in FIG. 13A. FIG. 13F illustrate the structure of a second signal line layer in the portion of the display substrate depicted in FIG. 13A. FIG. 13G illustrate the structure of an anode material layer in the portion of the display substrate depicted in FIG. 13A.

Referring to FIG. 13A to FIG. 13G, the display substrate in some embodiments includes a display area DA and a peripheral area PA. In the peripheral area PA, the display substrate includes a plurality of islands Is, a plurality of bridges Br connecting the plurality of islands Is, and a plurality of gaps G at least partially extending into the display substrate. Signal lines connecting to adjacent scan circuits of the one or more scan circuits are disposed in the plurality of bridges Br. One or more signal lines connecting the electrostatic discharge protection circuit and one or more adjacent scan units are disposed in the plurality of bridges Br. In some embodiments, the display substrate includes one or more scan circuits, e.g., a first scan circuit SC1 and a second scan circuit SC2. In one example, the first scan circuit SC1 is a light emitting control signal generating circuit configured to generate light emitting control signals for subpixels in a display substrate. In another example, the second scan circuit SC2 is a gate scanning signal generating circuit configured to generate gate scanning signals for subpixels in a display substrate. In one example depicted in FIG. 13A to FIG. 13G, the display substrate includes a first electrostatic discharge protection circuit ESD1 for protecting the first scan circuit SC1 from electrostatic discharge damage, and a second electrostatic discharge protection circuit ESD2 for protecting the second scan circuit SC2 from electrostatic discharge damage. The first electrostatic discharge protection circuit ESD1 and the second electrostatic discharge protection circuit ESD2 are in a same island of the plurality of islands Is.

Figure 14:
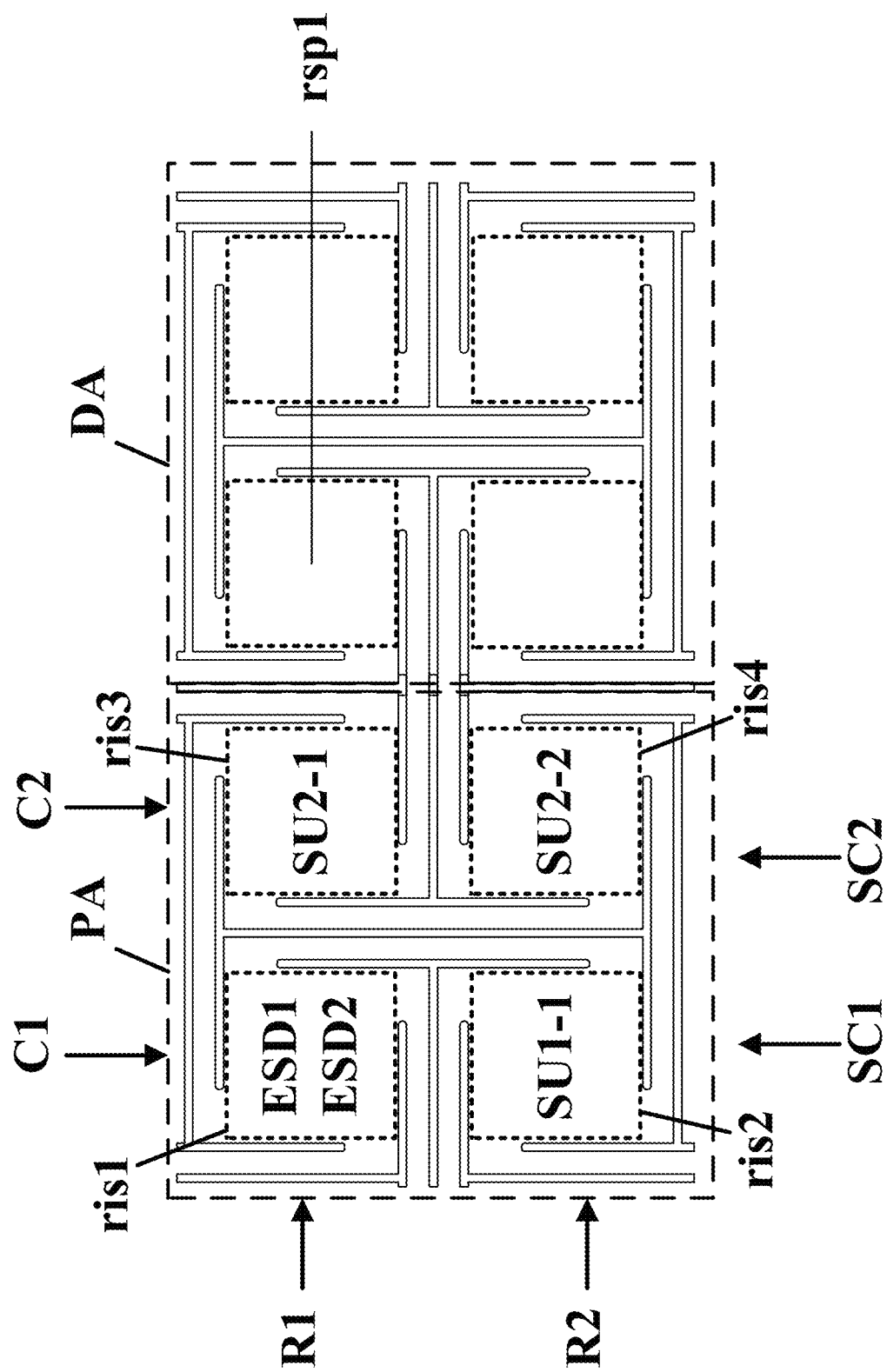
FIG. 14 is a schematic diagram illustrating a layout of a display substrate depicted in FIG. 13A.

FIG. 14 is a schematic diagram illustrating a layout of a display substrate depicted in FIG. 13A. Referring to FIG. 13A to FIG. 13G, and FIG. 14, the display substrate in the peripheral area includes two columns of scan units. A first column C1 of scan units are scan units of the first scan circuit SC1. A second column C2 of scan units are scan units of the second scan circuit SC2.

A same column (e.g., a first column C1) of islands of the plurality of islands Is includes a respective first island ris1 of the plurality of islands Is having a first electrostatic discharge protection circuit ESD1 for protecting the first scan circuit SC1 from electrostatic discharge damage, and a second electrostatic discharge protection circuit ESD2 for protecting the second scan circuit SC2 from electrostatic discharge damage; and a respective second island ris2 of the plurality of islands Is having a $1^{st}$ scan unit SU1-1 of a first scan circuit SC1.

A same row (e.g., a first row R1) of islands of the plurality of islands Is includes a respective first island ris1 of the plurality of islands Is having a first electrostatic discharge protection circuit ESD1 for protecting the first scan circuit SC1 from electrostatic discharge damage, and a second electrostatic discharge protection circuit ESD2 for protecting the second scan circuit SC2 from electrostatic discharge damage; and a respective third island ris3 of the plurality of islands Is having a $1^{st}$ scan unit SU2-1 of a second scan circuit SC2.

In one example, the display substrate in the peripheral area PA includes a respective first island ris1, a respective second island ris2, a respective third island ris3, and a respective fourth island ris4 arranged in rows and columns. The respective first island ris1 and the respective second island ris2 are arranged in a first column C1. The respective third island ris3 and the respective fourth island ris4 are arranged in a second column C2. The respective first island ris1 and the respective third island ris3 are arranged in a first row R1. The respective second island ris2 and the respective fourth island ris4 are arranged in a second row R2.

In some embodiments, the first electrostatic discharge protection circuit ESD1 and the second electrostatic discharge protection circuit ESD2 are at least partially in the respective first island ris1; the $1^{st}$ scan unit SU1-1 of the first scan circuit SC1 is at least partially in the respective second island ris2; the $1^{st}$ scan unit SU2-1 of the second scan circuit SC2 is at least partially in the respective third island ris3; and a $2^{nd}$ scan unit SU2-2 of the second scan circuit SC2 is at least partially in the respective fourth island ris4.

In some embodiments, the first scan circuit SC1 is a light emitting control signal generating circuit configured to generate light emitting control signals for subpixels in a display substrate; and the second scan circuit SC2 is a control signal generating circuit configured to generate gate scanning signals and reset control signals for subpixels in a display substrate. In one example, the $1^{st}$ scan unit SU1-1 of the first scan circuit SC1 is configured to provide a reset control signal to a first row of subpixels rsp1 in the display area DA. The first row R1 includes only a scan unit of the second scan circuit SC2, but does not include a scan unit of the first scan circuit SC1. The respective first island ris1 in the first row R1 and in the first column C1 is available for disposing the electrostatic discharge protection circuits.

In some embodiment, the electrostatic discharge protection circuit is electrically connected to an input terminal of a $1^{st}$ scan unit of a scan circuit. As shown in FIG. 13A to FIG. 13G, the first electrostatic discharge protection circuit ESD1 is electrically connected to a first input terminal IN1 of a $1^{st}$ scan unit of the first scan circuit SC1. The second electrostatic discharge protection circuit ESD2 is electrically connected to a second input terminal IN2 of a $1^{st}$ scan unit of the second scan circuit SC2.

Referring to FIG. 6B, and FIG. 13A to FIG. 13G, the electrostatic discharge protection circuit in the semiconductor material layer includes active layers (ACT1, ACT2, ACT3, and ACT4) of the first transistor M1, the second transistor M2, the third transistor M3, and the fourth transistor M4. The electrostatic discharge protection circuit in the semiconductor material layer further includes the node N that is electrically connected to a start signal terminal STV, and is electrically connected between the second transistor M2 and the third transistor M3.

Referring to FIG. 6B, and FIG. 13A to FIG. 13G, the electrostatic discharge protection circuit in the first conductive layer includes gate electrodes (G1, G2, G3, and G4) of the first transistor M1, the second transistor M2, the third transistor M3, and the fourth transistor M4.

Referring to FIG. 6B, and FIG. 13A to FIG. 13G, the electrostatic discharge protection circuit in the first signal line layer includes the first reference voltage terminal RT1 electrically connected to the first electrode and the gate electrode of the first transistor, the second reference voltage terminal RT2 electrically connected to the second electrode of the fourth transistor M4, the start signal terminal STV, and a connecting line CL connecting the node N to an input terminal of a $1^{st}$ scan unit of a scan circuit.

Referring to FIG. 6B, and FIG. 13A to FIG. 13G, the electrostatic discharge protection circuit in the second signal line layer includes a start signal lead line SSLL, a first lead line LL1, and a second lead line LL2. The start signal lead line SSLL electrically connects the start signal terminal to a start signal line in the scan circuit. The first lead line LL1 electrically connects the first reference voltage terminal RT1 to a first reference signal line in the scan circuit. The second lead line LL2 electrically connects the second reference voltage terminal RT2 to a second reference signal line in the scan circuit.

Referring to FIG. 13A to FIG. 13G, in some embodiments, the connecting line CL extends from a respective first island of the plurality of islands Is having an electrostatic discharge protection circuit (e.g., ESD1 or ESD2) to a respective second island of the plurality of islands Is having at least one scan unit of the one or more scan circuits (e.g., SC1 or SC2). The connecting line CL at least partially extending through an individual bridge of the plurality of bridges Br connecting the respective first island and the respective second island.

Referring to FIG. 13A to FIG. 13G, in some embodiments, the start signal lead line SSLL extends from a respective first island of the plurality of islands Is having an electrostatic discharge protection circuit (e.g., ESD1 or ESD2) to a respective second island of the plurality of islands Is having at least one scan unit of the one or more scan circuits (e.g., SC1 or SC2). The start signal lead line SSLL at least partially extending through an individual bridge of the plurality of bridges Br connecting the respective first island and the respective second island.

Referring to FIG. 13A to FIG. 13G, in some embodiments, the first lead line LL1 extends from a respective first island of the plurality of islands Is having an electrostatic discharge protection circuit (e.g., ESD1 or ESD2) to a respective second island of the plurality of islands Is having at least one scan unit of the one or more scan circuits (e.g., SC1 or SC2). The first lead line LL1 at least partially extending through an individual bridge of the plurality of bridges Br connecting the respective first island and the respective second island.

Referring to FIG. 13A to FIG. 13G, in some embodiments, the second lead line LL2 extends from a respective first island of the plurality of islands Is having an electrostatic discharge protection circuit (e.g., ESD1 or ESD2) to a respective second island of the plurality of islands Is having at least one scan unit of the one or more scan circuits (e.g., SC1 or SC2). The second lead line LL2 at least partially extending through an individual bridge of the plurality of bridges Br connecting the respective first island and the respective second island.

In the example depicted in FIG. 13A to FIG. 13G, and FIG. 14, the second scan circuit SC2 is a control signal generating circuit configured to generate gate scanning signals and reset control signals for subpixels in a display substrate, for example, an integrated scan circuit for generating both gate scanning signals and reset control signals. Various alternative layouts of the electrostatic discharge protection circuit may be implemented according to the present disclosure. In one alternative example, the display substrate includes a gate scanning signal generating circuit and a reset control signal generating circuit that are separate circuits, the electrostatic discharge protection circuits in this case may be implemented according to other embodiments according to the present disclosure, e.g., those depicted in FIG. 8A to FIG. 8G, or FIG. 11A to FIG. 11G.

Figure 15:
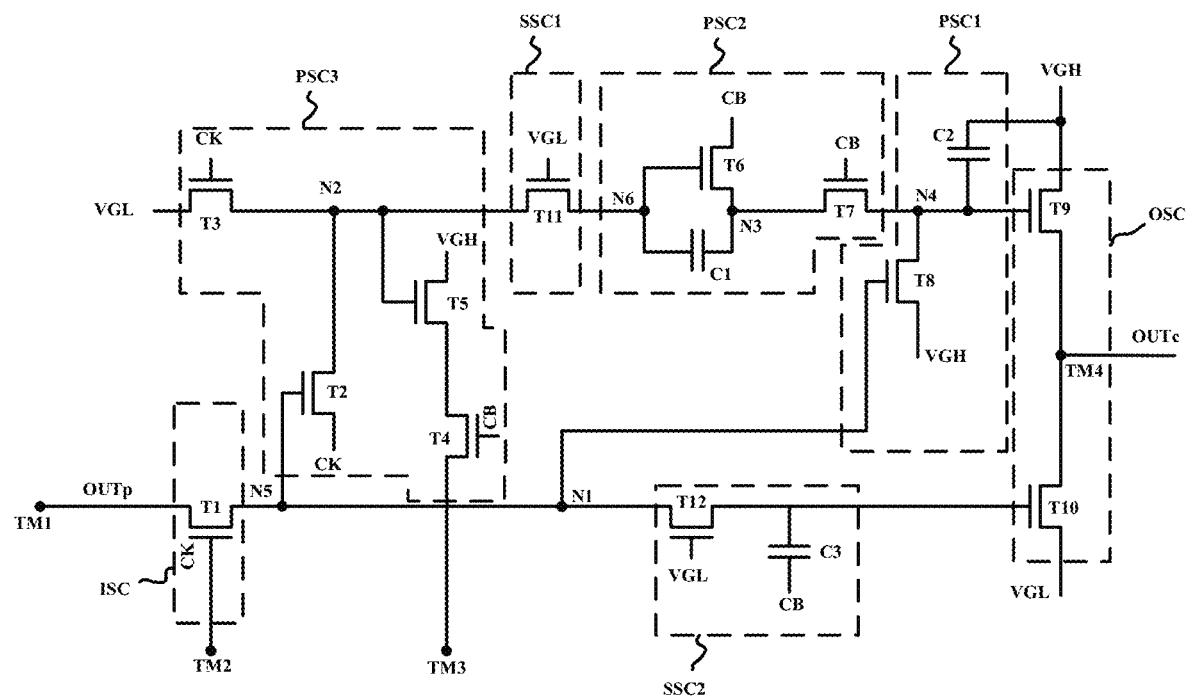
FIG. 15 is a circuit diagram of a respective scan unit of a scan circuit in some embodiments according to the present disclosure.

Various appropriate scan circuits may be used in the present disclosure. FIG. 15 is a circuit diagram of a respective scan unit of a scan circuit in some embodiments according to the present disclosure. Referring to FIG. 15, the respective scan unit in some embodiments includes an input subcircuit ISC, an output subcircuit OSC, a first processing subcircuit PSC1, a second processing subcircuit PSC2, a third processing subcircuit PSC3, a first stabilizing subcircuit SSC1, and a second stabilizing subcircuit SSC2. A respective scan unit may be configured to transmit control signals to one or more rows of subpixels. In one example, the respective scan unit is configured to transmit control signals to a single row of subpixels. In another example, the respective scan unit is configured to transmit control signals to two or more rows of subpixels.

In some embodiments, the output subcircuit OSC is configured to supply the voltage of a first power supply VGH or a second power supply VGL to an output terminal TM4 in response to voltages of a fourth node N4 and a first node N1. Optionally, the output subcircuit OSC includes a ninth transistor T9 and a tenth transistor T10.

The ninth transistor T9 is coupled between a first power supply VGH and the output terminal TM4. A gate electrode of the ninth transistor T9 is coupled to the fourth node N4. The ninth transistor T9 may be turned on or off depending on the voltage of the fourth node N4. Optionally, when the ninth transistor T9 is turned on, the voltage of the first power supply VGH is provided to the output terminal TM4, which (annotated as Outc in FIG. 15) may be transmitted to an n-th gate line and used as a gate driving signal having a gate-on level.

The tenth transistor T10 is coupled between the output terminal TM4 and a second power supply VGL. A gate electrode of the tenth transistor T10 is coupled to the first node N1. The tenth transistor T10 may be turned on or off depending on the voltage of the first node N1. Optionally, when the tenth transistor T10 is turned on, the voltage of the second power supply VGL is provided to the output terminal TM4, which (annotated as Outc in FIG. 15) may be provided to an n-th gate line and used as a gate driving signal having a gate-off level. In one example, when the gate driving signal has a gate-off level, it may be understood that the gate driving signal is not provided.

In some embodiments, the input subcircuit ISC is configured to control the voltages of the first node N1 and a fifth node N5 in response to signals provided to the first input terminal TM1 and the second input terminal TM2, respectively. Optionally, the input subcircuit ISC includes a first transistor T1.

The first transistor T1 is coupled between the first input terminal TM1 and the fifth node N5. A gate electrode of the first transistor T1 is coupled to the second input terminal TM2. When the first clock signal CK is provided to the second input terminal TM2, the first transistor T1 is turned on to electrically couple the first input terminal TM1 with the fifth node N5.

In some embodiments, the first processing subcircuit PSC1 is configured to control the voltage of the fourth node N4 in response to the voltages of the first node N1 and the fifth node N5. Optionally, the first processing subcircuit PSC1 includes an eighth transistor T8 and a second capacitor C2.

The eighth transistor T8 is coupled between the first power supply VGH and the fourth node N4. A gate electrode of the eighth transistor T8 is coupled to the fifth node N5. The eighth transistor T8 may be turned on or off depending on the voltage of the fifth node N5. Optionally, when the eighth transistor T8 is turned on, the voltage of the first power supply VGH may be provided to the fourth node N4.

The second capacitor C2 is coupled between the first power supply VGH and the fourth node N4. Optionally, the second capacitor C2 is configured to charge a voltage to be applied to the fourth node N4. Optionally, the second capacitor C2 is configured to stably maintain the voltage of the fourth node N4.

In some embodiments, the second processing subcircuit PSC2 is coupled to a sixth node N6, and is configured to control the voltage of the fourth node N4 in response to a signal input to the third input terminal TM3. Optionally, the second processing subcircuit PSC2 includes a sixth transistor T6, a seventh transistor T7, and a first capacitor C1.

A first terminal of the first capacitor C1 is coupled to the sixth node N6, and a second terminal of the first capacitor C1 is coupled to a third node N3 that is a common node between the sixth transistor T6 and the seventh transistor T7.

The sixth transistor T6 is coupled between the third node N3 and the sixth node N6. A gate electrode of the sixth transistor T6 is coupled to the sixth node N6. The sixth transistor T6 may be turned on depending on the voltage of the sixth node N6 so that a voltage corresponding to the second clock signal CB provided to the third input terminal TM3 may be applied to the third node N3.

The seventh transistor T7 is coupled between the fourth node N4 and the third node N3. A gate electrode of the seventh transistor T7 is coupled to the third input terminal TM3. The seventh transistor T7 may be turned on in response to the second clock signal CB provided to the third input terminal TM3, and thus, applies the voltage of the first power supply VGH to the third node N3.

In some embodiments, the third processing subcircuit PSC3 is configured to control the voltage of the second node N2. Optionally, the third processing subcircuit PSC3 includes a second transistor T2, a third transistor T3, a fourth transistor T4, and a fifth transistor T5.

The fifth transistor T5 is coupled between the first power supply VGH and the fourth transistor T4. A gate electrode of the fifth transistor T5 is coupled to the second node N2. The fifth transistor T5 may be turned on or off depending on the voltage of the second node N2.

The fourth transistor T4 is coupled between the fifth transistor T5 and the third input terminal TM3. A gate electrode of the fourth transistor T4 is configured to be provided with the second clock signal CB provided to the third input terminal TM3.

The second transistor T2 is coupled between the second node N2 and the second input terminal TM2. A gate electrode of the second transistor T2 is coupled to the fifth node N5.

The third transistor T3 is coupled between the second node N2 and the second power supply VGL. A gate electrode of the third transistor T3 is coupled to the second input terminal TM2. When the first clock signal CK is provided to the second input terminal TM2, the third transistor T3 may be turned on so that the voltage of the second power supply VGL may be provided to the second node N2.

In some embodiments, the first stabilizing subcircuit SSC1 is coupled between the second processing subcircuit PSC2 and the third processing subcircuit PSC3. Optionally, the first stabilizing subcircuit SSC1 is configured to limit a voltage drop width of the second node N2. Optionally, the first stabilizing subcircuit SSC1 includes an eleventh transistor T11.

The eleventh transistor T11 is coupled between the second node N2 and the sixth node N6. A gate electrode of the eleventh transistor T11 is coupled to the second power supply VGL. Since the second power supply VGL has a gate-on level voltage, the eleventh transistor T11 may always remain turned on. Therefore, the second node N2 and the sixth node N6 may be maintained at the same voltage, and operated as substantially the same node.

In some embodiments, the second stabilizing subcircuit SSC2 is coupled between the first node N1 and the output subcircuit OSC. Optionally, the second stabilizing subcircuit SSC2 is configured to limit a voltage drop width of the first node N1. Optionally, the second stabilizing subcircuit SSC2 includes a twelfth transistor T12 and a third capacitor C3.

The twelfth transistor T12 is coupled between the first node N1 and a gate electrode of the tenth transistor T10. A gate electrode of the twelfth transistor T12 is coupled to the second power supply VGL. Since the second power supply VGL has a gate-on level voltage, the twelfth transistor T12 may always remain turned on. Therefore, the first node N1 and the gate electrode of the tenth transistor T10 may be maintained at the same voltage.

A first electrode of the third capacitor C3 is coupled to the gate electrode of the tenth transistor T10, and a second electrode of the third capacitor C3 is configured to be provided with the second clock signal CB provided to the third input terminal TM3.

In some embodiments, each of the first to twelfth transistors T1 to T12 may be formed of a p-type transistor. In some embodiments, the gate-on voltage of the first to twelfth transistors T1 to T12 may be set to a low level, and the gate-off voltage thereof may be set to a high level.

Figure 16:
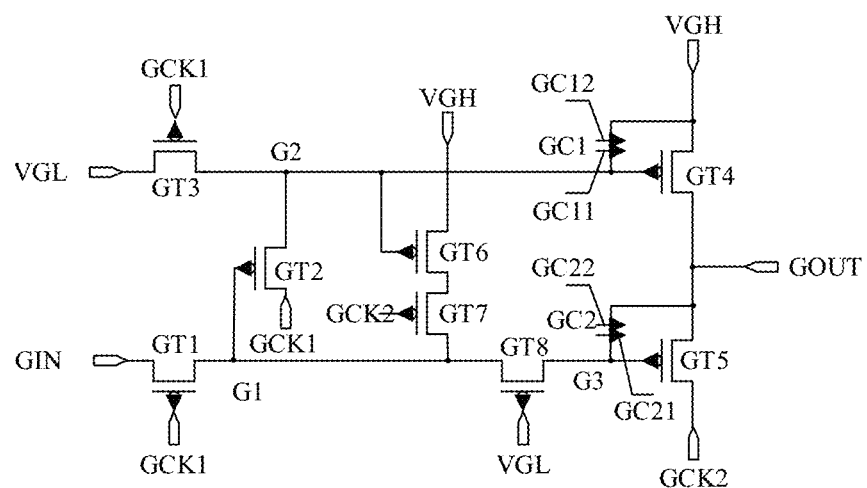
FIG. 16 is a circuit diagram of a respective scan unit of a scan circuit in some embodiments according to the present disclosure.

FIG. 16 is a circuit diagram of a respective scan unit of a scan circuit in some embodiments according to the present disclosure. Referring to FIG. 16, the respective scan unit includes a first control transistor GT1 to an eighth control transistor GT8, a first control capacitor GC1 and a second control capacitor GC2. In some embodiments, a gate electrode of the first control transistor GT1 is electrically connected to a first clock signal terminal GCK1, a first electrode of the first control transistor GT1 is electrically connected to an input terminal GIN, a second electrode of the first control transistor GT1 is electrically connected to a first node G1; a gate electrode of the second control transistor GT2 is electrically connected to the first node G1, a first electrode of the second control transistor GT2 is electrically connected to the first clock signal terminal GCK1, the second electrode of the second control transistor GT2 is electrically connected to a second node G2; a gate electrode of the third control transistor GT3 is electrically connected to a first clock signal terminal GCK1, a first electrode of the third control transistor GT3 is electrically connected to a second power supply VGL, a second electrode of the third control transistor GT3 is electrically connected to the second node G2; a gate electrode of the fourth control transistor GT4 is electrically connected to the second node G2, a first electrode of the fourth control transistor GT4 is electrically connected to a first power supply VGH, a second electrode of the fourth control transistor GT4 is electrically connected to an output terminal GOUT; a gate electrode of the fifth control transistor GT5 is electrically connected to a third node G3, a first electrode of the fifth control transistor GT5 is electrically connected to a second clock signal terminal GCK2, a second electrode of the fifth control transistor GT5 is electrically connected to the output terminal GOUT; a gate electrode of the sixth control transistor GT6 is electrically connected to the second node G2, a first electrode of the sixth control transistor GT6 is electrically connected to the first power supply VGH, a second electrode of the sixth control transistor GT6 is electrically connected to a first electrode of a seventh control transistor GT7; a gate electrode of the seventh control transistor GT7 is electrically connected to the second clock signal terminal GCK2, a second electrode of the seventh control transistor GT7 is electrically connected to the first node G1; a gate electrode of the eighth control transistor GT8 is electrically connected to a second power supply VGL, a first electrode of the eighth control transistor GT8 is electrically connected to the first node G1, a second electrode of the eighth control transistor GT8 is electrically connected to a third node G3; a first electrode plate GC11 of a first control capacitor GC1 is electrically connected to the second node G2, a second electrode plate GC12 of the first control capacitor GC1 is electrically connected to the first power supply VGH; and a first electrode plate GC21 of a second control capacitor GC2 is electrically connected to the third node G3, and a second electrode plate GC22 of the second control capacitor GC2 is electrically connected to the output terminal GOUT. In one example, the first control transistor GT1 to the eighth control transistor GT8 may be a P-type transistor or may be an N-type transistor. In another example, the first power supply VGH provides a continuous high level signal and the second power supply VGL provides a continuous low level signal.

In some embodiments, the first power supply VGH may be used as the first reference voltage signal REF1 denoted in FIG. 5, and the second power supply VGL may be used as the second reference voltage signal REF2 denoted in FIG. 5.

Figure 17A:
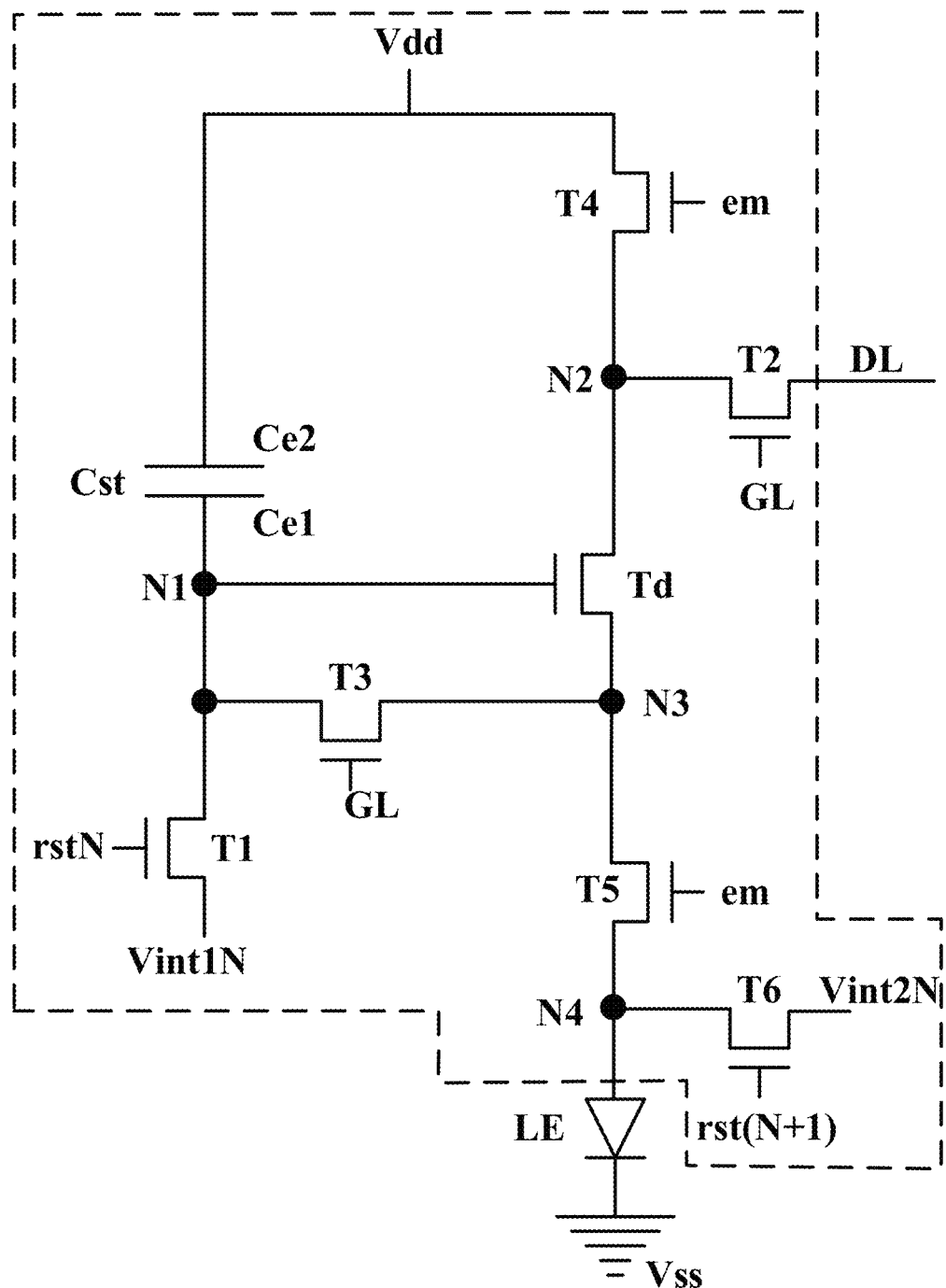
FIG. 17A is a circuit diagram illustrating the structure of a pixel driving circuit in some embodiments according to the present disclosure.

Various appropriate pixel driving circuits may be used for driving light emission in the display elements in the display area. FIG. 17A is a circuit diagram illustrating the structure of a pixel driving circuit in some embodiments according to the present disclosure. Referring to FIG. 17A, in some embodiments, the respective pixel driving circuit includes a driving transistor Td; a storage capacitor Cst having a first capacitor electrode Ce1 and a second capacitor electrode Ce2; a first transistor T1 having a gate electrode connected to a respective reset control signal line rstN in a present stage (or a present row) of a plurality of reset control signal lines, a source electrode connected to a respective first reset signal line VintIN in a present stage (or a present row) of a plurality of first reset signal lines, and a drain electrode connected to a first capacitor electrode Ce1 of the storage capacitor Cst and a gate electrode of the driving transistor Td; a second transistor T2 having a gate electrode connected to a respective gate line of a plurality of gate lines GL, a source electrode connected to a respective data line of a plurality of data lines DL, and a drain electrode connected to a source electrode of the driving transistor Td; a third transistor T3 having a gate electrode connected to the respective gate line, a source electrode connected to the first capacitor electrode Ce1 of the storage capacitor Cst and the gate electrode of the driving transistor Td, and a drain electrode connected to a drain electrode of the driving transistor Td; a fourth transistor T4 having a gate electrode connected to a respective light emitting control signal line of a plurality of light emitting control signal lines em, a source electrode connected to a respective voltage supply line of a plurality of voltage supply lines Vdd, and a drain electrode connected to the source electrode of the driving transistor Td and the drain electrode of the second transistor T2; a fifth transistor T5 having a gate electrode connected to the respective light emitting control signal line, a source electrode connected to drain electrodes of the driving transistor Td and the third transistor T3, and a drain electrode connected to an anode of a light emitting element LE; and a sixth transistor T6 having a gate electrode connected to a respective reset control signal line rst(N+1) in a next adjacent stage (or a next adjacent row) of a plurality of reset control signal lines, a source electrode connected to a respective second reset signal line Vint2N in the present stage (or the present row)

of the plurality of second reset signal lines, and a drain electrode connected to the drain electrode of the fifth transistor and the anode of the light emitting element LE. The second capacitor electrode Ce2 is connected to the respective voltage supply line and the source electrode of the fourth transistor T4.

Figure 17B:
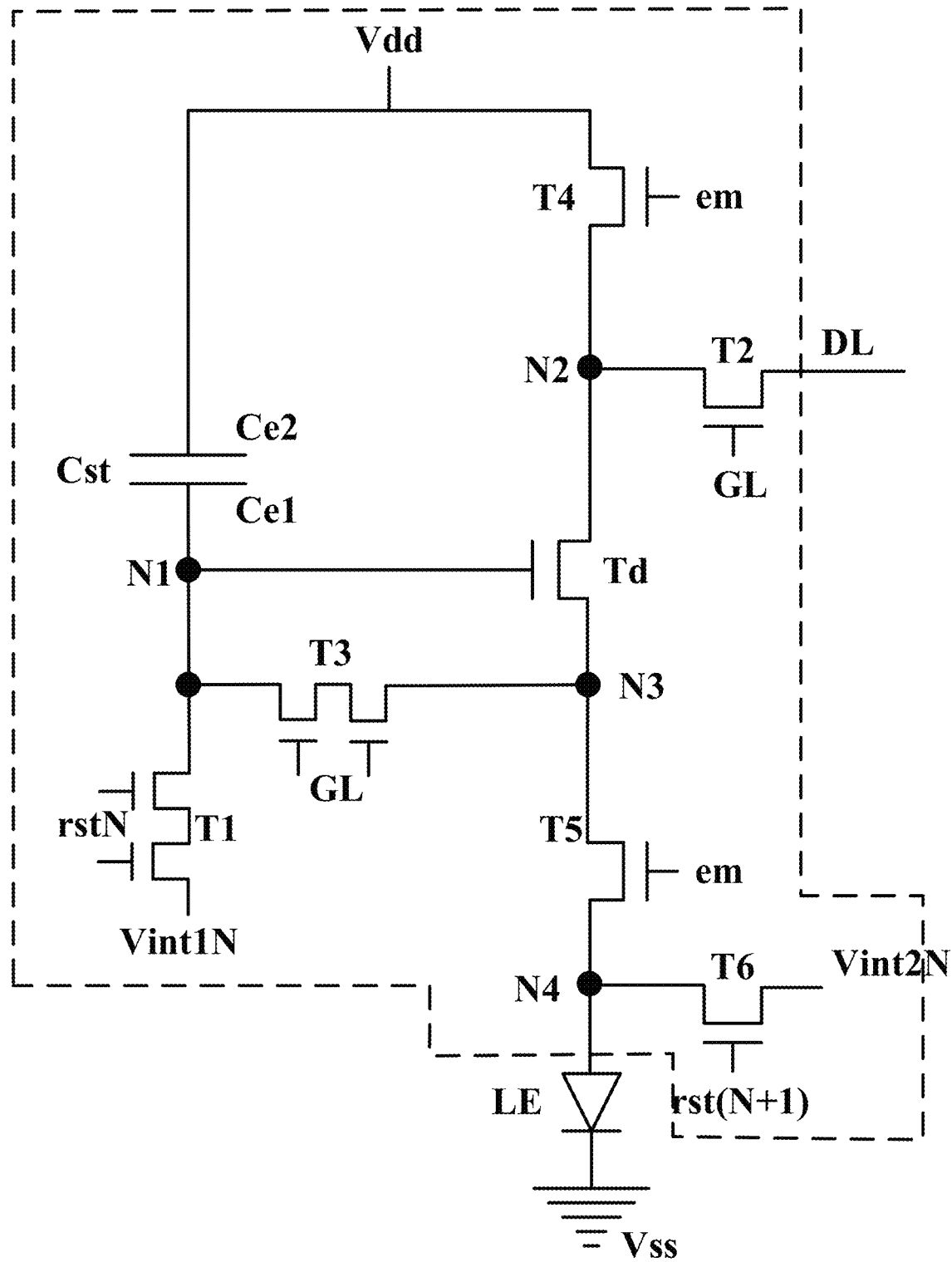
FIG. 17B is a circuit diagram illustrating the structure of a pixel driving circuit in some embodiments according to the present disclosure.

FIG. 17B is a circuit diagram illustrating the structure of a pixel driving circuit in some embodiments according to the present disclosure. Referring to FIG. 17B, in some embodiments, the third transistor T3 is a "double gate" transistor, and the first transistor T1 is a "double gate" transistor. Optionally, in a "double gate" first transistor, the active layer of the first transistor crosses over a respective reset control signal lines twice (alternatively, the respective reset control signal line crosses over the active layer of the first transistor T1 twice). Similarly, in a "double gate" third transistor, the active layer of the third transistor T3 crosses over a respective gate line of the plurality of gate lines GL twice (alternatively, the respective gate line crosses over the active layer of the third transistor T3 twice).

The pixel driving circuit further include a first node N1, a second node N2, a third node N3, and a fourth node N4. The first node N1 is connected to the gate electrode of the driving transistor Td, the first capacitor electrode Ce1, and the source electrode of the third transistor T3. The second node N2 is connected to the drain electrode of the fourth transistor T4, the drain electrode of the second transistor T2, and the source electrode of the driving transistor Td. The third node N3 is connected to the drain electrode of the driving transistor Td, the drain electrode of the third transistor T3, and the source electrode of the fifth transistor T5. The fourth node N4 is connected to the drain electrode of the fifth transistor T5, the drain electrode of the sixth transistor T6, and the anode of the light emitting element LE.

As used herein, a first electrode or a second electrode refers to one of a first terminal and a second terminal of a transistor, the first terminal and the second terminal being connected to an active layer of the transistor. A direction of a current flowing through the transistor may be configured to be from a first electrode to a second electrode, or from a second electrode to a first electrode. Accordingly, depending on the direction of the current flowing through the transistor, in one example, the first electrode is configured to receive an input signal and the second electrode is configured to output an output signal; in another example, the second electrode is configured to receive an input signal and the first electrode is configured to output an output signal.

Figure 18:
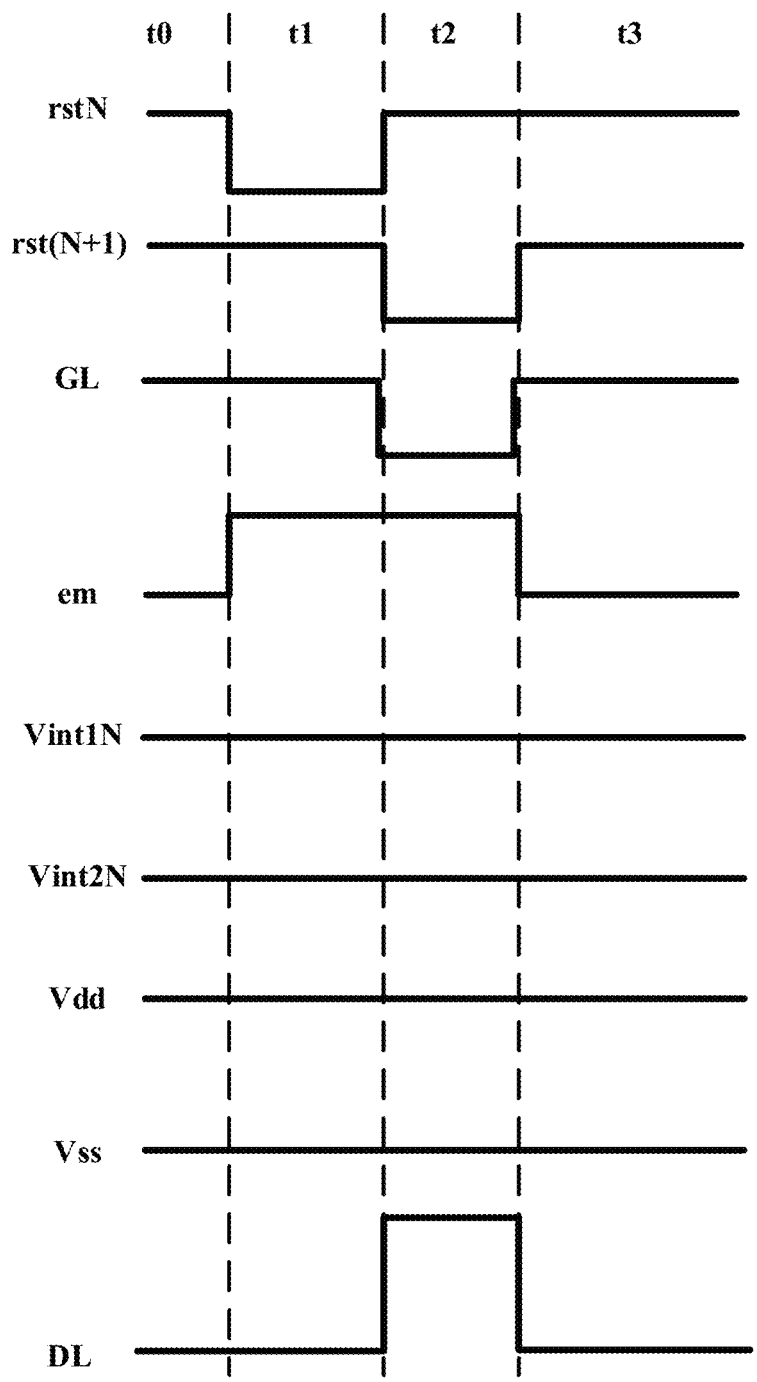
FIG. 18 is a timing diagram illustrating the operation of a pixel driving circuit in some embodiments according to the present disclosure.

FIG. 18 is a timing diagram illustrating the operation of a pixel driving circuit in some embodiments according to the present disclosure. Referring to FIG. 17A, FIG. 17B, and FIG. 18, during one frame of image, the operation of the pixel driving circuit includes a reset sub-phase t1, a data write sub-phase t2, and a light emitting sub-phase t3. In the initial sub-phase t0, a turning-off reset control signal is provided through the reset control signal line of a present stage rstN to the gate electrode of the first transistor T1 to turn off the first transistor T1. In the initial sub-phase t0, the gate line GL is provided with a turning-off signal, thus the second transistor T2 and the third transistor T3 are turned off.

In the reset sub-phase t1, a turning-on reset control signal is provided through the reset control signal line of a present stage rstN to the gate electrode of the first transistor T1 to turn on the first transistor T1; allowing an initialization voltage signal from the respective first reset signal line of a present stage VintlN to pass from a first electrode of the first transistor T1 to a second electrode of the first transistor T1, and in turn to the first capacitor electrode Ce1 and the gate electrode of the driving transistor Td. The gate electrode of the driving transistor Td is initialized. The second capacitor electrode Ce2 receives a high voltage signal from the respective voltage supply line of the plurality of voltage supply lines Vdd. The first capacitor electrode Ce1 is charged in the reset sub-phase t1 due to an increasing voltage difference between the first capacitor electrode Ce1 and the second capacitor electrode Ce2. In the reset sub-phase t1, the respective gate line of the plurality of gate lines GL is provided with a turning-off signal, thus the second transistor T2 and the third transistor T3 are turned off. The respective light emitting control signal line of the plurality of light emitting control signal lines em is provided with a high voltage signal to turn off the fourth transistor T4 and the fifth transistor T5.

In the data write sub-phase t2, the turning-off reset control signal is again provided through the reset control signal line of a present stage rstN to the gate electrode of the first transistor T1 to turn off the first transistor T1. The respective gate line of the plurality of gate lines GL is provided with a turning-on signal, thus the second transistor T2 and the third transistor T3 are turned on. A second electrode of the driving transistor Td is connected with the second electrode of the third transistor T3. A gate electrode of the driving transistor Td is electrically connected with the first electrode of the third transistor T3. Because the third transistor T3 is turned on in the data write sub-phase t2, the gate electrode and the second electrode of the driving transistor Td are connected and short circuited, and only the PN junction between the gate electrode and a first electrode of the driving transistor Td is effective, thus rendering the driving transistor Td in a diode connecting mode. The second transistor T2 is turned on in the data write sub-phase t2. The data voltage signal transmitted through the respective data line of a plurality of data lines DL is received by a first electrode of the second transistor T2, and in turn transmitted to the first electrode of the driving transistor Td, which is connected to the second electrode of the second transistor T2. A node N2 connecting to the first electrode of the driving transistor Td has a voltage level of the data voltage signal. Because only the PN junction between the gate electrode and a first electrode of the driving transistor Td is effective, the voltage level at the node N1 in the data write sub-phase t2 increase gradually to (Vdata+Vth), wherein the Vdata is the voltage level of the data voltage signal, and the Vth is the voltage level of the threshold voltage Th of the PN junction. The storage capacitor Cst is discharged because the voltage difference between the first capacitor electrode Ce1 and the second capacitor electrode Ce2 is reduced to a relatively small value. The respective light emitting control signal line of the plurality of light emitting control signal lines em is provided with a high voltage signal to turn off the fourth transistor T4 and the fifth transistor T5.

In the data write sub-phase t2, a turning-on reset control signal is provided through the respective reset control signal line rst (N+1) in a next adjacent stage to the gate electrode of the sixth transistor T6 to turn on the sixth transistor T6; allowing an initialization voltage signal from the respective second reset signal line of a present stage Vint2N to pass from a first electrode of the sixth transistor T6 to a second electrode of the sixth transistor T6; and in turn to the node N4. The anode of the light emitting element LE is initialized.

In the light emitting sub-phase t3, the turning-off reset control signal is again provided through the reset control signal line of a present stage rstN to the gate electrode of the first transistor T1 to turn off the first transistor T1. The respective gate line of the plurality of gate lines GL is provided with a turning-off signal, the second transistor T2 and the third transistor T3 are turned off. The respective light emitting control signal line of the plurality of light emitting control signal lines em is provided with a low voltage signal to turn on the fourth transistor T4 and the fifth transistor T5. The voltage level at the node N1 in the light emitting sub-phase t3 is maintained at (Vdata+Vth), the driving transistor Td is turned on by the voltage level, and working in the saturation area. A path is formed through the fourth transistor T4, the driving transistor Td, the fifth transistor T5, to the light emitting element LE. The driving transistor Td generates a driving current for driving the light emitting element LE to emit light. A voltage level at a node N3 connected to the second electrode of the driving transistor Td equals to a light emitting voltage of the light emitting element LE.

In another aspect, the present invention provides a display apparatus, including the display substrate described herein or fabricated by a method described herein, and one or more integrated circuits connected to the display substrate. Examples of appropriate display apparatuses include, but are not limited to, an electronic paper, a mobile phone, a tablet computer, a television, a monitor, a notebook computer, a digital album, a GPS, etc. Optionally, the display apparatus is an organic light emitting diode display apparatus. Optionally, the display apparatus is a micro light emitting diode display apparatus. Optionally, the display apparatus is a mini light emitting diode display apparatus.

Figure 19:
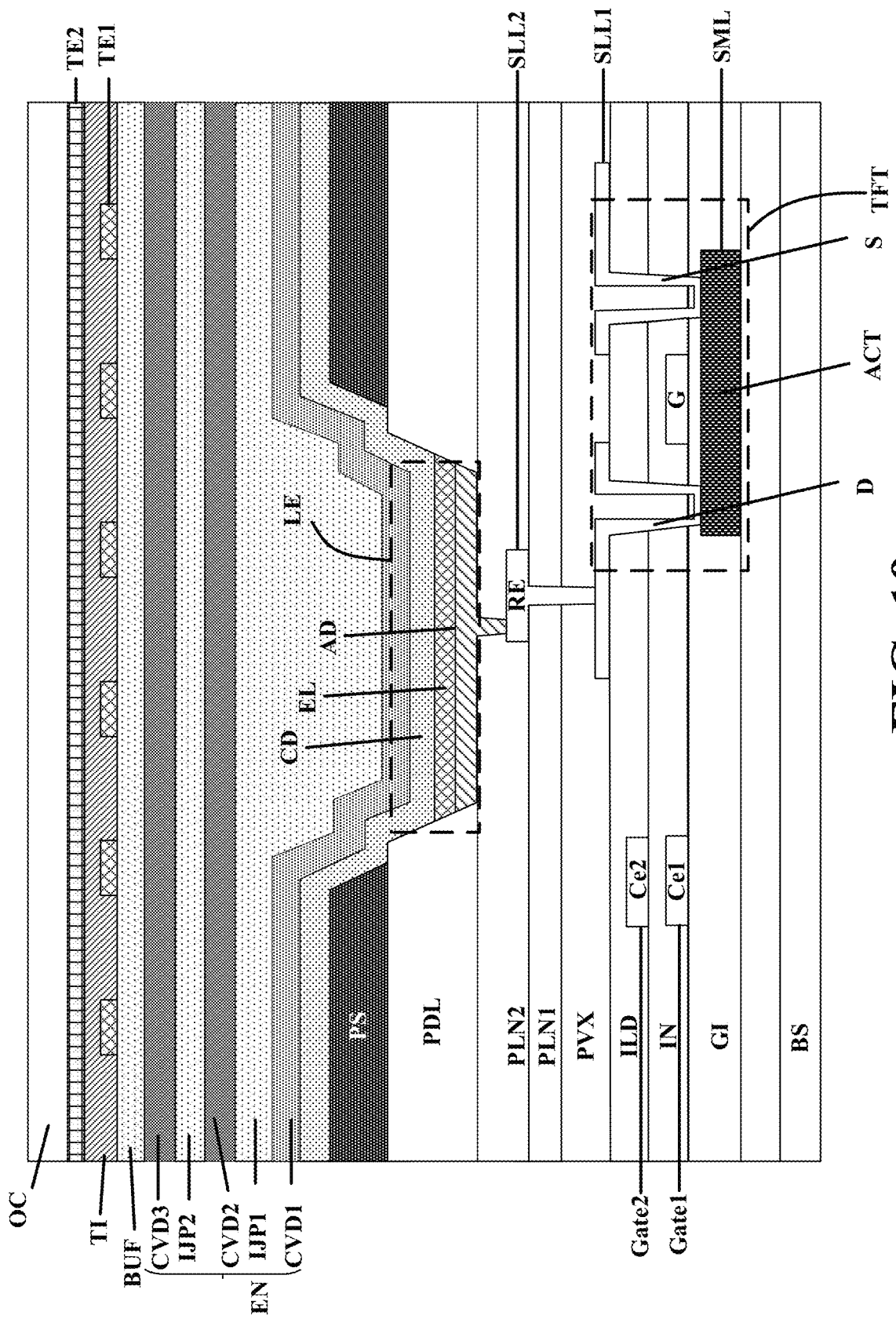
FIG. 19 illustrates a detailed structure in a display area in a display apparatus in some embodiments according to the present disclosure.

FIG. 19 illustrates a detailed structure in a display area in a display apparatus in some embodiments according to the present disclosure. Referring to FIG. 19, the display apparatus in the display area in some embodiments includes a base substrate BS (e.g., a flexible base substrate); an active layer ACT of a respective one of a plurality of thin film transistors TFT on the base substrate BS; a gate insulating layer GI on a side of the active layer ACT away from the base substrate BS; a gate electrode G and a first capacitor electrode Ce1 (both are parts of a first gate metal layer) on a side of the gate insulating layer GI away from the base substrate BS; an insulating layer IN on a side of the gate electrode G and the first capacitor electrode Ce1 away from the gate insulating layer GI; a second capacitor electrode Ce2 (a part of a second gate metal layer) on a side of the insulating layer IN away from the gate insulating layer GI; an inter-layer dielectric layer ILD on a side of the second capacitor electrode Ce2 away from the gate insulating layer GI; a source electrode S and a drain electrode D (parts of a first SD metal layer) on a side of the inter-layer dielectric layer ILD away from the gate insulating layer GI; a passivation layer PVX on a side of the source electrode S and the drain electrode D away from the inter-layer dielectric layer ILD; a first planarization layer PLN1 on a side of the passivation layer PVX away from the inter-layer dielectric layer ILD; a relay electrode RE (part of a second SD metal layer) on side of the first planarization layer PLN1 away from the passivation layer PVX; a second planarization layer PLN2 on a side of the relay electrode RE away from the first planarization layer PLN1; a pixel definition layer PDL defining a subpixel aperture and on a side of the second planarization layer PLN2 away from the base substrate BS; and a light emitting element LE in the subpixel aperture. The light emitting element LE includes an anode AD on a side of the second planarization layer PLN2 away from the first planarization layer PLN1; a light emitting layer EL on a side of the anode AD away from the second planarization layer PLN2; and a cathode layer CD on a side of the light emitting layer EL away from the anode AD. The display apparatus in the display area further includes an encapsulating layer EN encapsulating the light emitting element LE, and on a side of the cathode layer CD away from the base substrate BS.

The encapsulating layer EN in some embodiments includes a first inorganic encapsulating sub-layer CVD1 on a side of the cathode layer CD away from the base substrate BS, a first organic encapsulating sub-layer IJP1 on a side of the first inorganic encapsulating sub-layer CVD1 away from the base substrate BS, a second inorganic encapsulating sub-layer CVD2 on a side of the first organic encapsulating sub-layer IJP1 away from the base substrate BS, a second organic encapsulating sub-layer IJP2 on a side of the second inorganic encapsulating sub-layer CVD2 away from the base substrate BS, and a third inorganic encapsulating sub-layer CVD3 on a side of the second organic encapsulating sub-layer IJP2 away from the base substrate BS.

The display apparatus in the display area further includes a buffer layer BUF on a side of the encapsulating layer EN away from the base substrate BS; a first touch electrode layer TE1 on a side of the buffer layer BUF away from the encapsulating layer EN; a touch insulating layer T1 on a side of the first touch electrode layer TE1 away from the buffer layer BUF; a second touch electrode layer TE2 on a side of the touch insulating layer T1 away from the buffer layer BUF; and an overcoat layer OC on a side of the second touch electrode layer TE2 away from the touch insulating layer T1.

Referring to FIG. 19, the display apparatus includes a semiconductor material layer SML, a first gate metal layer Gate1, a second gate metal layer Gate2, a first signal line layer SLL1, and a second signal line layer SLL2. The display apparatus further includes an insulating layer IN between the first gate metal layer Gate1 and the second gate metal layer Gate2; an inter-layer dielectric layer ILD between the second gate metal layer Gate2 and the first signal line layer SLL1; and at least a passivation layer PVX or a planarization layer PLN between the first signal line layer SLL1 and the second signal line layer SLL2.

In another aspect, the present disclosure provides a method of fabricating a display substrate. In some embodiments, the method includes forming one or more scan circuits and forming one or more electrostatic discharge protection circuits in a peripheral area. Optionally, an electrostatic discharge protection circuit is configured to provide a start signal to a scan unit of a scan circuit. Optionally, the method comprises forming a plurality of islands and forming a plurality of bridges connecting the plurality of islands in the peripheral area. Optionally, forming a respective island of the plurality of islands includes forming at least one scan unit of the scan circuit. Optionally, one or more signal lines connecting the electrostatic discharge protection circuit and the scan unit is formed at least partially in an individual bridge connecting the electrostatic discharge protection circuit and the scan unit.

The foregoing description of the embodiments of the invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to explain the principles of the invention and its best mode practical application, thereby to enable persons skilled in the art to understand the invention for various embodiments and with various modifications as are suited to the particular use or implementation contemplated.

It is intended that the scope of the invention be defined by the claims appended hereto and their equivalents in which all terms are meant in their broadest reasonable sense unless otherwise indicated. Therefore, the term "the invention", "the present invention" or the like does not necessarily limit the claim scope to a specific embodiment, and the reference to exemplary embodiments of the invention does not imply a limitation on the invention, and no such limitation is to be inferred. The invention is limited only by the spirit and scope of the appended claims. Moreover, these claims may refer to use "first", "second", etc. following with noun or element. Such terms should be understood as a nomenclature and should not be construed as giving the limitation on the number of the elements modified by such nomenclature unless specific number has been given. Any advantages and benefits described may not apply to all embodiments of the invention. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. A display substrate, comprising one or more scan circuits and one or more electrostatic discharge protection circuits in a peripheral area;
    wherein an electrostatic discharge protection circuit is configured to provide a start signal to a scan unit of a scan circuit;
    wherein the display substrate comprises a plurality of islands and a plurality of bridges connecting the plurality of islands in the peripheral area;
    a respective island of the plurality of islands comprises at least one scan unit of the scan circuit; and
    one or more signal lines connecting the electrostatic discharge protection circuit and the scan unit is at least partially in an individual bridge connecting the electrostatic discharge protection circuit and the scan unit;
    wherein the electrostatic discharge protection circuit comprises:
    a first reference voltage terminal configured to receive a first reference voltage from the scan circuit;
    a second reference voltage terminal configured to receive a second reference voltage from the scan circuit;
    a node configured to output the start signal; and
    a connecting line connecting the node to an input terminal of the scan unit.

2. The display substrate of claim 1, wherein the connecting line at least partially extends through the individual bridge.

3. The display substrate of claim 1, wherein the first reference voltage terminal, the second reference voltage terminal, and the connecting line are in a first signal line layer; and
    the node is in a semiconductor material layer different from the first signal line layer.

4. The display substrate of claim 1, further comprising:
    a start signal lead line electrically connects a start signal terminal to a start signal line in the scan circuit;
    a first lead line electrically connecting the first reference voltage terminal to a first reference signal line in the scan circuit; and
    a second lead line electrically connecting the second reference voltage terminal to a second reference signal line in the scan circuit.

5. The display substrate of claim 4, wherein the start signal lead line, the first lead line, and the second lead line are at least partially in a second signal line layer.

6. The display substrate of claim 4, wherein the start signal lead line, the first lead line, and the second lead line at least partially extend through the individual bridge.

7. The display substrate of claim 1, wherein the electrostatic discharge protection circuit is in a respective first island of the plurality of islands;
    the scan unit is in a respective second island of the plurality of islands; and
    the respective first island and the respective second island are adjacent to each other.

8. The display substrate of claim 7, wherein the peripheral area includes a first sub-area on a first side of a display area, a second sub-area on a second side of the display area, a third sub-area on a third side of the display area, and a fourth sub-area on a fourth side of the display area;
    the electrostatic discharge protection circuit is in the third sub-area and/or the fourth sub-area;
    the display substrate is at least partially stretchable in the first sub-area, the second sub-area, the third sub-area, and the fourth sub-area.

9. The display substrate of claim 1, wherein the one or more scan circuits comprise a first scan circuit and a second scan circuit; and
    the one or more electrostatic discharge protection circuits comprise a first electrostatic discharge protection circuit and a second electrostatic discharge protection circuit.

10. The display substrate of claim 9, in the peripheral area, comprises a respective first island, a respective second island, a respective third island, and a respective fourth island arranged in rows and columns;
    the respective first island and the respective second island are arranged in a first column;
    the respective third island and the respective fourth island are arranged in a second column;
    the respective first island and the respective third island are arranged in a first row; and
    the respective second island and the respective fourth island are arranged in a second row.

11. The display substrate of claim 10, wherein the first electrostatic discharge protection circuit and the second electrostatic discharge protection circuit are at least partially in the respective first island;
    a $1^{st}$ scan unit of the first scan circuit is at least partially in the respective second island;
    a $1^{st}$ scan unit of the second scan circuit is at least partially in the respective third island; and
    a $2^{nd}$ scan unit of the second scan circuit is at least partially in the respective fourth island.

12. The display substrate of claim 11, wherein the second scan circuit is a control signal generating circuit configured to generate gate scanning signals and reset control signals for subpixels in a display substrate; and
    the $1^{st}$ scan unit of the second scan circuit is configured to provide a reset control signal to a first row of subpixels in a display area.

13. The display substrate of claim 1, wherein the first reference voltage is a high power supply voltage; and
    the second reference voltage is a low power supply voltage.

14. A display apparatus, comprising the display substrate of claim 1, and one or more integrated circuits connected to the display substrate.

15. A display substrate, comprising one or more scan circuits and one or more electrostatic discharge protection circuits in a peripheral area;
  wherein an electrostatic discharge protection circuit is configured to provide a start signal to a scan unit of a scan circuit;
  wherein the display substrate comprises a plurality of islands and a plurality of bridges connecting the plurality of islands in the peripheral area;
  a respective island of the plurality of islands comprises at least one scan unit of the scan circuit; and
  one or more signal lines connecting the electrostatic discharge protection circuit and the scan unit is at least partially in an individual bridge connecting the electrostatic discharge protection circuit and the scan unit;
  wherein the electrostatic discharge protection circuit comprises:
  a first transistor;
  a second transistor;
  a third transistor;
  a fourth transistor;
  a start signal terminal;
  a first reference voltage terminal configured to receive a first reference voltage from the scan circuit;
  a second reference voltage terminal configured to receive a second reference voltage from the scan circuit; and
  a node electrically connected between the second transistor and the third transistor and electrically connected to the start signal terminal.

16. The display substrate of claim 15, wherein a first electrode and a gate electrode of the first transistor are electrically connected to the first reference voltage terminal;
  a second electrode of the first transistor is electrically connected to a first electrode and a gate electrode of the third transistor;
  a second electrode of the third transistor is electrically connected to the node;
  a first electrode of the second transistor is electrically connected to the node;
  a gate electrode of the second transistor is electrically connected to the start signal terminal;
  a second electrode of the second transistor is electrically connected to a first electrode and a gate electrode of the fourth transistor; and
  a second electrode of the fourth transistor is electrically connected to the second reference voltage terminal.

17. The display substrate of claim 15, wherein, when a voltage of the start signal terminal is greater than the first reference voltage at the first reference voltage terminal, the start signal terminal discharges to the first reference voltage terminal;
  when the voltage of the start signal terminal is less than the second reference voltage at the second reference voltage terminal, the start signal terminal discharges to the second reference voltage terminal;
  when the voltage at the start signal terminal is greater than the second reference voltage at the second reference voltage terminal, and is less than the first reference voltage at the first reference voltage terminal, the first transistor and the third transistor are turned off, and the second transistor and the fourth transistor are turned off.

18. A display substrate, comprising one or more scan circuits and one or more electrostatic discharge protection circuits in a peripheral area;
  wherein an electrostatic discharge protection circuit is configured to provide a start signal to a scan unit of a scan circuit;
  wherein the display substrate comprises a plurality of islands and a plurality of bridges connecting the plurality of islands in the peripheral area;
  a respective island of the plurality of islands comprises at least one scan unit of the scan circuit; and
  one or more signal lines connecting the electrostatic discharge protection circuit and the scan unit is at least partially in an individual bridge connecting the electrostatic discharge protection circuit and the scan unit;
  wherein the peripheral area includes a first region and a second region adjacent to the first region;
  the plurality of islands and the plurality of bridges are in the first region;
  the second region is absent of the plurality of islands and the plurality of bridges;
  the scan circuit is in the first region;
  the electrostatic discharge protection circuit is in the second region; and
  the one or more signal lines extend from the second region into the first region.

19. The display substrate of claim 18, wherein the peripheral area includes a first sub-area on a first side of a display area, a second sub-area on a second side of the display area, a third sub-area on a third side of the display area, and a fourth sub-area on a fourth side of the display area;
  the electrostatic discharge protection circuit is in the third sub-area and/or the fourth sub-area;
  the display substrate is stretchable in the second sub-area and the fourth sub-area; and
  the display substrate is less stretchable in the first sub-area and the third sub-area than in the second sub-area and the fourth sub-area.

* * * * *